US011557708B2

(12) United States Patent
Rufenacht et al.

(10) Patent No.: US 11,557,708 B2
(45) Date of Patent: Jan. 17, 2023

(54) JOSEPHSON VOLTAGE STANDARD

(71) Applicant: Government of the United States of America, as represented by the Secretary of Commerce, Gaithersburg, MD (US)

(72) Inventors: Alain Rufenacht, Longmont, CO (US); Nathan Edward Flowers-Jacobs, Boulder, CO (US); Anna Rose Elizabeth Fox, Boulder, CO (US); Samuel Paul Benz, Superior, CO (US); Paul David Dresselhaus, Louisville, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 440 days.

(21) Appl. No.: 16/843,249

(22) Filed: Apr. 8, 2020

(65) Prior Publication Data
US 2020/0373475 A1 Nov. 26, 2020

Related U.S. Application Data

(60) Provisional application No. 62/850,756, filed on May 21, 2019.

(51) Int. Cl.
*H01L 39/06* (2006.01)
*H01L 39/02* (2006.01)
(Continued)

(52) U.S. Cl.
CPC ............ *H01L 39/06* (2013.01); *G01R 35/007* (2013.01); *H01L 39/025* (2013.01); *H01L 39/2493* (2013.01); *H03K 17/92* (2013.01)

(58) Field of Classification Search
CPC ...... G01R 35/007; G01R 35/005; H01L 39/06; H01L 39/025; H01L 39/2493; H01L 39/223
See application file for complete search history.

(56) References Cited

U.S. PATENT DOCUMENTS 5,565,866 A 10/1996 Hamilton et al.
5,812,078 A 9/1998 Przybysz et al.
(Continued)

OTHER PUBLICATIONS

Hamilton, C.A., et al., "Josephson D/A Converter with Fundamental Accuracy", IEEE Transactions of Instrumentation and Measurement, 1995, p. 223-225, vol. 44 No. 2.
(Continued)

*Primary Examiner* — Lee E Rodak
*Assistant Examiner* — Brent J Andrews
(74) *Attorney, Agent, or Firm* — Office of Chief Counsel for National Institute of Standards and Technology

(57) ABSTRACT

A Josephson voltage standard includes: electrical conductors that receive bias currents and radiofrequency biases; a first Josephson junction array that: includes a first Josephson junction and produces a first voltage reference from the first bias current and the third bias current; a second Josephson junction array in electrical communication with the first Josephson junction array and that: includes a second Josephson junction; receives the second bias current; receives the third bias current; receives the second radiofrequency bias; and produces a second voltage reference from the second bias current and the third bias current; a first voltage reference output tap in electrical communication with the first Josephson junction array and that receives the first voltage reference from the first Josephson junction array such that the first voltage reference is electrically available at the first voltage reference output tap; and a second voltage reference output tap.

18 Claims, 38 Drawing Sheets

(51) Int. Cl.
  *H01L 39/24*   (2006.01)
  *G01R 35/00*   (2006.01)
  *H03K 17/92*   (2006.01)

(56) References Cited

U.S. PATENT DOCUMENTS

| | | | |
|---|---|---|---|
| 6,236,344 | B1 | 5/2001 | Benz et al. |
| 7,424,841 | B2 | 9/2008 | Liu |
| 7,809,518 | B2 | 10/2010 | Zhu et al. |
| 2003/0218164 | A1* | 11/2003 | Yamamori ............ H01L 39/223 257/31 |
| 2010/0148757 | A1* | 6/2010 | Zhu ...................... G01R 35/005 324/130 |

OTHER PUBLICATIONS

Dresselhaus, P.D., et al., "10 Volt Programmable Josephson Voltage Standard Circuits Using NbSi-Barrier Junctions", IEEE Transations of Applied Superconductivity, 2011, p. 693-696, vol. 21 No. 3.

Rufenacht, A., et al., "Impact of the Latest Generation of Josephson Voltage Standards in AC and DC electric Metrology", Metrologia, 2018, p. S152-S173, vol. 55.

Rufenacht, A., et al., "Automated Direct Comparison of Two Cryocooled 10 Volt Programmable Josephson Voltage Standards", Metrologia, 2018, p. 585-596, vol. 55.

Overney, R., et al., "Josephson-Based Full Digital Bridge for High-Accuracy Impedance Comparisons", Metrologia, 2016, p. 1045-1053, vol. 53.

Flowers-Jacobs, N.E., et al., "Two-Volt Josephson Arbitrary Waveform Synthesizer Using Wilkinson Dividers" IEEE Transactions on Applied Superconductivity, 2016, p. 1400207, vol. 26 No. 6.

Klushin, A.M., et al., "High-Temperature Superconductor Josephson Junctions for Voltage Standards", Physics of the Solid State, 2016, p. 2196-2202, vol. 58 No. 11.

Kvarz, "Measure Voltage H4-21 Based on Josephson Chip of High Temperature Superconductor" http://kvarz.com/general/n4-21.html, Accessed on Mar. 15, 2019.

Rufenacht, A., et al., "Simultaneous Double Waveform Synthesis with a Single Programmable Josephson Voltage Standard", 2016 Conference on Precision Electromagnetic Measurements, IEEE, 2016.

* cited by examiner

Table 1. Summary of PJVS circuits currently in fabrication. The circuits (columns) are sorted by bias frequency.

| | NMIJ/AIST [32] | NIST [24] | PTB/Supracon [29] | PTB [30] | INRIM/PTB [38] | KVARZ [40] |
|---|---|---|---|---|---|---|
| Voltage | 17.3 V | 10 V | 10 V | 20 V | 1.19 V | 25 mV |
| # of JJs | 524 288 | 265 116 | 69 632 | 139 264 | 8 192 | 161 |
| Bias Frequency | 16 GHz | 18.3 GHz | 70 GHz | 70 GHz | 70 GHz | 75 GHz |
| Junction | SNS | SNS | SNS | SNS | SNS | HTS grain boundary |
| Material | TiN$_x$/NbN/ NbN/ | Nb/Nb$_x$Si$_{1-x}$/Nb | Nb/Nb$_x$Si$_{1-x}$/Nb | Nb/Nb$_x$Si$_{1-x}$/Nb | Nb/Al-AlO$_x$/Nb | YBa$_2$Cu$_3$O$_7$ bicrystal |
| Temperature | <11 K | <5 K | <5 K | <5 K | <5 K | <77 K |
| # of JJs/Stack | 2 | 3 | 1 | 2 | 1 | — |
| # of JJs in LSB | 128 | 6 | 1 | 2 | — | — |
| LSB resolution | 4.235 mV | 227 µV | 145 µV | 270 µV | — | — |

FIG. 12

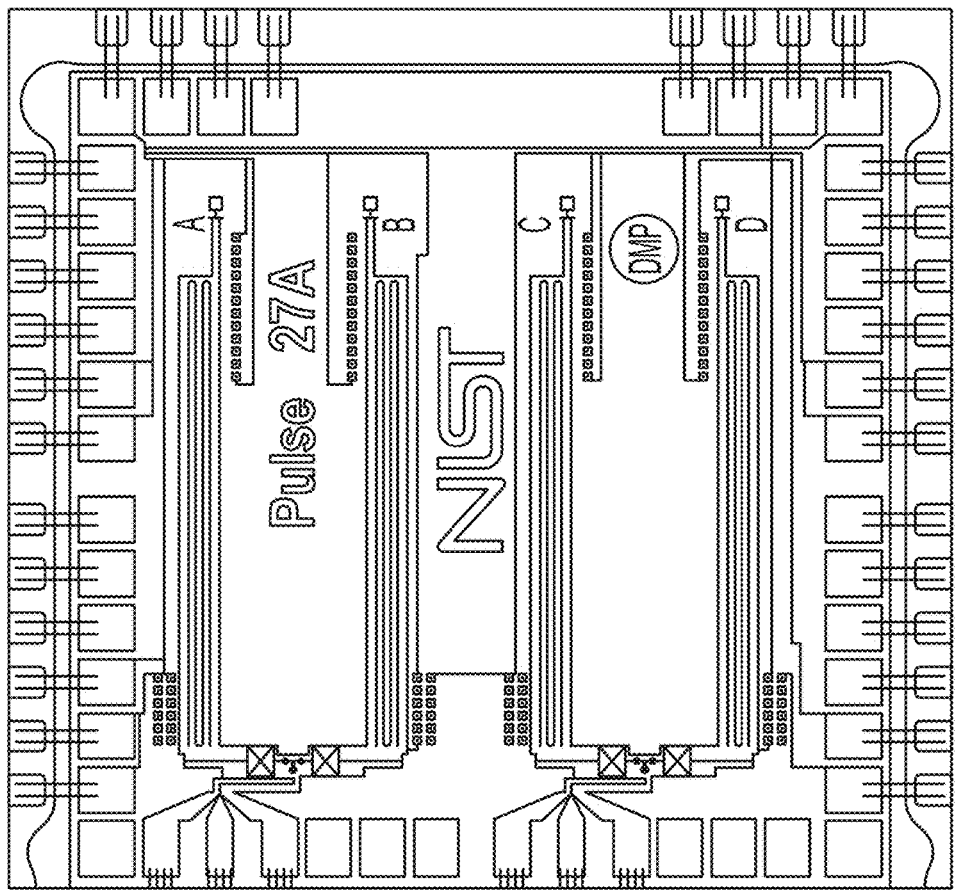
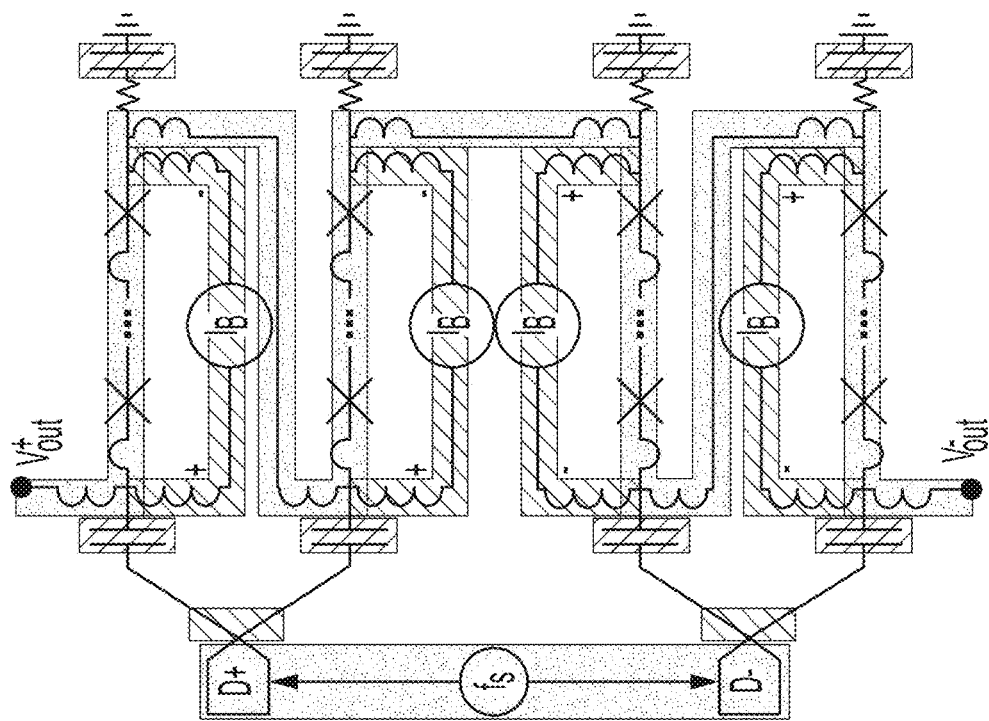
FIG. 14

| | PJVS(1): $f_{CW}$ = 19.999913151365 GHz | | | PJVS(2): $f_{CW}$ = 18.379925659035 GHz | | |
|---|---|---|---|---|---|---|
| Subarray # | # of JJs | Bias @ 10 V | Node voltage/V | # of JJs | Bias @ 10 V | Node voltage/V |
| 23 | 16800 | +1 | 10.000 | 16800 | +1 | 10.000 |
| 22 | 16800 | +1 | 9.305 | 16800 | +1 | 9.361 |
| 21 | 16800 | +1 | 8.610 | 16800 | +1 | 8.723 |
| 20 | 8400 | +1 | 7.916 | 14958 | +1 | 8.084 |
| 19 | 6 | −1 | 7.568 | 16800 | +1 | 7.516 |
| 18 | 18 | −1 | 7.568 | 16800 | +1 | 6.877 |
| 17 | 54 | 0 | 7.569 | 16800 | +1 | 6.239 |
| 16 | 162 | 0 | 7.567 | 16800 | +1 | 5.600 |
| 15 | 486 | 0 | 7.567 | 16800 | +1 | 4.962 |
| 14 | 1458 | 0 | 7.567 | 16800 | +1 | 4.323 |
| 13 | 4374 | 0 | 7.567 | 16800 | +1 | 3.685 |
| 12 | 16797 | 0 | 7.567 | 16800 | +1 | 3.046 |
| 11 | 16800 | +1 | 6.872 | 16800 | +1 | 2.408 |
| 10 | 16800 | +1 | 6.177 | 16800 | +1 | 1.769 |
| 9 | 16800 | +1 | 5.482 | 16800 | +1 | 1.131 |
| 8 | 16800 | +1 | 4.787 | 8400 | +1 | 0.492 |
| 7 | 16800 | +1 | 4.093 | 6 | 0 | 0.173 |
| 6 | 16800 | +1 | 3.398 | 18 | +1 | 0.173 |
| 5 | 16800 | +1 | 2.703 | 54 | 0 | 0.172 |
| 4 | 16800 | +1 | 2.008 | 162 | 0 | 0.172 |
| 3 | 16800 | +1 | 1.313 | 486 | 0 | 0.166 |
| 2 | 16800 | +1 | 0.619 | 1458 | 0 | 0.166 |
| 1 | 14958 | +1 | 0.619 | 4374 | +1 | 0.166 |

FIG. 24

| System | Grounded node | Leakage current/pA | $R_L/G\Omega$ |
| --- | --- | --- | --- |
| PJVS(1) | Low of the array (DAC 0) | 350 ± 15 | 28.7 ± 1.2 |
|  | High of the array (DAC 23) | 390 ± 20 | 25.7 ± 1.3 |
| PJVS(2) | Low of the array (DAC 0) | 370 ± 20 | 26.8 ± 1.5 |
|  | High of the array (DAC 23) | 550 ± 30 | 18.2 ± 1.0 |

FIG. 25

| Switching mode | Start voltage | Waveform (Four steps) | | | |
|---|---|---|---|---|---|
| | | #1 | #2 | #3 | #4 |
| A (start) | 0 V | 0 V | 0 V | 10 V | 10 V |
| B (+→−) | 10 V | 10 V | 0 V | −10 V | −10 V |
| C (−→+) | −10 V | −10 V | 0 V | 10 V | 10 V |
| D (end) | +10 V or −10 V | 0 V | 0 V | 0 V | 0 V |

FIG. 27

| Dither current nominal | PJVS polarity | Dither current applied to PJVS(1) | Dither current applied to PJVS(2) |
|---|---|---|---|
| $+di$ | $+10$ V | $+di$ | $-di$ |
|  | $-10$ V | $-di$ | $+di$ |
|  | $+10$ V | $+di$ | $-di$ |
|  | $-10$ V | $-di$ | $+di$ |
| $0$ | $+10$ V | 0 | 0 |
|  | $-10$ V | 0 | 0 |
|  | $+10$ V | 0 | 0 |
|  | $-10$ V | 0 | 0 |
| $-di$ | $+10$ V | $-di$ | $+di$ |
|  | $-10$ V | $+di$ | $-di$ |
|  | $+10$ V | $-di$ | $+di$ |
|  | $-10$ V | $+di$ | $-di$ |

FIG. 29

| Component/Type | Distribution | Uncertainty/nV |
|---|---|---|
| Statistical/A | Normal | 0.100 |
| Frequency accuracy/B | Normal | 0.045 |
| Differential leakage current/B | Rectangular | 0.033 |
| Leakage current between voltage leads/B | Rectangular | 0.021 |
| NVM gain error/B | Rectangular | 0.004 |
| NVM polarity reversal and CMRR/B | Rectangular | 0.087 |
| Combined uncertainty ($k = 1$) | | 0.145 |
| Extended uncertainty ($k = 2$) | | 0.290 |

FIG. 38

JOSEPHSON VOLTAGE STANDARD

CROSS REFERENCE TO RELATED APPLICATIONS

The application claims priority to U.S. Provisional Patent Application Ser. No. 62/850,756 filed May 21, 2019, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 99; voice (301)-975-2573; email tpo@nist.gov; reference NIST.

BRIEF DESCRIPTION

Disclosed is a Josephson voltage standard comprising: a first electrical conductor that receives a first bias current; a second electrical conductor that receives a second bias current; a third electrical conductor that receives a third bias current; a fourth electrical conductor that receives a first radiofrequency bias; a fifth electrical conductor that receives a second radiofrequency bias; a first Josephson junction array that: comprises a first Josephson junction; receives, from the first electrical conductor, the first bias current; receives, from the third electrical conductor, the third bias current; receives, from the fourth electrical conductor, the first radiofrequency bias; and produces a first voltage reference from the first bias current and the third bias current; a second Josephson junction array in electrical communication with the Josephson junction array and that: comprises a second Josephson junction; receives, from the second electrical conductor, the second bias current; receives, from the third electrical conductor, the third bias current; receives, from the fifth electrical conductor, the second radiofrequency bias; and produces a second voltage reference from the second bias current and the third bias current; a first voltage reference output tap in electrical communication with the first Josephson junction array and that receives the first voltage reference from the first Josephson junction array, such that the first voltage reference is electrically available at the first voltage reference output tap; and a second voltage reference output tap in electrical communication with the second Josephson junction array and that receives the second voltage reference from the second Josephson junction array, such that the second voltage reference is electrically available at the second voltage reference output tap.

Disclosed is a Josephson divider determiner for determining a resistance ratio of a voltage divider with a Josephson voltage standard, the Josephson divider determiner comprising: the Josephson voltage standard; a voltage divider in electrical communication with the Josephson voltage standard and that: comprises a first resistor in electrical communication with the first voltage reference output tap and that receives the first voltage reference from the first voltage reference output tap; and comprises a second resistor in electrical communication with the first resistor and the second voltage reference output tap and that receives the second voltage reference from the second voltage reference output tap; and a polarity switch in electrical communication with the first voltage reference output tap.

Disclosed is a process for producing a voltage reference with a Josephson voltage standard, the process comprising: receiving, by the first Josephson junction array, the first bias current, the third bias current, and the first radiofrequency bias; producing, by the first Josephson junction array, the first voltage reference in response to receiving the first bias current, the third bias current, and the first radiofrequency bias; receiving, by the second Josephson junction array, the second bias current, the third bias current, and the second radiofrequency bias; producing, by the second Josephson junction array, the second voltage reference in response to receiving the second bias current, the third bias current, and the second radiofrequency bias; communicating the first voltage reference from the first Josephson junction array to the first voltage reference output tap; communicating the second voltage reference from the second Josephson junction array to the second voltage reference output tap; receiving the first voltage reference at the first voltage reference output tap; and receiving the second voltage reference at the second voltage reference output tap.

BRIEF DESCRIPTION OF THE DRAWINGS

The following description cannot be considered limiting in any way. With reference to the accompanying drawings, like elements are numbered alike.

FIG. 12 shows a summary of PJVS circuits that, in columns, are sorted by bias frequency;

FIG. 14 shows (left) JAWS circuit diagram and (right) a cryopackaged JAWS chip. The circuit can generate an output voltage of 1 V rms. The circuit includes two pulse generator channels (labeled D+ and D−), a single layer of Wilkinson dividers, inside-outside DC blocks, and JJ arrays (Xs). The JJ arrays are connected in series through inductive taps, as is one floating low-frequency current compensation per JJ array ($J_B$). The JAWS chip size is 10 mm×10 mm;

FIG. 24 shows a 10 V junction and bias configuration for two PJVS arrays. The number of Josephson junctions (JJs) are distributed as shown for the two PJVS circuits operating at the microwave bias frequencies $f_{CW}$ indicated. The two circuits produce 10 V using the different bias current polarities indicated in the Bias columns. Although there are different voltages at the various subarray nodes, both circuits have 0 V potential at the low side of their circuits. Least significant bit (LSB) subarrays are shown;

FIG. 25 shows measured LCG at 10 V and corresponding equivalent leakage resistance $R_L$;

FIG. 27 shows waveforms to synchronously switch voltage output polarity of both arrays;

FIG. 29 shows measurement sequences and dither currents during direct comparison between two PJVS systems to check for proper quantization of both PJVS arrays;

FIG. 38 shows components of uncertainty budget for the difference voltage measured between the two cryocooled PJVS systems at 10 V when both arrays are floating from ground.

DETAILED DESCRIPTION

Figure 1:
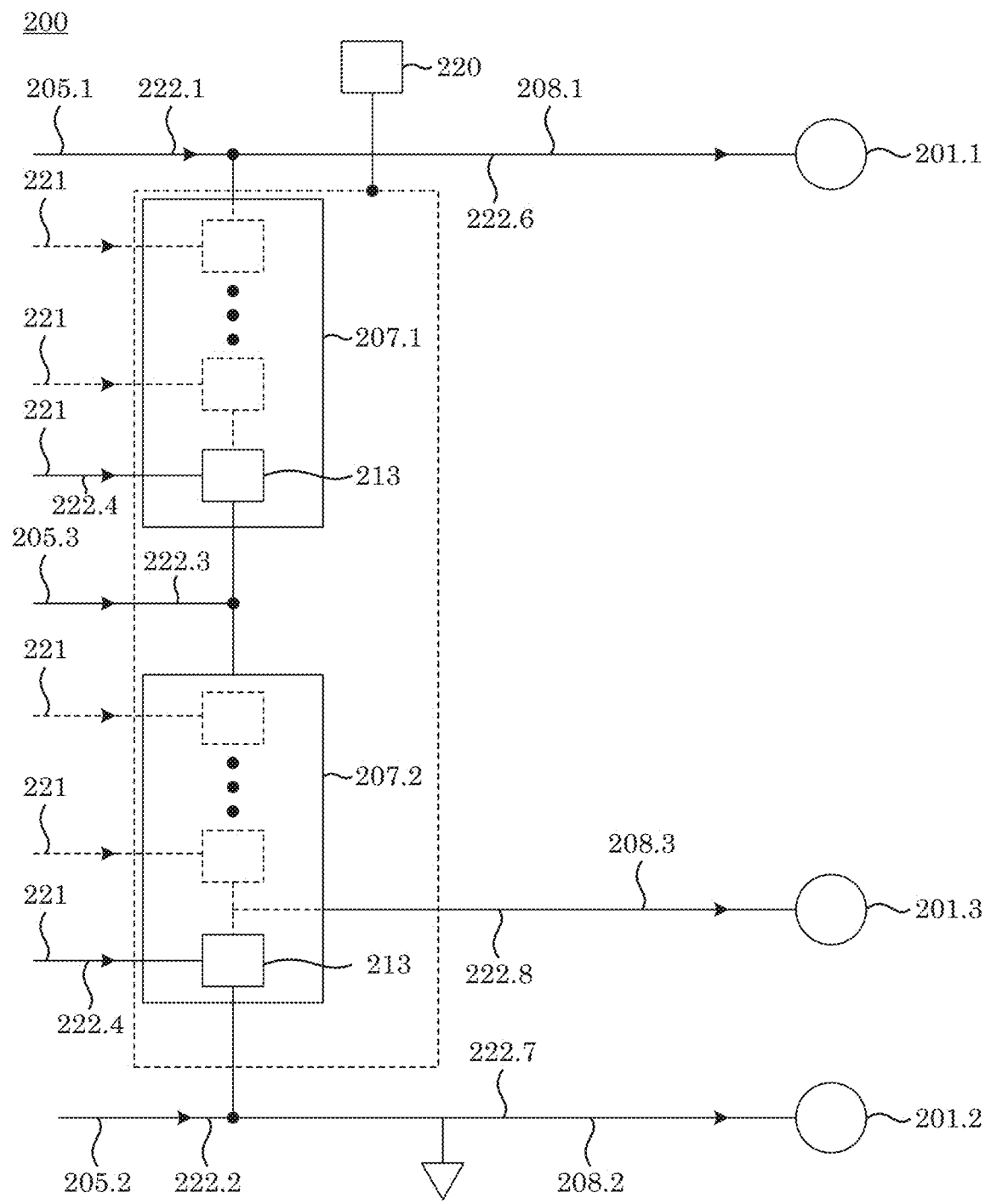
FIG. 1 shows a Josephson voltage standard.

A detailed description of one or more embodiments is presented herein by way of exemplification and not limitation.

It has been discovered that a Josephson voltage standard advantageously provides independent simultaneous voltage references as voltage outputs that can be produced in an absence of multiple systems. The Josephson voltage standard can be integrated into an article for a fixed voltage ratio, variable voltage ratio, dual signals (e.g., square waves or sine waves of similar root mean square (rms) voltage), and the like. Beneficially, the Josephson voltage standard can be widely disseminated in a compact dual voltage references that can be, e.g., 1 V and 100 mV, that can be used to calibrate a secondary voltage standard at 10 V using a 10:1 self-calibrated resistive voltage divider. It is contemplated that the Josephson voltage standard can be implemented in AC power metrology, e.g., to calibrate a power meter with two reference signals and impedance ratio measurements that involve amplitude and phase programmability.

Josephson voltage standard 200 produces a plurality of voltage reference 208. In an embodiment, with reference to FIG. 1, FIG. 2, FIG. 3, and FIG. 4, Josephson voltage standard 200 includes first electrical conductor 222.1 that receives first bias current 205.1; second electrical conductor 222.2 that receives second bias current 205.2; third electrical conductor 222.3 that receives third bias current 205.3; fourth electrical conductor 222.4 that receives first radiofrequency bias 221.1; fifth electrical conductor 222.5 that receives second radiofrequency bias 221.2; and first Josephson junction array 207.1 in electrical communication with first electrical conductor 222.1 and third electrical conductor 222.3. First Josephson junction array 207.1 includes first Josephson junction 213 and receives, from first electrical conductor 222.1, first bias current 205.1; receives, from third electrical conductor 222.1, third bias current 205.3; receives, from fourth electrical conductor 222.4, first radiofrequency bias 221.1; and produces first voltage reference 208.1 from first bias current 205.1 and third bias current 205.3. Second Josephson junction array 207.2 is in electrical communication with first Josephson junction array 207.1 and includes second Josephson junction 213; receives, from second electrical conductor 222.2, second bias current 205.2; receives, from third electrical conductor 222.3, third bias current 205.3; receives, from fifth electrical conductor 222.5, second radiofrequency bias 221.2; and produces second voltage reference 208.2 from second bias current 205.2 and third bias current 205.3. First voltage reference output tap 201.1 receives, from sixth electrical conductor 222.6, first voltage reference 208.1 from first Josephson junction array 207.1 such that first voltage reference 208.1 is electrically available at first voltage reference output tap 201.1 Second voltage reference output tap 201.2 receives, from seventh electrical conductor 222.7, second voltage reference 208.2 from second Josephson junction array 207.2 such that first voltage reference 208.2 is electrically available at first voltage reference output tap 201.2.

According to an embodiment, Josephson voltage standard 200 includes third voltage reference output tap 201.3 in electrical communication with second Josephson junction array 207.2. Third voltage reference output tap 201.3 receives, from eighth electrical conductor 222.8, third voltage reference 208.3 from second Josephson junction array 207.2 such that third voltage reference 208.3 is electrically available at third voltage reference output tap 201.3.

Figure 2:
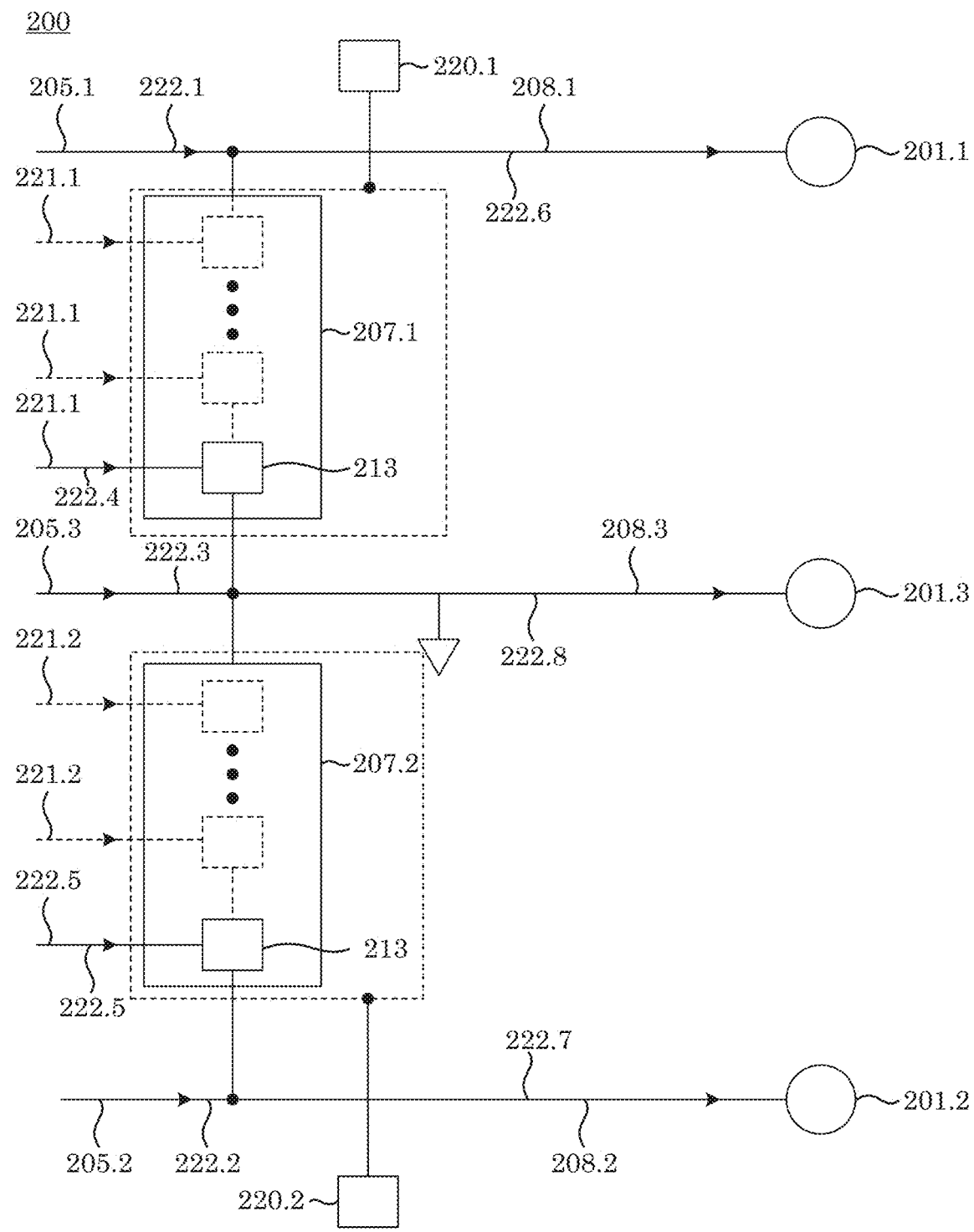
FIG. 2 shows a Josephson voltage standard.
Figure 3:
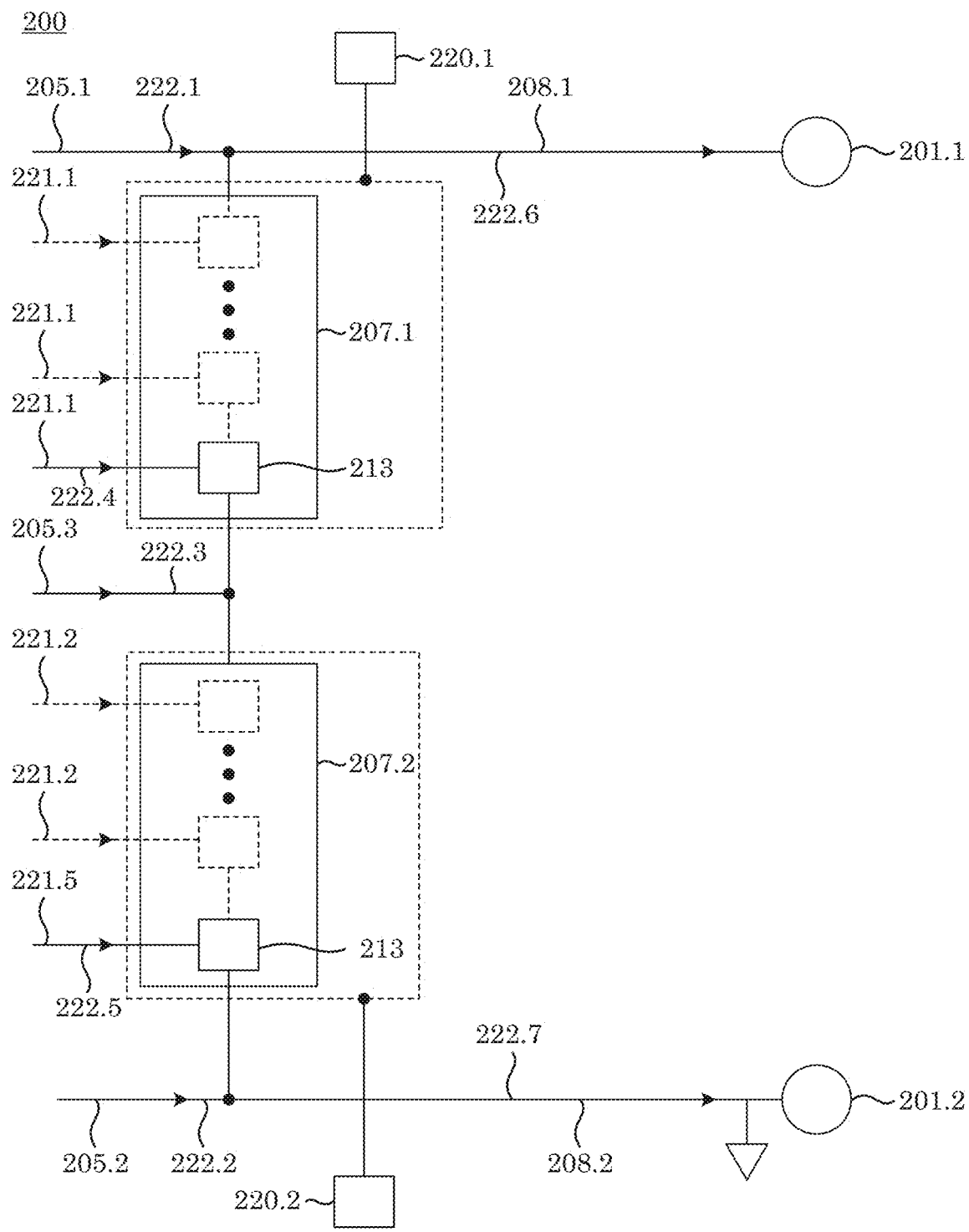
FIG. 3 shows a Josephson voltage standard.

With reference to FIG. 1, the first Josephson junction array 207.1, the second Josephson junction array 207.2, and the third voltage reference output tap 201.3 can be in electrical series with respect to each other. With reference to FIG. 2, the first Josephson junction array 207.1, it is contemplated that third voltage reference output tap 201.3 can be in electrical communication with first Josephson junction array 207.1, such that first Josephson junction array 207.1 and second Josephson junction array 207.2 are connected in parallel with respect to third voltage reference output tap 201.3 and in electrical series with respect to each other. Moreover, a selected electrical conductor 222 can be electrically connected to ground. In an embodiment, second voltage reference 208.2 is connected to ground as shown in FIG. 1 and FIG. 3. In an embodiment, third voltage reference 208.3 is connected to ground as shown in FIG. 2.

Figure 4:
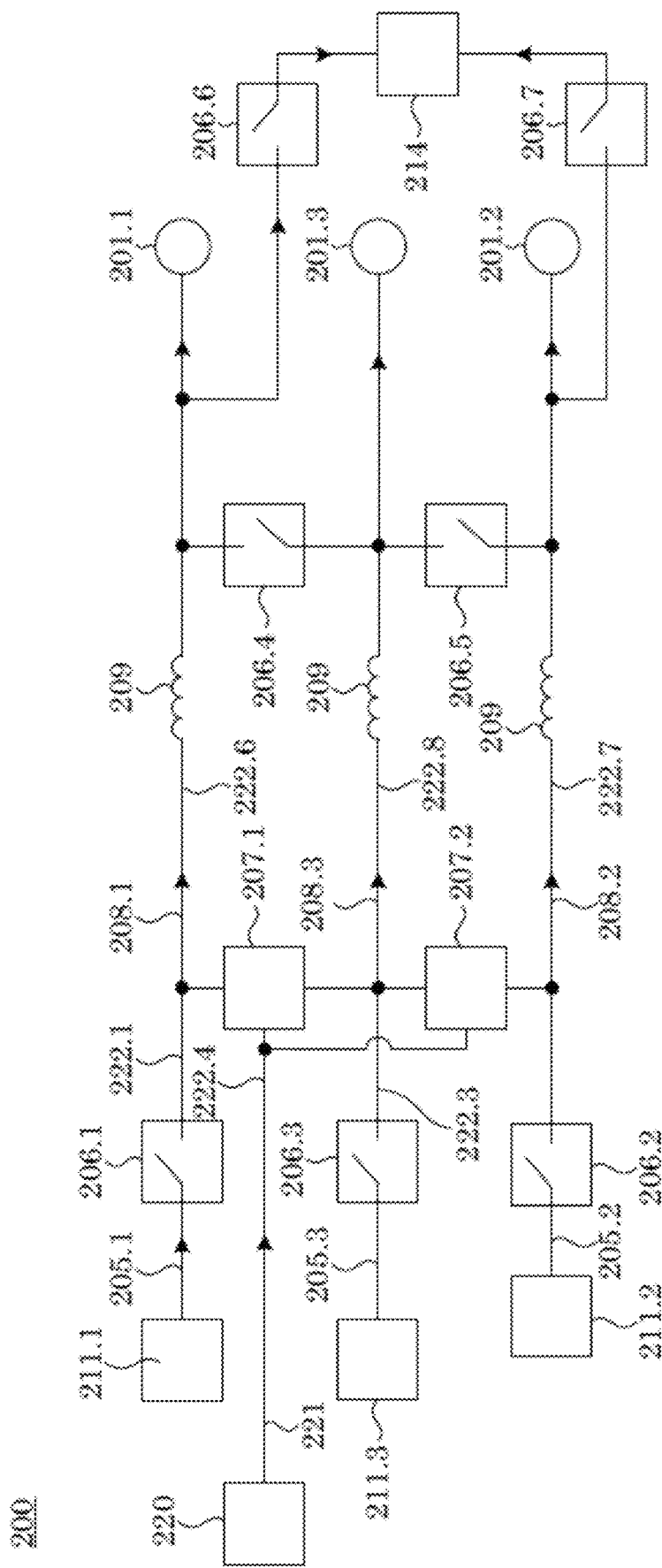
FIG. 4 shows a Josephson voltage standard.

In an embodiment, with reference to FIG. 4, Josephson voltage standard 200 includes first current source 211.1 in electrical communication with first Josephson junction array 207.1 and that produces first bias current 205.1 and communicates first bias current 205.1 to first Josephson junction array 207.1. First relay 206.1 is electrically interposed between first current source 211.1 and each of first Josephson junction array 207.1 and first voltage reference output tap 201.1. Here, first relay 206.1 receives, from first current source 211.1, first bias current 205.1; and selectively switches between communicating first bias current 205.1 to first Josephson junction array 207.1 and not communicating first bias current 205.1 to first Josephson junction array 207.1. First inductor 209.1 is electrically interposed between first Josephson junction array 207.1 and first voltage reference output tap 201.1; receives, from first Josephson junction array 207.1, first voltage reference 208.1; and isolates first voltage reference output tap 201.1 from first Josephson junction array 207.1.

First relay 206.4 can be electrically interposed between first voltage reference output tap 201.1 and each of third voltage reference output tap 201.3 and second voltage reference output tap 201.2, wherein first relay 206.4 selectively switches between: electrically connecting first voltage reference output tap 201.1 to third voltage reference output tap 201.3 and second voltage reference output tap 201.2 and electrically disconnecting first voltage reference output tap 201.1 from third voltage reference output tap 201.3 and second voltage reference output tap 201.2.

Second relay 206.5 can be electrically interposed between second voltage reference output tap 201.2 and each of first voltage reference output tap 201.1 and third voltage reference output tap 201.3, wherein second relay 206.5 selectively switches between: electrically connecting second voltage reference output tap 201.2 to third voltage reference output tap 201.3 and electrically disconnecting second voltage reference output tap 201.2 from first voltage reference output tap 201.1 and second voltage reference output tap 201.2. Third current source 211.3 is in electrical communication with first Josephson junction array 207.1 and second Josephson junction array 207.2; produces third bias current 205.3; and communicates third bias current 205.3 to first Josephson junction array 207.1 and second Josephson junction array 207.2. Second current source 211.2 is in electrical communication with second Josephson junction array 207.2; produces second bias current 205.2; and communicates second bias current 205.2 to second Josephson junction array 207.2.

In an embodiment, voltmeter 214 is in electrical communication with first voltage reference output tap 201.1 and second voltage reference output tap 201.2; receives first voltage reference 208.1; receives second voltage reference 208.2; and determines voltage difference between first voltage reference 208.1 and second voltage reference 208.2.

Josephson voltage standard 200 provides a plurality of voltage reference 208 that can be used to determine a resistance ratio of voltage divider 217. In an embodiment, with reference to FIG. 6, FIG. 7 and FIG. 8, Josephson divider determiner 218 includes voltage divider 217 in electrical communication with Josephson voltage standard 200. Voltage divider 217 includes first resistor 204.1 in electrical communication with first voltage reference output tap 201.1 and that receives first voltage reference 208.1 from first voltage reference output tap 201.1; and second resistor 204.2 in electrical communication with first resistor 204.1 and second voltage reference output tap 201.2 such that second resistor 204.2 receives second voltage reference 208.2 from second voltage reference output tap 201.2; and first Relay 206 in electrical communication with first voltage reference output tap 201.1. Second relay 206 is in electrical communication with third voltage reference output tap 201.3 and includes a voltmeter 214 in electrical communication with the two relays 206, wherein the two relays 206 selectively switches simultaneously between: electrically connecting voltmeter 214 to first voltage reference output tap 201.1, electrically disconnecting voltmeter 214 from third voltage reference output tap 201.3, and electrically disconnecting third voltage reference output tap 201.3 from voltage divider 217; and electrically connecting voltmeter 214 to third voltage reference output tap 201.3, electrically disconnecting voltmeter 214 from first voltage reference output tap 201.1, and electrically connecting third voltage reference output tap 201.3 to voltage divider 217 so that first resistor 204.1 and second resistor 204.2 receive third voltage reference 208.3 from third voltage reference output tap 201.3. In an embodiment with reference to FIG. 6, a buffer amplifier in electrical communication between Josephson voltage standard 200 and voltage divider 217 provides the bias current to the voltage divider 217. In some embodiments, with reference to FIG. 7 and FIG. 8, polarity switch 216 is in electrical communication with second voltage reference output tap 201.2, and includes: voltmeter 214 in electrical communication with second voltage reference output tap 201.2 and polarity switch 216; and Zener voltage standard 219 in electrical communication with polarity switch 216, wherein polarity switch 216 selectively swaps electrical connectivity of Zener voltage standard 219 between first voltage reference output tap 201.1 and second voltage reference output tap 201.2. In embodiment, with reference FIG. 8, only the Josephson voltage tap 201.1 is connected to first and second relays 206. Based on the Relay 206 configuration the voltage reference 208.1, on Josephson voltage tap 201.1 is adjusted to match successively the voltage at the top of Resistance 204.1 and Resistance 204.2.

Josephson voltage standard 200 include a substrate on elements of Josephson voltage standard 200 are formed or disposed. The substrate can be, e.g., an insulating material so that electrical current does not flow therethrough and to electrically insulate individual elements from one another. Exemplary substrate include intrinsic silicon, oxidized silicon, sapphire and the like.

Figure 5:
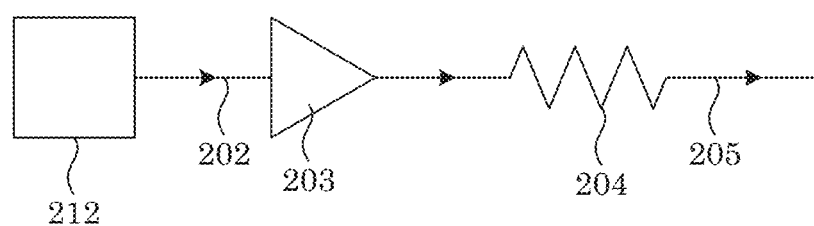
FIG. 5 shows a current source.

Current source 211 provides bias current 205 to Josephson junctions 213 to select the positive voltage states, negative voltage states, or zero state based on the value and sign of the current. Exemplary current sources 211 include semiconductor-based current sources and the like. In an embodiment, with reference to FIG. 5, current source 211 includes voltage source 212 that produces bias voltage 202 that is received by amplifier 203 and communicated to resistor 204 that produces bias current 205. Exemplary voltage sources 212 include digital-to-analog converters and the like. Bias voltage 202 produced by voltage source 212 can be from −16 V to +16 V specifically from −10 V to +10 V, and more specifically from −3 V to +3 V. A current of bias current 205 (e.g., 205.1, 205.2, 205.3) independently can be from −30 mA to +30 mA, specifically from −20 mA to +20 mA, and more specifically from −15 mA= to +15 mA. Bias currents 205 (e.g., 205.1, 205.2, 205.3) can be AC, or DC. Moreover, bias current 205 can have an amplitude adjustment. In an embodiment, bias current 205 includes a software application to select a current value to operate the Josephson junction array and verify the range over which the selected voltages remain constant and quantized, which is referred to as quantum locking range.

Relay 206 receives bias current 205 to connect and disconnect the bias current line 205 from the Josephson junction array 207 and Relay 206 receives voltage reference 208 to connect a voltmeter across the Josephson junction array 207 or short all the voltage reference output taps together. Exemplary relays 206 include electromagnetic relays, semiconductor relays, and the like. Moreover, relay 206 is implemented to facilitate automation. In an embodiment, relay 206 includes an operation sequence to connect the Josephson junction array when the temperature is below a normal to superconducting transition temperature of the junction and disconnection of the Josephson junction array when the system is not operated or is above the operating temperature. Relay 206 provides a shorting function to protect the Josephson junction array from inadvertent electrical currents during the connection and disconnection of the external wring to the voltage reference output taps. All relays are controlled by the automation software running the Josephson voltage standard 200 system.

Electrical conductor 222 communicates bias current 205, voltage reference 208, and radiofrequency source 220. Here, electrical conductor 222 can include low resistance metallic wires to physically connect the bias current source with the Josephson junction array and low-loss microwave co-axial cables. Exemplary electrical conductors 222 include copper wires, phosphor-bronze wires, or silver coated cupronickel coaxial cables and the like. Moreover, electrical conductor 222 must have a thermal dissipation that is compatible with the cooling capacity of the cryogenic system used to cool the Josephson junction array 207. In an embodiment, electrical conductor 222 includes a combination of detachable cables at room temperature and fixed cables designed to minimize thermal conduction from room temperature to cryogenic temperature.

Josephson junction array 207 receives bias current 205 and radiofrequency bias 221 and produces voltage reference 208. Here, Josephson junction array 207 can include multiple Josephson junction 213 that are connected electrically in series to increase the voltage and can be embedded in a coplanar waveguide structure, a microstrip structure and the like. Exemplary Josephson junction arrays 207 include a Josephson junction array circuit design with the radiofrequency bias distributed in parallel to multiple Josephson junction arrays that are electrically connected in series with superconductors. Moreover, Josephson junction array 207 can include junctions that are vertically stacked to increase the density of Josephson junctions in the circuit without compromising the performance of the device. In an embodiment, Josephson junction array 207 includes the design and the microfabrication of integrated circuits including a combination of multiple photolithographic, layer deposition and etching processes to fabricate an ensemble of Josephson junctions having electrical characteristics with appropriate response to the applied radiofrequency bias.

Josephson junction 213 is a weak link between two superconductors. Exemplary Josephson junctions 213 include a superconductor-normal metal-superconductor junction, superconductor-insulator-superconductor junction, and the like. A number of Josephson junctions 213 in Josephson junction array 207 can be, e.g., from 1 to 1 000 000, specifically from 1 to 265 116, and more specifically from 1 to 34 320. It is contemplated that each Josephson junction array 207 in Josephson junction array 207 receives radiofrequency bias 221 and bias current 205 to produce voltage reference 208. According to an embodiment, with reference to FIG. 1, the Josephson junction array 207 is capable of generating simultaneously two voltage outputs biased with a single radiofrequency source 220. The three current bias lines 205.1, 205.2 and 205.3 allows to bias the Josephson junction array 207.1 and 207.2 in series and opposition to generate a null or near null voltage to adjust and verify a current bias range of the Josephson junction array 207.1 and 207.2, and to optimize the bias conditions for quantum locking ranges. In an embodiment, there is simultaneous generation of a 1 V and 100 mV voltage, with a total of 34 320 Josephson junction 213 biased with a radiofrequency signal of ~14.1 GHz for application requiring the calibration of a 10:1 ratio. According to an embodiment, with reference to FIG. 2, Josephson voltage standard 220 is capable of generating two independent voltages, by adjusting the two independent radiofrequency biases 220.1 and 220.2 connected respectively to the Josephson junction arrays 207.1 and 207.2. Three current bias lines 205.1, 205.2 and 205.3 provide biasing Josephson junction arrays 207.1 and 207.2 in series and opposition to generate a null or near null voltage in order to better enable adjustment and verification of the current bias range of the Josephson junction array 207.1 and 207.2, and to optimize the bias conditions for quantum locking ranges. Applications of for this device include dual dc voltage generation or dual ac waveform generation with programmable relative phase of the two voltages for calibration voltage ratios, impedance ratios, and ac power. According to an embodiment, with reference to FIG. 3, Josephson junction array 207 generates a single dc voltage or ac voltage waveform with amplitude resolution limited only by the frequency resolution of the two radiofrequency sources 220.1 and 220.2. In this configuration, voltage reference output tap 201.3 has been removed. The grounding reference is attached to conductor 208.2. The three current bias lines 205.1, 205.2 and 205.3 provide biasing of Josephson junction array 207.1 and 207.2 in series and opposition to generate a null or near null voltage in order for adjustment and verification of the current bias range of Josephson junction array 207.1 and 207.2, and to optimize the bias conditions for quantum locking ranges.

Radiofrequency source 220 produces radiofrequency bias 221 to drive the Josephson junctions and generate the $2\pi$ phase shift in each Josephson junction responsible for generating a voltage of h/2e per second. Exemplary radiofrequency sources 220 include continuous wave frequency generators, pulse pattern generators, arbitrary waveform generators and the like. A power of radiofrequency bias 221 (e.g., 221.1, 221.2, 221.3) independently can be from −110 dBm to +30 dBm, specifically from −20 dBm to +28 dBm, and more specifically from −20 dBm to +20 dBm. A frequency of radiofrequency bias 221 independently can be from 1 GHz to 2 THz, specifically from 1 GHz to 100 GHz, and more specifically from 1 GHz to 22 GHz. Moreover, radiofrequency bias 221 is locked and referenced to a frequency reference with intrinsic or calibrated accuracy. In an embodiment, radiofrequency bias 221 includes a combination of radiofrequency source, microwave cable and dc-blocks, microwave amplifier, and on-chip microwave coplanar waveguide splitter and circuits and components to distribute the radiofrequency signal to the all of the Josephson junctions in the array.

Voltage reference 208 (e.g., 208.1, 208.2, 208.3) is produced by Josephson junction array 207 from bias current 205 and radiofrequency bias 221. A voltage of voltage reference 208 (208.1, 208.2, 208.3) independently can be from −15 V to +15 V, specifically from −10 V to +10 V, and more specifically from −1.2 V to +1.2 V. Voltage references 208 independently can be AC, DC, or pulsed independently. A frequency of voltage references 208 can be from dc to 1 GHz, specifically from 1 Hz to 1 MHz, and more specifically from 1 Hz to 100 kHz. When pulsed, voltage references 208 independently can have a duty cycle from 1 GHz to 200 GHz, specifically from 1 GHz to 90 GHz, and more specifically from 1 GHz to 28.8 GHz. Moreover, voltage reference 208 provides an accurate voltage reference, if the Josephson junction array 207 is biased on its quantum locking range and the radiofrequency source 220 is referred to an accurate frequency standard. In an embodiment, voltage reference 208 includes a twisted copper pair to limit the electromotive force and minimize the output resistance in series with the Josephson junction array 207.

Inductor 209 receives voltage reference 208 and electrically isolates voltage reference output tap 201 Exemplary inductors 209 include coils, ferrite core wrapped wires, and the like. An inductance of inductor 209 can be from 1 nH to 100 mH, specifically from 1 nH to 1 mH, and more specifically from 1 nH to 100 µH. Moreover, inductor 209 is present to limit a rapid current surge on conductors 208 in order to protect the Josephson junctions from damage due to an electrostatic discharge. In an embodiment, inductor 209 includes a copper wire wrapped around a ferrite core.

Voltage reference output tap 201 receives voltage reference 208 to allow the reference voltage to be accessible for precision calibration and measurement applications. Exemplary voltage reference output tap 201 include Copper blocks, low-thermal binding posts, low-thermal multiconductor connectors, and the like. Moreover, voltage reference output tap 201 must be made of material terminals with low-thermal electromotive force and is implemented such that it is protected from air flow by use of a cover to minimize temperature fluctuation at the connector. In an embodiment, voltage reference output tap 201 includes the protective circuit made of inductor 209 and relay short 206.4 and 206.5 controlled by the automation software.

Voltmeter 214 receives voltages (e.g., voltage reference 208.1, voltage reference 208.3, and the like) and determines a potential difference therefrom to verify that the Josephson junction array is biased on its quantum locking range. Exemplary voltmeters 214 include digital voltmeter, digital nanovoltmeter, voltage digitizer, spectrum analyzer and the like. Moreover, voltmeter 214 must have a dynamic range, resolution and sampling frequency compatible with measuring the voltage amplitude and frequency of the synthesized ac waveform. In an embodiment, voltmeter 214 includes automation software to connect the voltmeter with relays 206.6 and 206.7 and to automatically run the bias parameters to an optimum bias value and evaluate the quantum locking ranges of the bias parameters. External calibration of the voltmeter is not required to perform this task, since the voltmeter is mainly operated as a null detector when the multiple segments of the Josephson circuit are biased in series opposition to obtain a null or near null voltage across the Josephson junction array 207.

Figure 6:
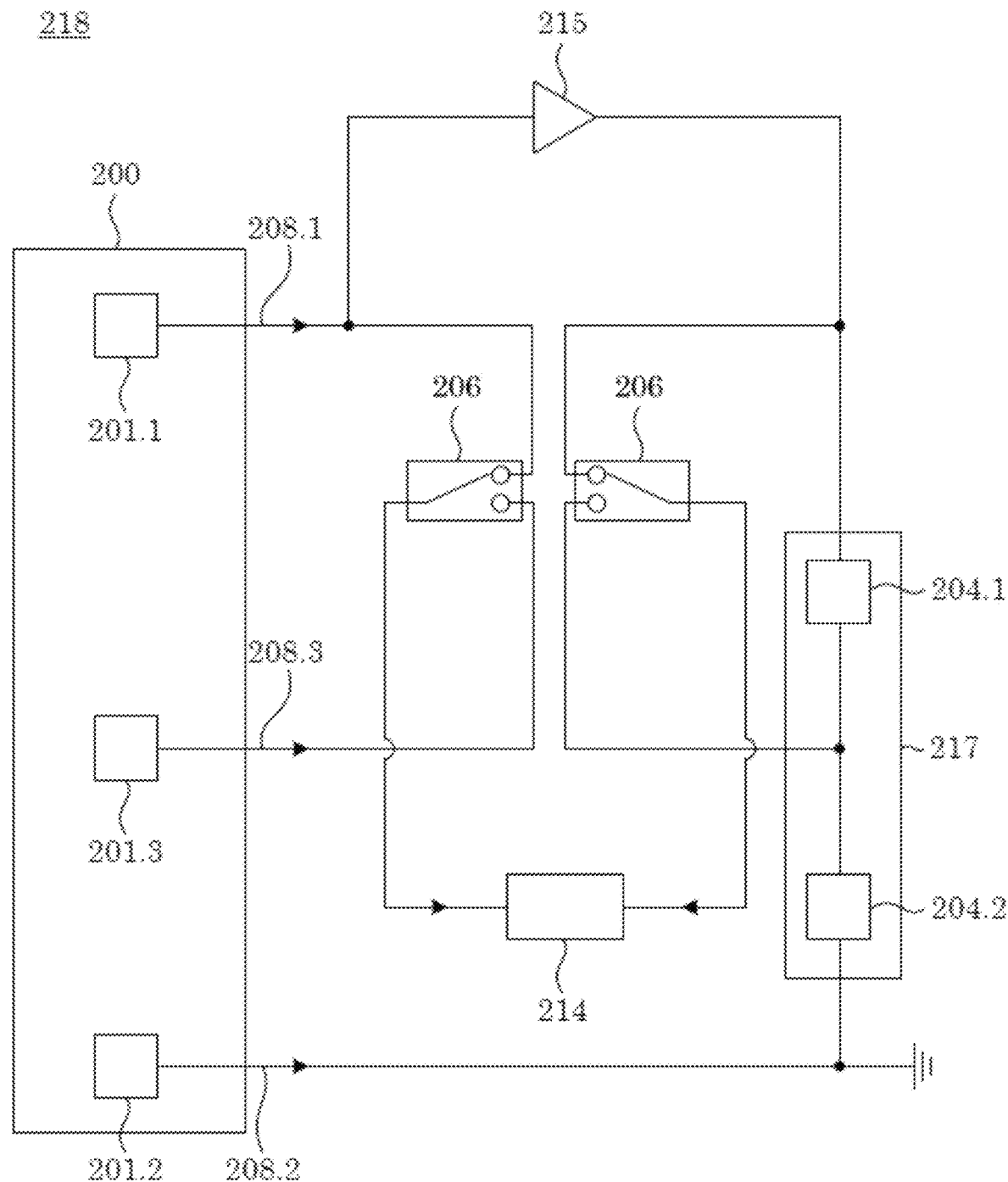
FIG. 6 shows a Josephson divider determiner.
Figure 7:
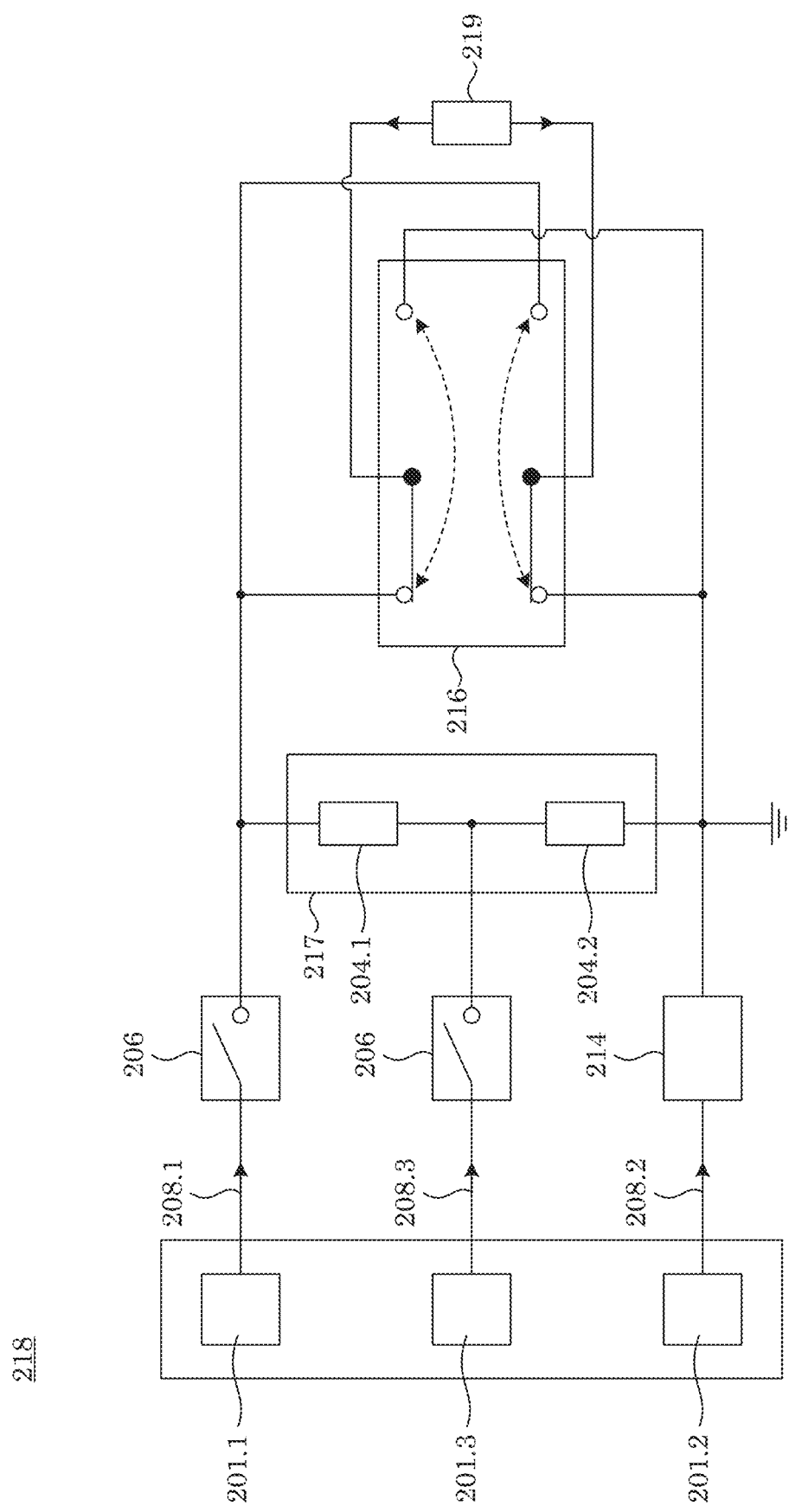
FIG. 7 shows a Josephson divider determiner.
Figure 8:
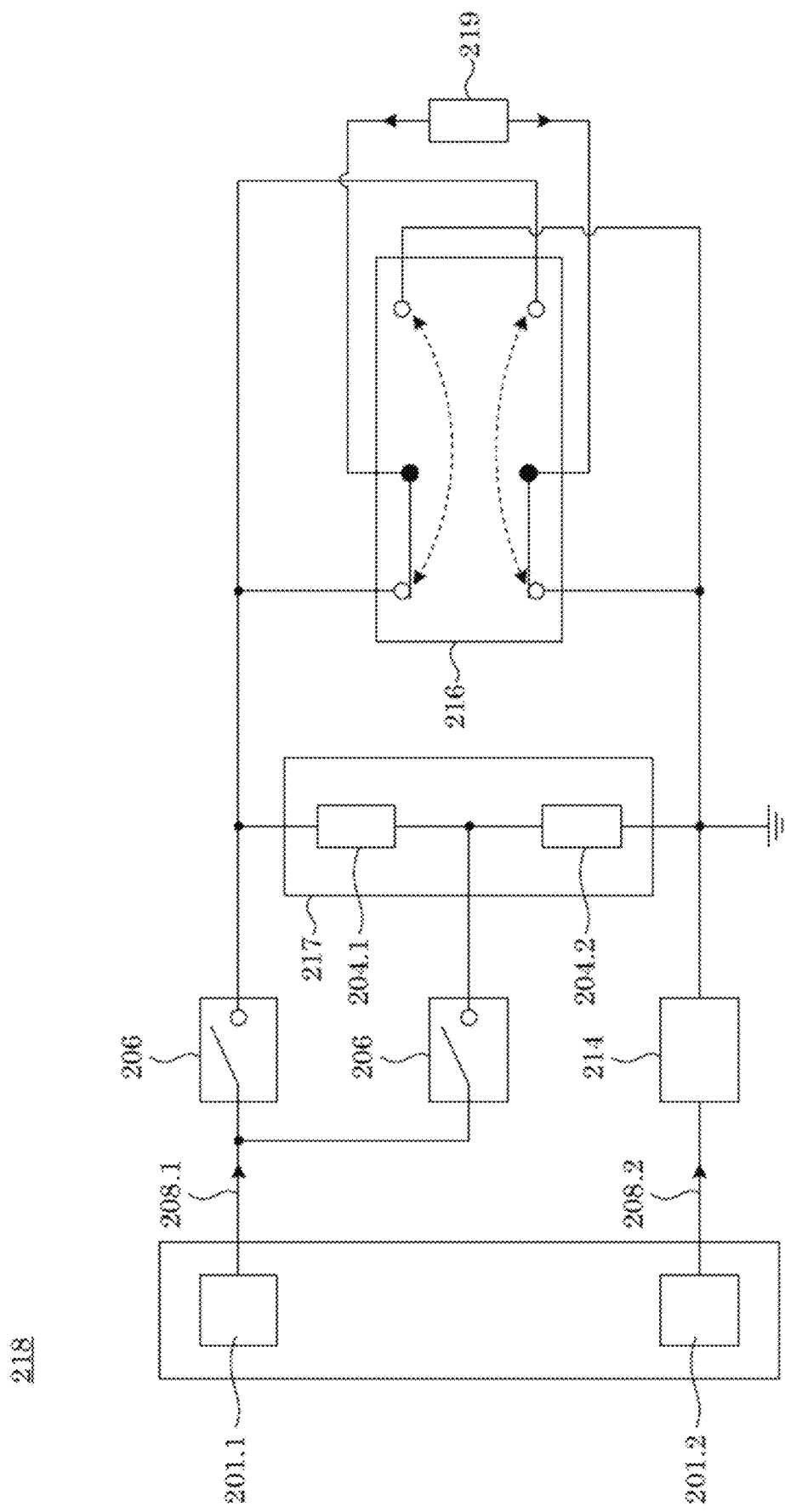
FIG. 8 shows a Josephson divider determiner.

With reference to FIG. 6 and FIG. 7, Josephson divider determiner 218 includes Josephson voltage standard 200 that produces provides voltage reference 208.1, voltage reference 208.2, and voltage reference 208.3 to voltage divider 217, relay 206, polarity switch 216 and from which voltmeter 214 determines a resistance ratio of resistors 204 in voltage divider 217. With reference to FIG. 8, Josephson voltage standard 200 that produces provides voltage reference 208.1, and voltage reference 208.2 to voltage divider 217, relay 206, polarity switch 216 and from which voltmeter 214 determines a resistance ratio of resistors 204 in voltage divider 217. In an embodiment, with reference to FIG. 6, two relay 206 connect simultaneously the measurement circuit to successively the input and the divided output of the voltage of the voltage divider 217. Combining the results of these two measurements allows the determination of the voltage ratio. As a result, voltmeter 214 successively measures the voltage difference between the two voltage references provided by Josephson Voltage standard 200 and the voltage at the input and divided output of the voltage divider 217. In FIG. 6. voltage divider 217 is biased in current by a low noise buffer amplifier 215. The stability and the polarity selection at the input of the buffer amplifier is provided by the Josephson voltage standard 200. Bias polarity inversion allows to remove the parasitic thermal electromotive force present in the measurement circuit. In this embodiment, no current is drawn from the Josephson junction array that could cause a systematic error in the measurement. Polarity switch 216 is implemented to reverse the polarity of the generated signal voltages biasing the resistive voltage divider. Exemplary polarity switch 216 include electromagnetic relays, semiconductor relays, and the like. Moreover, polarity switch 216 has double poles with low thermal electromotive force contacts and connections. According to an embodiment, with reference to FIG. 7, polarity switch 216 provides an automated operation to reverse the bias current polarity to the resistive voltage divider. In this embodiment the stable bias current source is provided by Zener voltage standard 219. The Zener voltage standard does not need to be calibrated for this measurement. As a result, voltmeter 214 successively measure the voltage difference between the two voltage outputs of and respectively input and the divided output of the voltage of the voltage divider 217. Relay 206 connect successively either the measurement circuit to the input and the divided output of the Resistive voltage divider. Combining the results of these two measurements allows the determination of the voltage ratio Bias current polarity inversion allows to remove the parasitic thermal electromotive force present in the measurement circuit. In this embodiment, no current is dawn from the Josephson junction array that could cause a systematic error in the measurement. FIG. 8 shows two output voltage taps from Josephson voltage standard 200. To match successively the voltage at either the top of resistor 204.1 and a top of resistor 204.2, the voltage output reference 208.1 is adjusted. The same method as used for that for FIG. 7 can be to determine the voltage ratio of voltage divider 217.

Voltage divider 217 is precision measurement instrument capable to scale up or down the accuracy from a voltage standard reference. A number of resistors 204 in voltage divider 217 can be, e.g., from 1 kΩ to 10 MΩ, specifically from 1 kΩ to 40 kΩ, and more specifically from 1 kΩ to 10 kΩ. A resistance of resistors 204 independently can be from 1Ω to 10 MΩ, specifically from 10Ω to 40 kΩ), and more specifically from 10Ω to 10 kΩ. Moreover, voltage divider 217 is thermally stabilized to minimize the temperature drift. In an embodiment, voltage divider 217 includes devices with low power coefficient, high divider ratio stability and possibly various selectable ratios.

Zener voltage standard 219 is semiconductor based stable voltage reference. Moreover, Zener voltage standard 219 has a low voltage drift and low noise. In an embodiment, Zener voltage standard 219 includes a buffer output amplifier to provide the necessary current to drive the resistive voltage divider.

Josephson voltage standard 200 can be made in various ways. In an embodiment, a process for making Josephson voltage standard 200 includes microfabrication of the various element and interconnecting them together. Fabrication of quantum circuit elements and classical circuit elements described herein can entail deposition of materials, such as superconductors, dielectrics, or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using lithographic techniques (e.g., photolithography or e-beam lithography).

Josephson voltage standard 200 has numerous advantageous and unexpected benefits and uses. In an embodiment, a process for producing voltage reference 208 with Josephson voltage standard 200 includes receiving, by first Josephson junction array 207.1, first bias current 205.1, third bias current 205.3, and first radiofrequency bias 221.1; producing, by first Josephson junction array 207.1, first voltage reference 208.1 in response to receiving first bias current 205.1, third bias current 205.3, and first radiofrequency bias 221.1; receiving, by second Josephson junction array 207.2, second bias current 205.2, third bias current 205.3, and second radiofrequency bias 221.2; producing, by second Josephson junction array 207.2, second voltage reference 208.2 in response to receiving second bias current 205.2, third bias current 205.3, and second radiofrequency bias 221.2; communicating first voltage reference 208.1 from first Josephson junction array 207.1 to first voltage reference output tap 201.1; communicating second voltage reference 208.2 from second Josephson junction array 207.1 to second voltage reference output tap 201.2; receiving first voltage reference 208.1 at first voltage reference output tap 201.1; and receiving second voltage reference 208.2 at second voltage reference output tap 201.2.

The process for producing voltage reference 208 with Josephson voltage standard 200 also can include producing, by first Josephson junction array 207.1 and second Josephson junction array 207.2, third voltage reference 208.3 in response to: receiving, by first Josephson junction array 207.1, first bias current 205.1, third bias current 205.3, and first radiofrequency bias 221.1; receiving, by second Josephson junction array 207.2, second bias current 205.2, third bias current 205.3, and second radiofrequency bias 221.2; communicating third voltage reference 208.3 to third voltage reference output tap 201.3; and receiving third voltage reference 208.3 at third voltage reference output tap 201.3.

The process for producing voltage reference 208 with Josephson voltage standard 200 also can include producing, by second Josephson junction array 207.2, third voltage reference 208.3 in response to: receiving, by second Josephson junction array 207.2, second bias current 205.2, third bias current 205.3, and second radiofrequency bias 221.2; communicating third voltage reference 208.3 to third voltage reference output tap 201.3; and receiving third voltage reference 208.3 at third voltage reference output tap 201.3.

Josephson voltage standard 200 and processes disclosed herein have numerous beneficial uses, including providing a primary voltage realization in a compact form format with reduced cost and hardware complexity. Advantageously, Josephson voltage standard 200 overcomes limitations of technical deficiencies of conventional compositions such as the use of multiple Josephson voltage standard systems for the calibration of voltage ratios, impedance ratio calibration, power applications or arbitrary low amplitude voltage generation. Further, reduced complexity in the bias design compared to tradition Josephson voltage standards simplifies the automation of the system and enables dissemination application.

Josephson voltage standard 200 and processes herein unexpectedly reduce the complexity for the generation of simultaneous multiple voltage reference outputs. Moreover, Josephson voltage standard 200 provides of a primary realization of the unit Volt.

It will be appreciated that Josephson voltage standard 200 provides producing a plurality of voltage references 208 simultaneously with single or multiple Josephson junction arrays 207 that can be disposed in a single cryogenic system. Voltage references 208 can be of fixed ratio, independently programmable, frequency locked, or phase locked for AC, power, or impedance applications. Josephson voltage standard 200 can be applied to a Josephson voltage standard (JVS); DC voltages or stepwise approximated waveforms, e.g., generated by a programmable Josephson voltage standards (PJVS), arbitrary waveforms generated by the Josephson arbitrary waveform synthesizer (JAWS), dual RF signals for communications, and the like. Josephson voltage standard 200 provides simultaneous generation of fixed or variable voltage ratios based on a selected configuration of elements of Josephson voltage standard 200 or bias configuration to operate Josephson junction array 207. Josephson voltage standard 200 can provide independent voltage references 208 that can include an arbitrary (e.g., integer) number of voltage references 208. Josephson voltage standard 200 can be implemented in a single chip design with multipole voltage reference output taps 201 or a plurality of independent circuits/devices located within a single cryogenic vessel (e.g., a Dewar or cryostat). In addition, Josephson voltage standard 200 can include wiring to communicate voltage reference 208 from cryogenic temperature to room temperature or to a selected temperature for an application (e.g., RF signal sources at millikelvin temperature for superconducting quantum computing or digital computing). Josephson voltage standard 200 simplifies by at least a factor of two complexity of conventional JVS systems for an arbitrary voltage ratio. Advantageously, Josephson voltage standard 200 provides generation of simultaneous voltage references 208, ratio calibrations, resistive or inductive voltage divider calibrations, reference voltage with arbitrary phase an amplitude for electric power standard calibration, impedance ratio measurement and phase standard calibration. With a single circuit, the multiple voltage reference output taps 201 share a common node. For applications with a fully floating voltage references 208, Josephson voltage standard 200 can include independent circuits.

Josephson voltage standard 200 overcomes duplicate JVS systems if more than one voltage reference 208 is used for an application, reducing complexity and costs. In some applications such a multiple voltage reference 208 provides self-calibration capabilities by use of the simultaneous voltage references 208. Further, Josephson voltage standard 200 provides a compact JVS. It is contemplated that, Josephson voltage standard 200 provides simultaneous 1 V and 100 mV JVS as voltage references 208 for calibration of a 10:1 voltage divider, which extends quantum-referenced calibration from 1 V to 10 V. In this manner, Josephson voltage standard 200 can be a 1 V-100 mV compact JVS for dissemination of revised SI volt in an absence of external calibration. Beneficially, such is less costly than conventional 10 V PJVS standards and is a full automation (turnkey) compact JVS.

Moreover, Josephson voltage standard 200 is a reference instrument for metrology and industrial applications, wherein Josephson voltage standard 200 provides two independent waveforms as voltage references 208 with accurate and programmable amplitudes, harmonic content, and relative phase settings JAWS for use in ratio calibrations, phase standard calibrations, and electric power calibrations.

The articles and processes herein are illustrated further by the following Examples, which are non-limiting.

EXAMPLES

Example 1

Impact of the Latest Generation of Josephson Voltage Standards in AC and DC Electric Metrology For decades, quantum behavior of Josephson junctions has been employed as intrinsic standards for voltage metrology. Conventional DC Josephson voltage standards have been primary standards for voltage, programmable Josephson voltage standards have been implemented in calibration services and precision measurements, such as the Planck constant, and Josephson arbitrary waveform synthesizers have been employed in AC voltage calibrations and precision measurements of the Boltzmann constant. With the redefinition of the Système International d'Unités, Josephson voltage standard is an intrinsic standard and equivalent realization of the unit volt.

Discovery of the Josephson effect and the subsequent development of the first Josephson voltage standards led to dramatic improvements in the accuracy of primary DC voltage references. The first steps in the evolution of quantum-based voltage standards were achieved in the 1970 s, first with a circuit containing a single Josephson junction and then with array circuits that produced increasingly larger DC output voltages by successively adding more junctions in series to the arrays. By the late 1980 s the output voltage of conventional Josephson voltage standard (CJVS) array circuits reached the practical value of 10 V, starting a broad international dissemination of Josephson voltage standards among National Metrology Institutes (NMIs) and many primary calibration laboratories. The second leap forward was achieved in the mid 1990 s with the successful design and fabrication of large arrays of Josephson junctions (JJs) with metallic barriers, instead of the insulating barrier used with CJVS. The non-hysteretic electrical properties of the metallic barrier circuits produced quantized voltages that were intrinsically stable and accurate over a large range of bias current, thus enhancing their stability to external current perturbations.

Two complementary types of Josephson voltage standards are programmable Josephson voltage standard (PJVS) and the Josephson arbitrary waveform synthesizer (JAWS, also known as the AC Josephson voltage standard or ACJVS). The accuracy of all Josephson voltage standard systems, including the CJVS, PJVS, and JAWS systems, relies upon the AC Josephson effect, in which the voltage across a junction is precisely proportional to the rate of change of the phase difference between the junctions two superconducting electrodes. When a junction is biased with a periodic current of appropriate amplitude and frequency such as continuous microwaves or periodic pulses, the superconducting phase difference responds synchronously, and the junction produces synchronized, voltage pulses with quantized area over a range of DC bias current. The generated voltage pulses are governed by the AC Josephson equation, which depends only on two fundamental constants of nature: the Planck constant h and the elementary charge (equal to the absolute value of the electron charge) e. With the upcoming redefinition of the Système International dUnités (SI), the value of these two fundamental constants will be fixed. As a result, in 2019 Josephson voltage standards will become a direct realization of the unit volt, rather than a representation of the volt based on the values of e and h adopted in 1990. After the SI redefinition, the realization of the unit volt can be independently achieved in every calibration laboratory, assuming the frequency standard used to lock the bias current pulse repetition rate of the Josephson voltage standard is linked to an SI-traceable time base.

The first generation of CJVS-type Josephson voltage standards, with zero-current crossing steps, is still widely used by many NMIs and is currently the primary voltage standard for their DC voltage calibrations. However, over the past few years a number of CJVS systems have been replaced by PJVS systems. Besides their intrinsic stability and rapid programmability, PJVS systems have the additional capability of generating programmable AC reference waveforms from DC to a few kilohertz for use in AC voltage and power metrology applications. Direct DC comparison between PJVS and CJVS systems have demonstrated agreement of 1 part in $10^{10}$ or better at 10 V and direct comparison of two PJVS systems has demonstrated agreement better than 1 part in $10^{11}$. Thus, the replacement of CJVS systems with PJVS systems will have no impact on reported calibration accuracy.

Quantum voltage standards are, in principle, intrinsically accurate. However, this statement is valid only over a finite range of bias and environmental parameters. The quantum locking ranges of both PJVS and JAWS systems can be periodically verified during regular calibration procedures to ensure they are performing as quantum standards with their expected accuracy. An understanding of, and routine checking for, all systematic errors (e.g. the effect of leakage current and inductive errors for the JAWS), and implementation best practices for each measurement setup, are involved for successful operation of Josephson voltage standards in metrology applications.

Currently, traceability for AC voltage is based on ac-dc thermal voltage converters (TVCs). Unlike DC voltage metrology that relies on accurate reference sources, the use of TVCs for AC metrology is a detector-based approach. In general, measurements with TVCs are time-consuming and involve multiple detectors to cover the voltage and frequency domain. Recent increases in the output voltage of JAWS standards could greatly simplify the realization of accurate AC voltages and will enable direct comparisons of commercial sources. In addition, calibration with JAWS standards could potentially reduce overall measurement uncertainty, measurement duration, and the extensive overhead of maintaining and calibrating numerous transfer standards in the calibration chain.

With regard to Josephson voltage standards, a properly operating Josephson voltage standard exploits the perfect frequency-to-voltage conversion of the Josephson effect in junctions formed by a weak link (or barrier) between two superconductors. The effect that describes this conversion was discovered by Josephson, and the quantized voltages produced by a junction when biased at microwave frequencies.

When biased with a current pulse of appropriate magnitude and width, a Josephson junction generates a voltage pulse with a quantized time-integrated area exactly equal to the inverse Josephson constant $K_J^{-1}=h/2e$ (the magnetic flux quantum), that is, the ratio of two fundamental constants. In PJVS systems, the combination of an AC current bias with frequency f (typically >10 GHz) and a DC current bias results in a signed integer number n of quantized voltage pulses per AC period and produces a DC voltage V given by $$V=n \times M \times K_J^{-1} \times f,$$

where M is the number of JJs in series. In JAWS systems, the JJs are biased by a fast pulse generator that controls the pulse pattern to generate a low-frequency waveform with the output voltage determined precisely by the known pulse sequence.

Until May 2019, Josephson voltage standards represented the unit volt by use of the value of $K_J$ defined in 1990 ($K_{J\text{-}90}$=483 597.9 GHz $V^{-1}$). After the redefinition, the new value is $$K_J\ 2e/h=483\ 597.848\ 416\ 984\ldots\text{GHz }V^{-1}.$$

based on the following exact values of e and h:

$$e=1.602\ 176\ 634 \times 10-19\text{ C, and}$$

$$h=6.626\ 070\ 15 \times 10^{-34}\text{ J·s}.$$

Note that with the transition to the new SI value of $K_J$, all secondary voltage standards will see a discontinuity of −1.07 parts in $10^7$ in their calibration values.

With regard to a programmable Josephson voltage standard, a PJVS system programs the output voltage by biasing various segments of the series-connected Josephson array circuit with various predefined DC bias currents. To achieve proper operation, this programmable array circuit involves long arrays of uniform JJs with uniformly applied microwave bias along the whole array. Compared to CJVS systems, the main advantages of PJVS systems are the large milliampere operating current range, the rapid programmability, and the intrinsic stability of the selected output voltage. A disadvantage of PJVS systems is that the electronics providing the DC bias currents are always connected to the PJVS circuit, resulting in multiple leakage current paths to ground (Earth). The PJVS bias electronics and circuit wiring can be properly designed to minimize leakage current contributions so they do not cause significant systematic errors.

Figure 9:
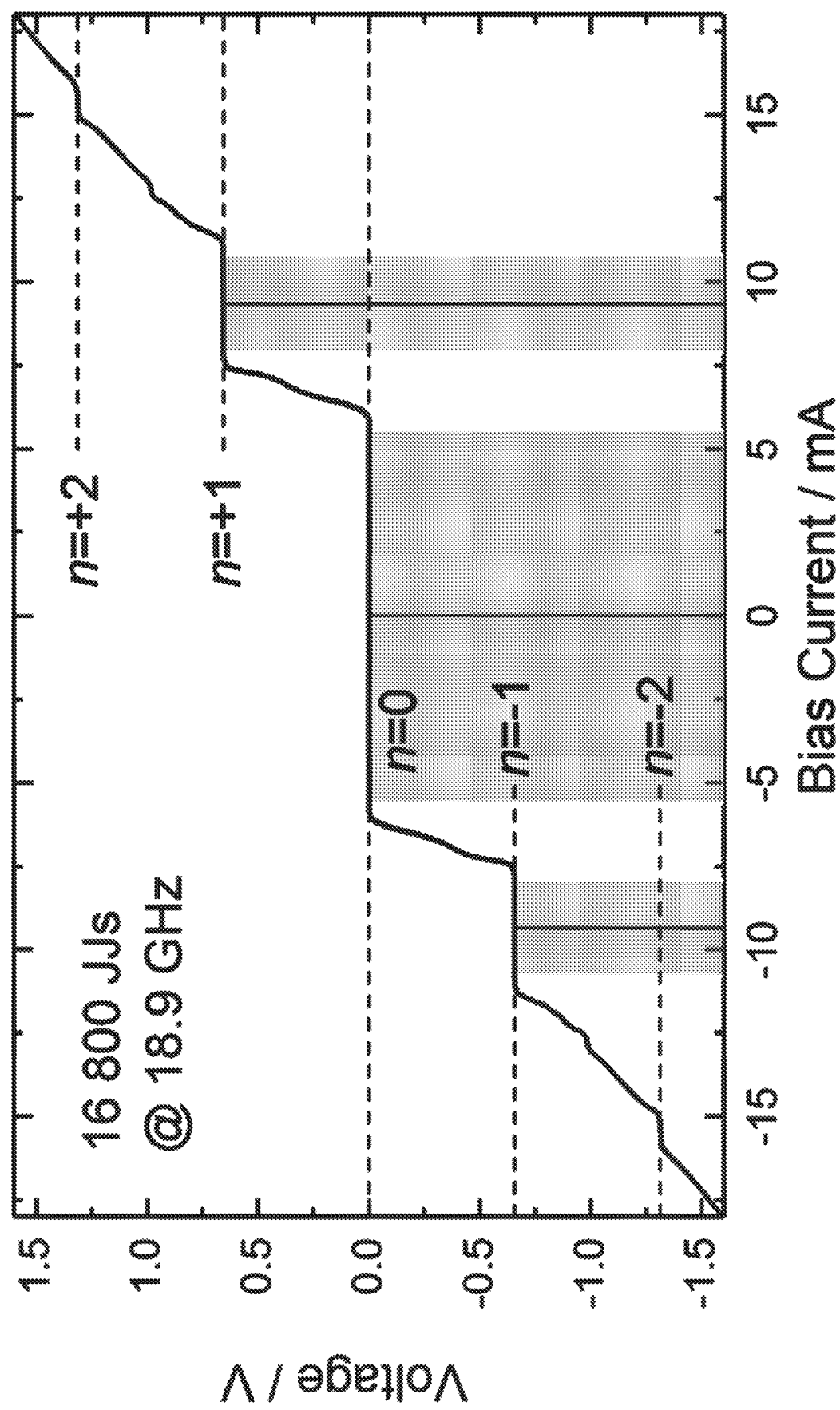
FIG. 9 shows a V-1 curve characteristic of a 16 800 JJ segment measured on a 10 V PJVS circuit. The voltage is accurately defined on the n=0, n=+1, and n=−1 constant voltage steps, but only over the bias current range shown in the grayed areas. The optimum bias value of each step (0 mA, +9.3 mA and −9.3 mA for n=0, +1, and −1, respectively) is indicated by a vertical line. The n=±2 constant voltage steps are visible.

To achieve the best voltage resolution, a PJVS circuit is subdivided into segments or subarrays, each containing a definite number of JJs. Initially the number of JJs for the shorter segments were distributed in a binary sequence (multiple of: 1, 2, 4, 8, 16, . . . ). However, to take full advantage of the three bias states (n=0, n=+1 and n=−1) of the PJVS voltage–current (V–I) characteristic (FIG. 9), a distribution of the JJs in a ternary sequence (multiple of: 1, 3, 9, 27, 81, . . . ) is a much more efficient option that minimizes the number of bias channels without compromising the resolution. This method can easily be extended to a quinary sequence of JJs (multiple of: 1, 5, 25, 125, 625, . . . ) if future performance of PJVS circuits allows simultaneous operation of the five steps n=+2, +1, 0, −1 and −2.

The segment with the smallest number of JJs is called the least significant bit (LSB). Sometimes more than one large segment or most significant bit (MSB) involves in the PJVS circuit to maximize circuit performance and to attain the largest output voltages. Because their values depend on temperature, applied microwave power and frequency, the bias current range of all subarrays is experimentally measured with a digital voltmeter (DVM). The circuit performance is optimized by selecting the midpoint of the range for the bias values for each voltage of each segment.

JJ technology can be based on superconducting/normal metal barrier/superconducting (SNS) junctions made of $Nb/Nb_xSi_{1-x}/Nb$. Although operation at higher temperatures allows use of smaller cryogenic coolers, the fabrication process for NbN-based junctions, requiring epitaxial growth, is more challenging.

Figure 10:
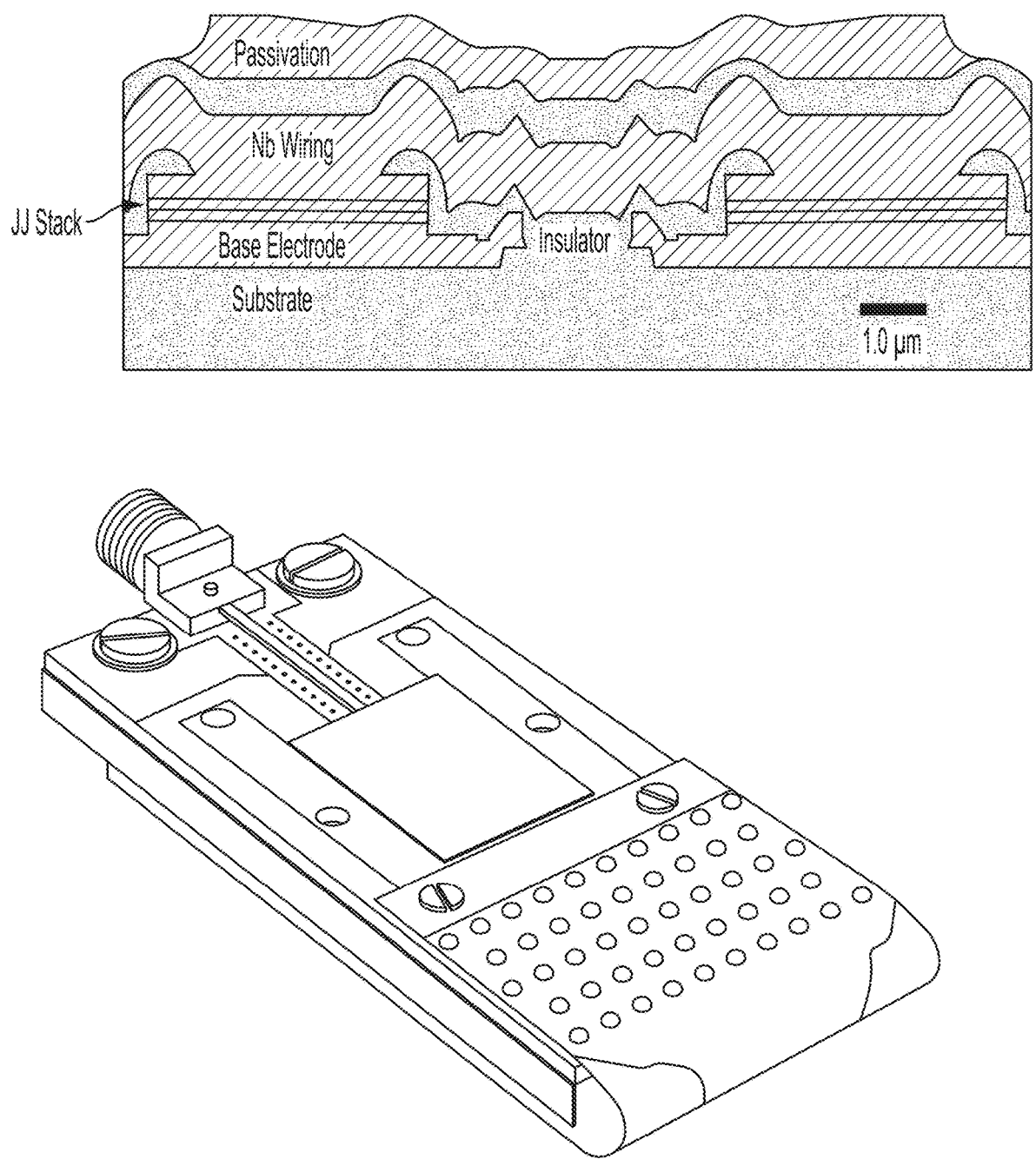
FIG. 10 shows (Left) SEM image of a 10 V PJVS circuit in cross section along propagation direction of the CPW center conductor. Two separate triple-JJ stacks can be seen. (Right) crypopackage for 10 V PJVS circuit. The chip size is 12 mm×17 mm.

NMIJ/AIST, PTB, and NIST have all developed PJVS circuits capable of reaching DC output voltages of at least 10 V. The NIST 10 V PJVS circuit has 265 116 JJs biased at a selectable frequency between 18.3 GHz and 22 GHz. The junctions are distributed in 32 parallel coplanar waveguides (CPWs), and uniform microwave power is delivered to each of the 32 CPWs by use of Wilkinson dividers made with lumped-element superconducting circuits. The Wilkinson dividers suppress microwave reflections at each branch that can negatively affect microwave power uniformity along the array and circuit performance. The NIST circuits also use impedance tapering of the CPWs, typically from 50Ω to ~30Ω, which allows a more uniform distribution of microwave current across all JJs in a given CPW. To make the circuits more compact, the junctions are stacked vertically in groups of three, as shown in the scanning electron microscope (SEM) image in FIG. 10. Such vertical integration is involved to reach a density of more than a quarter million JJs over a 12 mm×17 mm surface area.

The PTB circuit design is based on 128 parallel microstrip microwave transmission lines and is optimized for frequencies of around 70 GHz. Its advantage is that it involves only 69 632 single-stacked JJs to reach 10 V. The same circuit design is implemented with the 10 V PJVS system. PTB has realized a PJVS circuit with an output voltage of 20 V by adding an additional JJ in a vertical stack (double stack) to their single-stacked 10 V circuit design, effectively doubling the number of JJs in the circuit.

Figure 11:
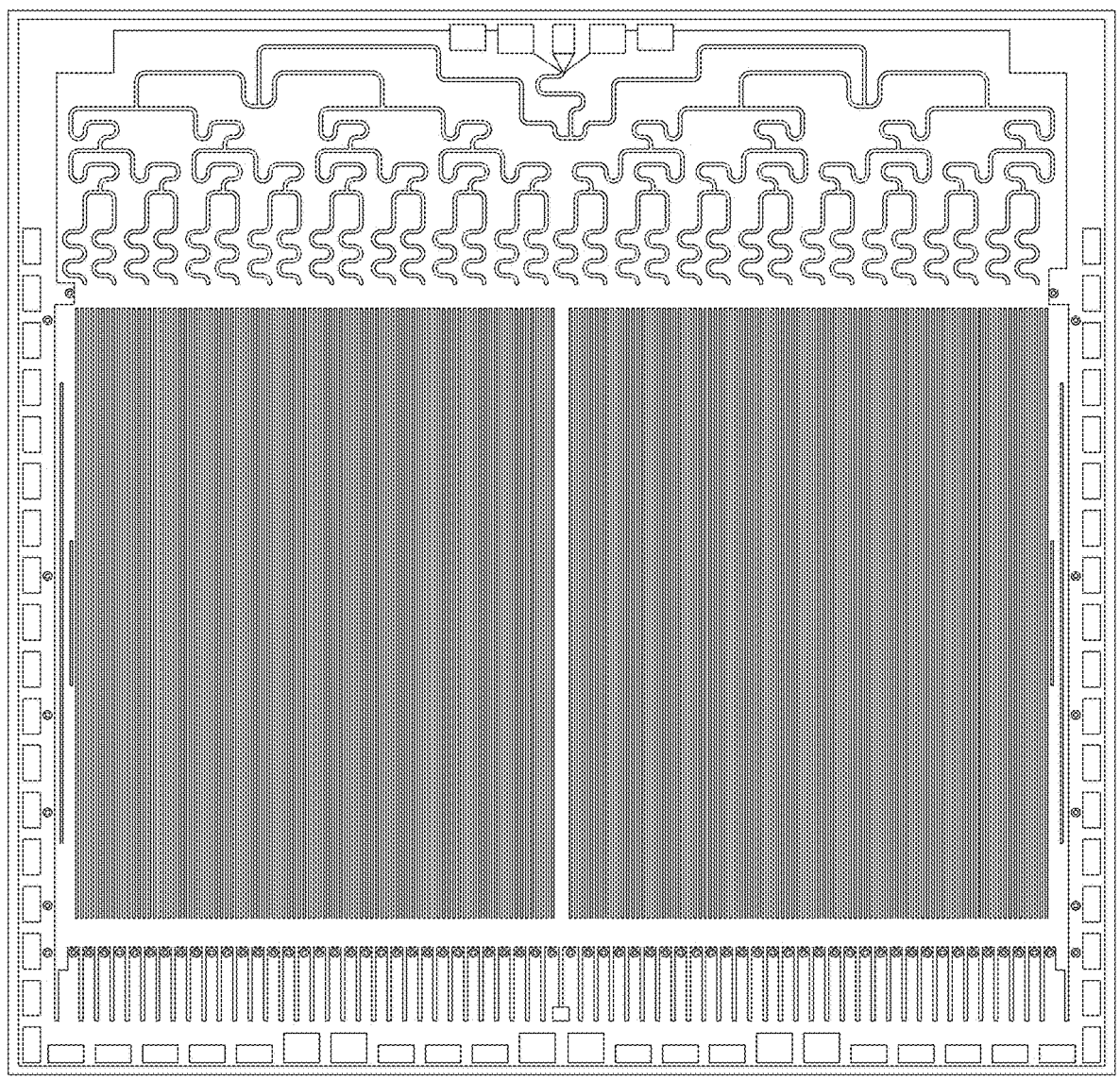
FIG. 11 shows a 17 V NMIJ/AIST PJVS circuit including 524 288 NbN/TiN/NbN JJs. The chip size is 15.28 mm×14.70 mm.

With 524 288 JJs, the NMIJ/AIST circuit is at present the most complex PJVS device to reach a voltage of at least 10 V (FIG. 11). Operated at 16 GHz, it can achieve an output voltage of 17 V when all segments are biased in the n=+1 state. By containing redundant JJs, this design can accommodate circuits with minor defects, thereby increasing the number of NbN-based circuits capable of reaching 10 V. However, achieving high-yield fabrication processes for PJVS circuits having several hundred thousand JJs is a challenging task. Double-stacked JJs are incorporated in the 17 V design, and the microwave distribution uses a 64-way splitter.

Operation of a 17 V or 20 V PJVS circuit involves bias electronics designed with twice the output voltage compliance compared to 10 V circuits. The secondary standards that are typically calibrated are the Zener DC references, which are calibrated at 10 V. So, a Josephson standard with an output voltage greater than 10 V has limited application for DC voltage calibrations.

Two other laboratories have developed PJVS circuits that have demonstrated lower voltages with alternative fabrication. The National Institute of Metrological Research (IN-RIM) in Italy, in collaboration with PTB, has developed a 1 V PJVS circuit based on superconducting-normal-insulating-superconducting (SNIS) junctions. The Institute of Electronic Measurements (KVARZ) in collaboration with the Institute for Physics of Microstructure from the Russian Academy of Science was the first laboratory to successfully implement a voltage standard made of a high-temperature superconductor (HTS). The KVARZ HTS circuit has 161 JJs made of grain boundaries between two $YBa_2Cu_3O_7$ layers. The output voltage of this HTS-based circuit reaches about 25 mV and has the main advantage that it can operate at 77 K (i.e. liquid nitrogen instead of liquid helium temperatures).

A summary of the different types of PJVS circuits currently being fabricated and their main characteristics are presented in FIG. 12.

The initial motivation behind the PJVS was to develop a quantum-accurate rms source, based on the calculated voltage levels of a stepwise-approximated waveform. Unfortunately, the ~1 μs switching duration (transients between steps) of the bias electronics developed in the mid 1990 s limited the relative accuracy to 1 part in $10^5$ at 1 kHz. Newer, faster electronics reduced the switching time and duration of the transients by more than two orders of magnitude, but realization of an accurate rms waveform synthesis with PJVS circuits was prevented by intrinsic systematic errors associated with the transients. However, development of measurement methods that eliminate the transients, namely those that exploit only the quantum-accurate portion of the steps in the PJVS stepwise waveforms, have opened numerous applications in AC voltage metrology for frequencies up to a few kilohertz. With programmable DC voltage and AC waveform capabilities, PJVS systems now largely surpass CJVS systems in both performance (i.e. intrinsic stability) and range of applications. NMIJ/AIST, and NIST have operated PJVS circuits on liquid-helium-free dry cryocoolers. Fully automated, liquid-cryogen-free PJVS systems are available from NIST through the NIST standard reference instrument program. As turn-key systems, these cryocooled PJVS systems do not involve an expert operator or cryogenic handling skills to be successfully and reliably operated. The ease of use of these systems extends the range of dissemination of PJVS from primarily NMIs to a larger number of calibration laboratories.

With regard to a Josephson arbitrary waveform synthesizer, a JAWS system generates accurate output voltages by controlling the timing, presence, and polarity of the quantized pulses created by the JJs. Like the PJVS system, the JAWS circuit involves long homogeneous arrays of JJs to generate useful voltages. Unlike the PJVS approach, in this case the JJ array is biased by a pulse generator so that during each clock cycle, each JJ in the array generates either a positive pulse, a negative pulse, or no pulse. A repeating sequence of JJ voltage pulses has a voltage spectrum with a calculable, quantum-accurate magnitude and phase. The pulse sequence is typically determined using a delta-sigma modulation algorithm. In practice, a pure, 1 kHz AC voltage waveform (FIG. 13) can be created with a calculable spurious-free dynamic range (SFDR) greater than 200 dBc for frequencies up to 100 kHz due to the large oversampling ratio between the clock rate (typically $14.4 \times 10^9$ pulses $s^{-1}$) and the frequency of the desired waveform (typically in the audio range).

Figure 13:
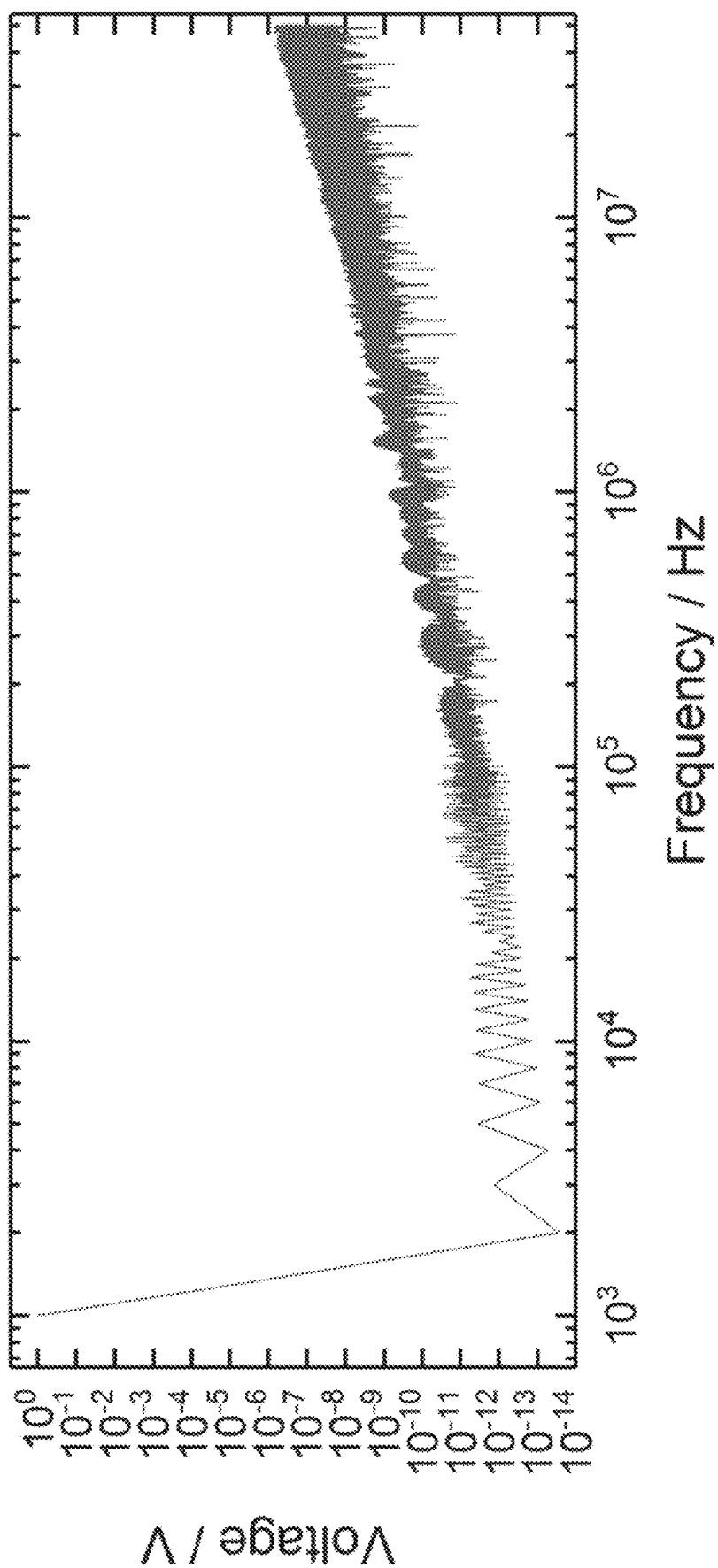
FIG. 13 shows a calculated spectrum from DC to 50 MHz of a 1 kHz sine wave with rms magnitude of 1 V, based on 12 810 JJs and a clock rate of $14.4 \times 10^9$ pulses s$^{-1}$.

As applied to JAWS circuits, the idea behind the sigma-delta algorithm is to step through the desired waveform as a function of time at the pulse rate and decide at each step (sampling period) whether the agreement between the desired waveform and the programmed waveform is better with a positive pulse, negative pulse, or no pulse. The decision is made using the output of a feedback loop whose input is the difference between the desired waveform and the pulse pattern at that time step, that is, the delta in the algorithm name. The structure of the feedback loop can be more sophisticated with multiple loops but typically involves the summation of past errors, that is, the sigma in the algorithm name. Typically, feedback loops used to calculate JAWS patterns for output voltages at frequencies <1 MHz contain two stages of integration and a low-pass filter. The net effect of this filter and algorithm is to move the digitization noise caused by the fast pulses away from the frequencies of interest (in this case, to >10 MHz), leaving a pure tone with a small background (FIG. 13). After the entire pulse pattern is generated, the magnitude and phase of all frequency components are determined from a Fourier transform of the pulse pattern. Typically, both the pulse pattern and the calculated value of the relevant frequency components are stored for later use.

Two differences between other typical uses of the sigma-delta algorithm and how it is used in JAWS systems are: the need for high pulse density, and the use of pre-generated patterns. The maximum output voltage of the JAWS system is proportional to the maximum pulse density, which is typically taken to be between 90% and 95% (with 100% corresponding to a pulse at every clock cycle). Operation at high density reduces the stability of the delta-sigma feedback loop and can also result in excess digitization noise. In general, a pulse density above 50% would be considered overloaded by the standard definition for a second-order algorithm. However, standard delta-sigma algorithms are often intended to be run in real time and accept or generate arbitrary waveforms as part of an analog-to-digital converter (ADC) or digital-to-analog converter (DAC), respectively. Because the JAWS waveforms are typically pre-generated, the delta-sigma algorithm settings can be tuned for a given output voltage, making the overload condition less important. Confirmation can be checked that the frequency content of the pattern after generation produces no distortions.

The JAWS systems developed by both NIST and PTB use the same basic type of JJs as they use in their PJVS systems (described above), though the JJ properties are optimized for operation at around 20 GHz. The maximum output voltage and the number of JJs used in the JAWS systems is smaller than in the PJVS systems. PTB has recently created waveforms with an rms output voltage of 1 V by summing the signals from eight JJ arrays operated on four separate cryopackages with a combined total of 63 000 JJs. NIST has recently summed two cryopackages with a total of 102 480 JJs to create waveforms with an rms output voltage of 2 V. Many of the circuits fabricated by NIST and PTB are used by other NMIs around the world.

In comparison to PJVS circuits, the smaller output voltage and number of junctions used in JAWS systems are directly related to the added complexity of the microwave pulse bias. Instead of a single-frequency bias, the JAWS pulse-pattern bias typically contains significant power at frequencies from 1 GHz to >30 GHz. Therefore, the JAWS system is even more sensitive to the non-ideal behavior (e.g. non-linear response) of the circuit elements and the quality of the high-speed pulse bias source and amplifiers. To combat this sensitivity, JAWS circuits have adapted many of the elements developed for PJVS circuits, as shown in FIG. 14, and have also added many parameters and pulse generation methods to optimize the pulse bias.

Like PJVS systems, JAWS circuits use JJs embedded in tapered CPW waveguides, and special emphasis is placed in the fabrication process on uniformity of electrical properties of the JJs. These design and process features compensate for loss in the CPWs, so that the optimal input current pulse is similar for JJs at the beginning and end of each array. JAWS circuits use the same low-pass superconducting inductive taps as used in PJVS circuits to extract the output voltage across each JJ array; the inductance prevents the taps from disturbing the high-frequency bias, while also having minimal effect at low frequencies. Finally, both the PJVS and JAWS systems use similar, though not always identical, on-chip resistive structures for microwave termination of the JJ arrays to avoid unwanted reflection.

Figure 15:
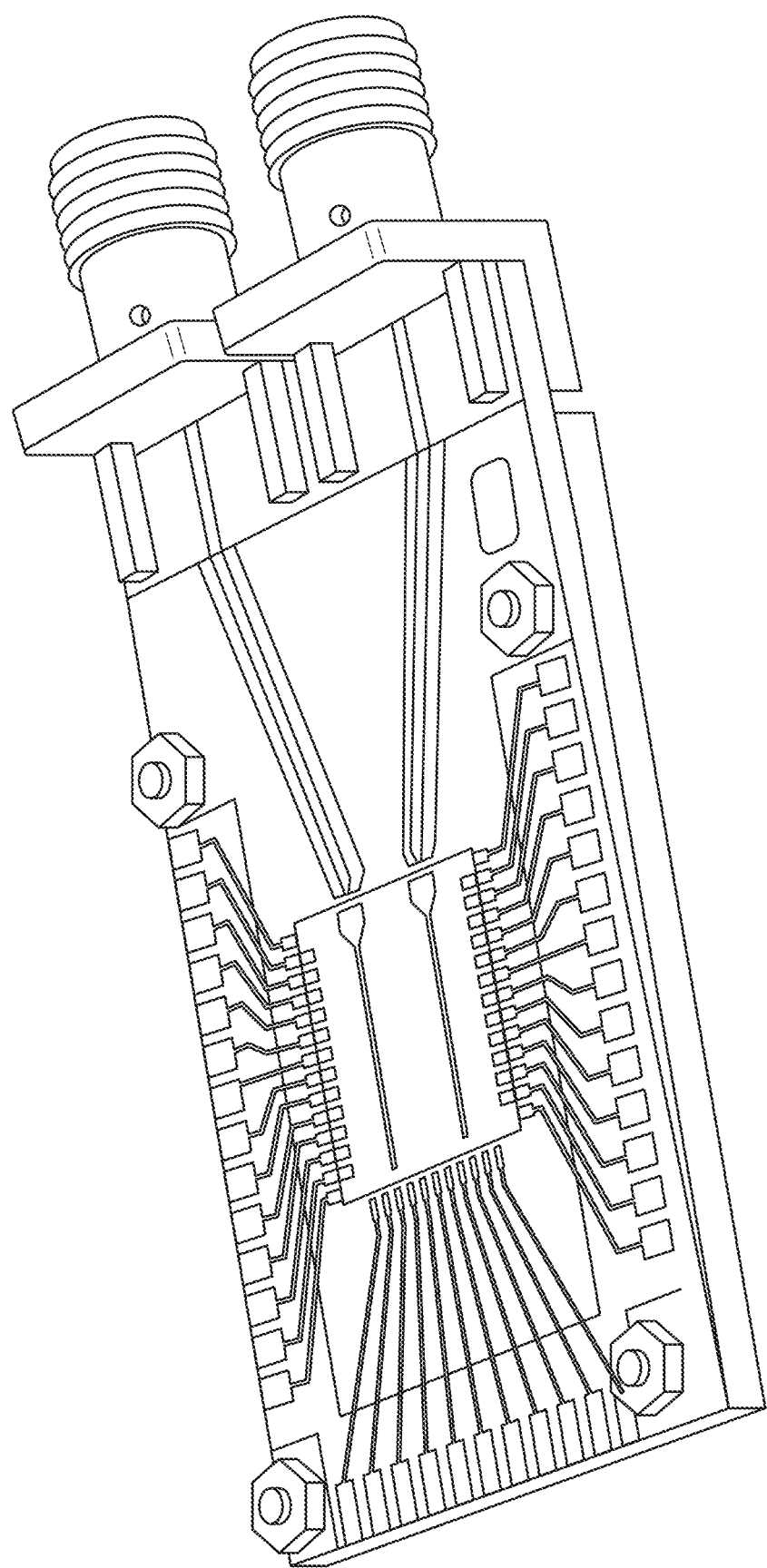
FIG. 15 shows a JAWS circuit with two arrays of 6000 JJs fabricated by PTB. The chip size is 10 mm×10 mm. Four sample holders and eight arrays are combined in series to reach 1 V rms.

Current PTB and early NIST JAWS circuit designs did not use explicit on-chip microwave power distribution elements (FIG. 15); instead, each JJ array was connected to the pulse generator through separate high-frequency, semi-rigid cables, connectors, and room temperature components. This direct connection was necessary to maximize the input bandwidth for the pulse waveform bias and minimize reflections in the pulse transmission path. This direct connection means that each JJ array was biased by a separate channel of the pulse generator. This approach had the advantage that the bias settings of each channel could be optimized to match the properties of each JJ array, but had the disadvantages that pulse generator channels are expensive. Every microwave cable also increases system complexity and heat dissipation at cryogenic temperatures.

Recent NIST JAWS circuits have adopted the on-chip power division approach used in PJVS and CJVS circuits by adding on-chip Wilkinson dividers, so that each pulse generator channel and microwave line can bias multiple JJ arrays. This drastically reduces system expense and complexity but also places more stringent constraints on the uniformity across the entire chip for both the frequency response of the on-chip microwave elements and the electrical properties of the JJs. That is, by biasing multiple JAWS arrays with a common pulse generator channel, one cannot independently optimize the pulse bias to each array. The removal of optimization parameters also typically reduces the range of bias parameters over which the system is quantum locked, where one JJ output pulse is generated for every input pulse. This reduction in QLR makes the system more difficult to operate correctly and can affect stability.

NISTs recent use of a finite-impulse-response (FIR) filter on the pulse generator outputs allows an improvement in pulse shape uniformity, which partially compensates for the added circuit components and circuit complexity.

The use of Wilkinson dividers on the NIST PJVS and JAWS circuits involves the implementation of an additional passive on-chip microwave component: an inside-outside DC block between each JJ array input and Wilkinson divider outputs. This takes the form of capacitive breaks on the grounds and inner conductor of the CPW. This low-frequency isolation of the individual JJ arrays from the pulse generator is involved so that the JJ arrays can be summed in series to generate larger, quantum-accurate voltages. The PTB JAWS system and earlier NIST JAWS systems use room temperature inside-outside DC blocks and maintain that isolation from room temperature to each JJ array.

The typical room-temperature equipment used by a JAWS system consists of pulse generators, broadband microwave amplifiers, and low-frequency, isolated current sources. The generators pulse repetition rate f (clock) limits the maximum output voltage $V=M \times f \times h/2e$ for M JJs, though typically other circuit components and the JJ properties also limit the maximum repetition rate. The generators memory size, which determines the maximum duration of the synthesized waveform, places a lower bound on the output voltage frequency. In some cases, the output amplitude of a pulse generator channel is sufficient to bias a JJ array. However, in other cases, especially when dividers are used to bias multiple arrays, the pulses involve additional amplification. The amplifier can meet stringent involvements of large output current, wide bandwidth, and small gain ripple. This is particularly true when driving arrays through Wilkinson dividers; at least 3 dB more power is involved for each layer of Wilkinson dividers.

Finally, achieving the highest output voltage typically involves biasing each JJ array by a low-frequency, isolated, current source with the same shape as the desired JAWS output voltage waveform, often called a compensation current. This involvement is a side effect of the need for inner-outer DC blocks to isolate the JJ arrays from the pulse generators in order to connect multiple arrays in series without common mode signals. The DC blocks are high-pass filters that shift the offset of each pulse based on the recent pulse-density history. This changing offset narrows the bias range over which the JJ arrays remain quantum-locked and the JAWS circuit produces accurate voltage waveforms. The current source compensates for the shift by reintroducing the components of the spectrum removed by the filter. However, the compensation current is also a source of systematic error.

A separate solution to the presence of a high-pass filter is to change the shape of each pulse by removing the low-frequency content. This is often called a zero-compensation method. In the simplest version, a half-pulse of opposite sign is applied both before and after the conventional pulse. The spectrum of this pulse-like object has very little power at the frequencies affected by the high-pass filter (i.e. inner-outer DC block), and therefore the filter has minimal effect on the pulse shape. After optimization, the non-linearity of the JJ response to the pulse-like object results in a single voltage pulse. Using this zero-compensation pulse-bias method both reduces the complexity of the electronics and removes sources of error in the output voltage. The main disadvantage of the zero-compensation method is that it reduces the maximum output voltage. Each pulse-like group is spread over a longer time interval, thus reducing the maximum pulse repetition rate and the output voltage. In practice, there is usually a trade-off (that depends on synthesis frequency) between the need for higher voltage or improved signal-to-noise ratio and the need to remove frequency-dependent sources of error. Larger synthesized amplitudes at lower frequencies are typically synthesized with compensated biases, whereas at higher frequencies (>100 kHz) where systematic errors from compensation become significant, zero-compensated bias methods are used to produce lower-amplitude signals. The zero-compensation waveforms can also be directly compared to compensated waveforms as a function of frequency at lower voltages to better understand and characterize the systematic errors present in the higher-voltage compensated waveforms.

Unlike the CJVS and PJVS systems, JAWS systems have only recently begun to make the transition from being research tools towards becoming disseminated standards. This change is motivated by having reached an rms output voltage of 1 V, where the JAWS systems can begin to play a larger role in thermal convertor calibrations. An automated, liquid-cryogen-free JAWS system is now available from NIST through the NIST standard reference instrument program.

Over the past 30 years there has also been progress in making digital circuits using single flux quanta (SFQ) by using JJs as active logical elements instead of transistors. Such circuits can be used in a JAWS system in which the JJ array and the room-temperature pulse generator are replaced by an array of superconducting quantum interference devices (SQUIDs) biased by on-chip logic. To date, these systems have only found use in applications involving very small voltages.

With regard to Josephson quantum locking range and limitations and a quantum locking range, a Josephson voltage standard (JVS) is operated within its its quantum locking range (QLR) if every JJ produces a single voltage pulse (n=+1) per input bias pulse. When biased on the QLR, the output voltage remains constant over a significant adjustable range around the step-centered bias parameters. A JVS can be in one of two states: either it is operated within a well-characterized QLR, and the output voltage generated by the JJ array is precisely known; or it does not have a QLR, and the output voltage is undefined. In the second case, the JVS cannot serve as a metrology reference. Measuring only the stability of the generated voltage over a long period of time, possibly with low uncertainty, is not a sufficient criterion to test the quantum accuracy of voltage standard; it simply tests the stability of the system biases and environment. If biased slightly outside its QLR the output voltage may remain stable (and probably very close to the ideal value) but will provide inaccurate voltages. For maximum confidence in output voltage accuracy, the JVS can be operated with the largest QLR achievable; ideally, the output can be confirmed during calibration measurements.

Figure 16:
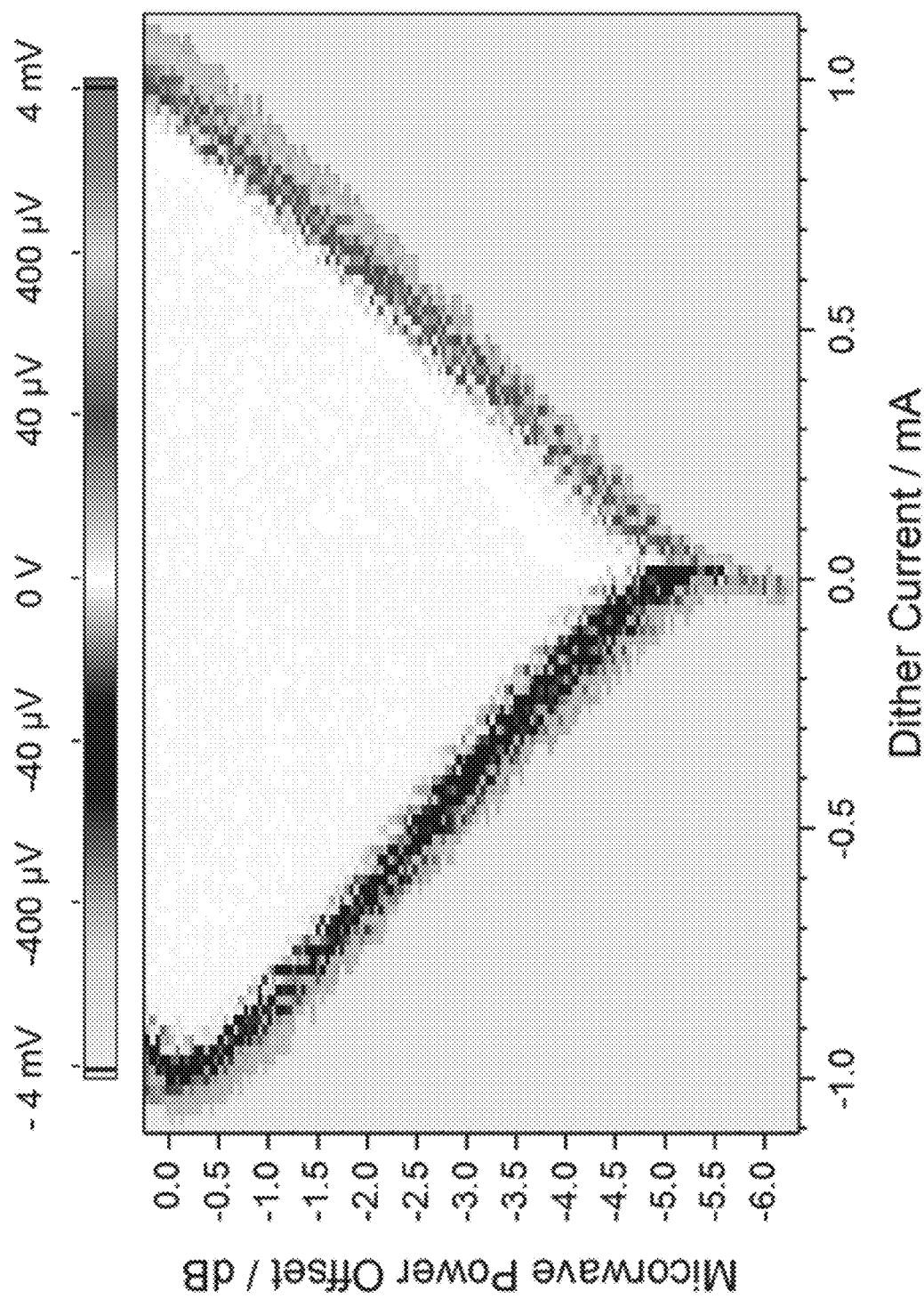
FIG. 16 shows a two-dimensional quantum-locking range of a 10 V PNS array with the subarrays biased such that exactly the same number of junctions are at +5 V and −5 V, producing a null voltage. The horizontal (x) axis is the dither current applied through all the subarrays, while the vertical (y) axis shows microwave power offset in dB relative to initial (optimum) power. The white area indicates QLR where the output voltage remains constant. The measurement was performed on the 1 mV range of the digital nanovoltmeter.

A JVS system can have a built-in procedure to self-check its QLR either manually or automatically. With the NIST PJVS system, the QLR is confirmed routinely with a commercial digital nanovoltmeter. To reach the maximum sensitivity of the nanovoltmeter, the subarrays are biased in series and with opposite sign to obtain zero net DC output voltage. In this configuration, one or more parameters are dithered to determine the limits of the operating range (also known as the operating margin) and whether the voltage remains constant. The bias parameter most commonly tested is a DC offset current (also called dither current or trim current), which is applied to every subarray. In FIG. 16, two PJVS parameters, current offset and microwave power, have been varied from their initial (and optimal) bias setpoint while the output voltage, which was set to 5 V+(−5 V)=0 V, is measured. The QLR is defined as the area or the range in which the voltage remains constant (white region at 0 V in FIG. 16). In this example, the microwave power can be reduced by more than 4 dB while still maintaining perfect voltage quantization, validating operating parameters selected from the margin table of bias setpoints for all subarrays.

Figure 17:
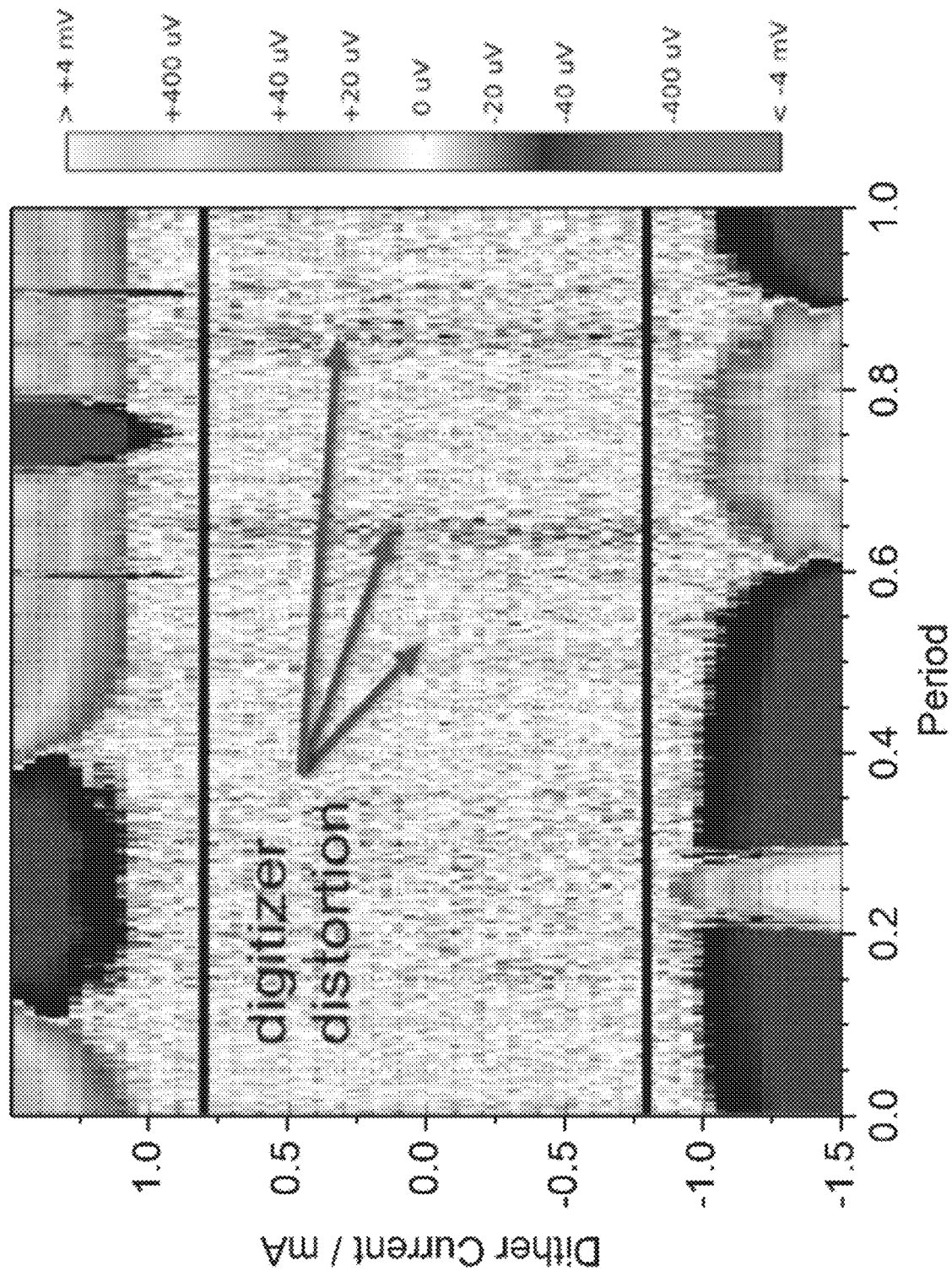
FIG. 17 shows a quantum locking range of a JAWS system generating a 1 kHz waveform with an rms magnitude of 2 V, wherein a voltage residual is indicated for a sinewave fit as a function of dither offset current (y axis) and waveform period (x axis). The data was digitized over 80 ms with a digitizer (range 10 V, input impedance 1 MΩ, sampling rate 1 MHz). Lines show the 1.6 mA quantum locking range of this waveform and system, wherein residuals are limited by digitizer distortion and do not depend on offset current over the entire waveform period. Pulse sequences (e.g. at 0.25, 0.6, and 0.9 parts of a period) are shown for QLR.

Because the JAWS waveform is periodic in time, the QLR is generally verified with a digitizer or a high-resolution oscilloscope. One method to determine the QLR is to add a low-frequency triangular sweep to the bias current compensation signal and measure the time-dependent distortion of the JAWS waveform. NIST has developed a graphical method (FIG. 17) for displaying QLR, where the ideal synthesized waveform is subtracted from the measured signal, and only the voltage residuals (distortion) are shown in a surface density plot. The vertical axis shows the DC offset current magnitude, while the horizontal axis represents one period of the JAWS signal. The central speckled bands shows the QLR where the residuals are minimal. By monitoring the residual measurement while varying other bias parameter, the QLR area can be seen to shrink, thus determining the QLR for that parameter.

QLR verifications are performed on JVS systems through automated software, where the voltage output leads are connected only to the nanovoltmeter (for PJVS) or digitizer (for JAWS). When a JVS is imbedded in a calibration or a more complex measurement circuit, then the initial QLR verification may not be accessible nor may be performed automatically. In more complex measurements, additional factors such as the presence of current noise induced by undesired ground loops can reduce the QLR. In a worst-case scenario, these unaccounted perturbations could jeopardize the quantum accuracy of the measurement. One way to verify the quantum accuracy of the NS reference without disturbing the measurement circuit is to repeat the measurement multiple times while successively applying an offset to one of the bias parameters, with the bias offset magnitude not exceeding the QLR. For example, the automated measurement sequence of a direct (dc) comparison between two PJVS systems can be programmed with three levels of offset current: 0 mA, +0.2 mA and −0.2 mA. During data analysis, if the voltage difference between the two PJVS systems is not correlated with the bias parameter change, then the quantum accuracy (or QLR over the tested range) is confirmed for the entire duration of the measurement. A similar verification approach is built into the NIST PJVS-Zener DC reference calibration measurement. Application of a similar verification method is strongly encouraged for all types of measurement involving any JVS, and especially with the implementation of a PJVS with a Kibble balance or Joule balance.

Obtaining a well-defined QLR is a validation test that can be completed before performing any calibration measurement with a JVS. However, other factors can limit accuracy of the JVS. For a JVS, the microwave or pulse-bias electronics can be locked to a reference frequency of high accuracy and traceable to the SI. A JVS is a direct frequency-to-voltage converter, wherein a relative uncertainty in the frequency reference is transferred with the same magnitude to the voltage uncertainty. Compact frequency standards can achieve an absolute frequency accuracy better than one part in $10^{11}$. Frequency standards can easily be made traceable to the SI anywhere on Earth with the use of a global positioning system disciplined oscillator.

Common to JVSs is potential for the JJs to source current when the output of the JVS circuit is connected to a low-impedance load. Current flowing in the voltage output leads will generate a voltage error due to the finite resistance of the wires. Driving excessive current out of the JVS device may also exceed the operating range of the JJs, such that the resulting loss of quantization will destroy the accuracy of the JVS voltage.

When a PJVS is operated to generate DC voltages, the two main error contributors are the thermal electromotive forces (EMF) and voltages generated from leakage currents. These errors are due to the finite resistance of the voltage output leads and the temperature gradient between the PJVS circuit at ~4 K and instruments connected at room temperature. Thermal EMF errors can easily be eliminated by performing polarity reversal measurements. Leakage current errors can be limited by properly engineering the NS bias electronics and by using a material with high isolation resistance for all leads connected to the PJVS circuit.

Figure 18:
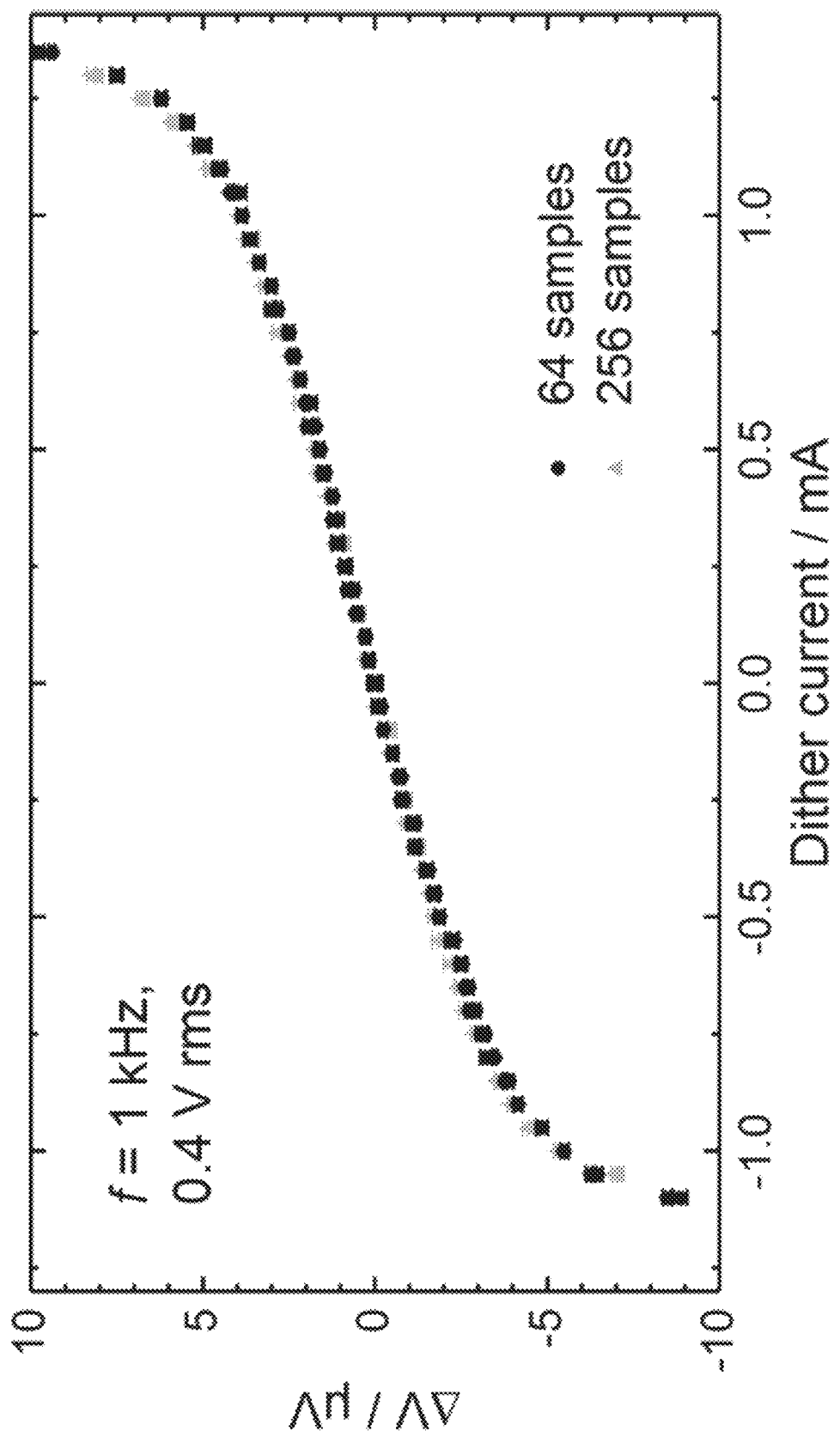
FIG. 18 shows a relative change of rms voltage measured with a thermal transfer standard for a 0.4 V stepwise-approximated sine wave versus applied dither current. The voltage value at 0 mA is used as the reference for the voltage difference ΔV. The slope observed within the ±0.7 mA dither range is due to transients present in the waveform; the QLR of the PJVS array when generating DC voltages is ±0.7 mA.

Direct synthesis of PJVS AC waveforms can be used for rms calibration of devices under test (DUT) such as AC voltmeters, TVCs and thermal transfer standards (TTSs). The finite rise time of the current bias-electronics and stepwise nature of the waveforms introduce multiple non-negligible systematic errors. Development of faster switching bias electronics or techniques to drive low impedances do not eliminate this inherent problem. The rms value of a PJVS step-wise approximated output waveform is never fundamentally accurate; a small change in one of the PJVS bias signals, such as the bias current to one subarray or the applied microwave power, has an influence on the rms output voltage. FIG. 18 shows absence of accurate voltage over the range we expect to observe a QLR. The plot shows the effect of current bias offset on the rms voltage measured by a thermal transfer standard operated with a high input impedance. Due to transient effects, the magnitude of the slope varies almost linearly with frequency. PJVS stepwise-approximated waveforms contain large numbers of harmonics, with the magnitude of the harmonics (including the fundamental) affected by the transients. The use of a two-level PJVS waveform is one way to slightly minimize the effect of transients on the fundamental, but it has the undesirable consequence of generating a large quantity of large-amplitude digitization harmonics. The use of two-level PJVS waveforms has been implemented for fast reverse DC measurements and was suggested for impedance ratio measurements based on two PJVS systems.

As shown in FIG. 18, tuning just one of the bias signals will always modify the transients in some fashion and results in a change in rms voltage. If the rms value of the transients matches exactly the rms value of the PJVS waveform, then the rms output is independent of the waveform frequency selected. This special operating bias point (the intersection of curves at different waveform frequencies) was first determined experimentally in TTSs and TVCs. However, the independent tuning method (without relying on a TVC standard) is rather fastidious, and the accuracy of the method remains affected by any external perturbations including current noise, stability of the bias electronics and changes in microwave power due to changes in the liquid helium level in the dewar. Due to transient-related errors and the resulting lack of quantum accuracy in rms amplitude for stepwise-synthesized waveforms, most rms measurements with PJVS systems have been abandoned. Sampling or differential-sampling methods, which avoid the effects of the transients, are recommended for performing AC voltage calibrations with stepwise PJVS waveforms.

The JAWS system has systematic errors that change as the waveform frequency increases above about 10 kHz. Thermal EMFs play a similar role as in the PJVS system. However, current flowing in the circuit can have a much more pervasive effect as a function of frequency. Specifically, systematic errors will arise from both the compensation current through the JJ arrays mentioned earlier and the current flowing in the output leads between the JJ arrays and the DUT. This second source of error is typically called the voltage lead error or correction.

Thermal EMFs will affect the JAWS output voltage and cause offsets in rms or power measurements. This can affect small amplitude measurements although a stable thermal EMF can be removed by performing a polarity reversal measurement as is done with the PJVS. On the other hand, AC measurements, which separate lower-frequency noise from higher-frequency signals of interest will not be affected by thermal EMF. Nevertheless, a system design that minimizes the thermal EMF is still worthwhile because it simplifies data analysis and improves system stability.

Compensation current applied using isolated current sources is a source of systematic error but can be avoided with use of zero-compensation waveforms if the reduction in output voltage is acceptable. Because the JJ array is inductive, compensation currents create an error voltage with frequency-dependent amplitude that is approximately 90° out of phase with the desired output voltage. In a typical NIST JAWS system generating an rms output of 1 V at 1 kHz with a total inductance of about 50 nH and compensation current amplitude of about 10 mA, the resulting error voltage has an rms magnitude of about 3 µV. The magnitude of this error voltage increases linearly with frequency and compensation amplitude.

Figure 19:
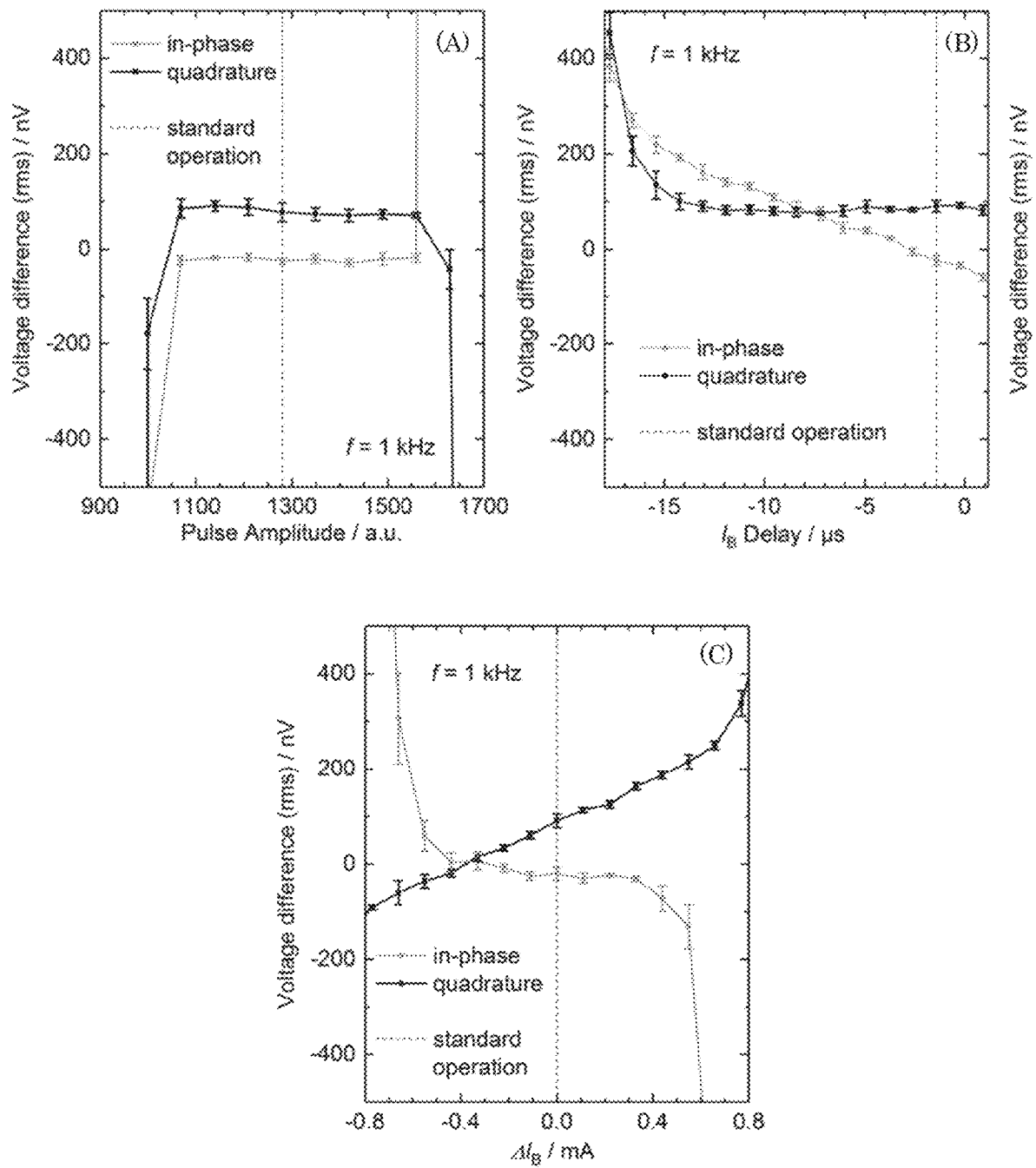
FIG. 19 shows in-phase and quadrature magnitudes of the residual difference between two JAWS systems, each generating a 1 kHz output with an rms magnitude of 1 V, versus different bias parameters. The standard operating point (vertical dotted line) is the bias setting that maximizes the QLR for DC current offset. (A) The residual magnitude is independent of the pulse magnitude (within the QLR from about 1100 to 1550) but in depends strongly on (B) compensation phase and (C) compensation magnitude. The phase is expressed in terms of the time delay of the compensation relative to the pulse generator output, while the compensation magnitude is expressed as a change MB from the standard operating point of about 10 mA.

The impact of this systematic error can be calculated by effectively measuring the JJ array inductance, the magnitude of the compensation current and the phase of the compensation current relative to the synthesized waveform from the JJ array. FIG. 19 shows the dependence of output voltage on compensation current. As in the earlier PJVS example (FIG. 16), we obtain the maximum voltage resolution from a null measurement resulting from the sum of two waveforms with the same, 1 V rms magnitude and opposite phase. The residual voltage difference is measured by a digitizer and expressed in FIG. 19 in terms of the in-phase and quadrature components. A bias parameter for one of the waveforms is then slightly detuned from those for standard operation where the QLR in response to a DC current offset is maximized.

Another possible source of error is a low-frequency current from the pulse generator. Although this current can be removed by the DC blocks, an error voltage with a magnitude and phase that depends on the details of the system will occur at higher output waveform frequencies. The magnitude of this error can be determined by changing the amplitude of the bias from the pulse generator. In FIG. 19A we observe the desired behavior, where the residual voltage is not dependent on detuning of the pulse magnitude while the JJs are in the QLR.

In FIG. 19B and FIG. 19C, we detune the compensation phase and magnitude, respectively, and observe significant changes in the residual voltage even while the system is quantum locked. These changes are consistent with the above model of an error voltage generated by compensation current passing through the JJ arrays. Because the error voltage is approximately in quadrature with the generated voltage, small changes in phase will linearly affect the in-phase residual voltage while having minimal effect on the quadrature voltage. Similarly, small changes in magnitude will linearly affect both the quadrature and in-phase residual voltages, but the scale of the effect will be significantly smaller for the in-phase residual voltage.

A more fundamental source of error is current flowing in the output leads. This current can have two sources: leakage paths and the impedance of both the voltage output leads and the device under test. The first case is identical to that of the PJVS, except that stray capacitances will also result in leakage currents with frequency-dependent magnitudes. In the second case, the fact that the JAWS is an AC voltage source causes more significant errors due to the impedance of the connecting leads and the inputs of the DUTs. The PJVS system operating at DC typically uses precision DC voltmeters that have a large input resistance >1 GΩ and leads with resistance <1Ω. Inductances and capacitances have no effect, so the output leads and DUT cause a simple voltage division at the DUT and an error of <1 nV at 1 V dc. On the other hand, AC instruments typically have input resistances <10 MΩ, and the input shunt capacitances >10 pF cannot be neglected. The combination of the DUT input impedance, on-chip inductance of the JJ arrays and inductive filters, and the cable inductance and capacitance typically results in a resonance between 10 MHz and 100 MHz. The tail of this resonance has a significant effect on AC measurements above 100 kHz that is proportional to the frequency squared.

The effect of the output leads is exacerbated by the long leads needed to reach cryogenic temperatures. If the JJ arrays are cooled with liquid helium, then the output leads are typically about 1.5 m in length, whereas cryogen-free systems typically have leads that are longer than 0.5 m. Shorter leads are possible and would reduce the error voltage, but can result in a significant heat load on the cold stage. An alternative approach is to attempt to flatten the frequency response of the leads by adding additional impedance.

FIG. 19C also accounts for sources of systematic error and detuning bias parameters when making comparisons between systems. In this case, reducing compensation magnitude by about 0.4 mA gives a measured difference of approximately zero between the two systems. Further averaging and fine-tuning of the compensation magnitude and phase could allow the systems to agree with a type A uncertainty limited only by the stability of the system. However, this would not represent the true agreement; in practice, the effect of the compensation current and all the other bias parameters can be measured and accounted for, either in the reported value or in the type B uncertainty.

DC voltage calibrations can be performed by either PJVS or JAWS systems. If the voltage output of a JAWS system reaches 10 V in the future, one might expect that JAWS systems will supplant PJVS systems for DC applications. However, it will be difficult to decrease the magnitude of JAWS leakage currents to that of PJVS systems and difficult to reduce the instrument cost of the necessary multi-channel pulse generator to match that of a single microwave source. Until now, PJVS circuits show the largest practical output voltages, and DC voltage calibrations that involve programmable voltages are presently performed almost exclusively with PJVS systems.

A DC application for PJVS systems is direct calibration of secondary voltage standards. With the near total elimination of the use of chemical cells (Weston cells) from NMI laboratory benches, the secondary standard for dissemination of the unit volt is the temperature-controlled Zener DC reference at 10 V. Although these devices are engineered to minimize sensitivity to environmental conditions and their inherent drift has been reduced to a few µV/V per year, their output voltage remains dependent on variations in temperature, atmospheric pressure and humidity. To build a history and establish confidence in its predicted value and uncertainty, a Zener DC reference can be regularly calibrated. The principal advantage of a PJVS system over a CJVS system is that its output voltage can be adjusted to perfectly match the Zener DC reference voltage with use of the bridge measurement configuration. A digital nanovoltmeter can then be used to measure very small residual voltages (typically <1 µV, corresponding to the magnitude of thermal EMFs in the circuit). With no voltage step jumps, unlike CJVS, the calibration duration may also be shorter. Another application of PJVS systems is calibration of gain and linearity of voltmeters and ADCs, which involves the rapid programmability of PJVS systems.

With a greater immunity to external noise than CJVS systems, PJVS systems can also be implemented in applications such as the direct calibration of the DC range of commercial calibrators and DACs. Another application is the calibration of voltage ratios; for instance, DVM ratio calibrations are involved for applications such as measuring load cells used in mass metrology. NIST is currently working to extend the dual-voltage output option on a single PJVS system from the 2 V circuit to the 10 V circuit, eliminating the need fora Zener DC reference for the ratio calibration.

The DC calibration of nanovoltmeters cannot be performed with a single PJVS system, because the voltage resolution is limited by its LSB or would be defined by the voltage of a single JJ (typically many microvolts). To generate voltages with amplitude less than a few hundred microvolts, one method has been to use two independent PJVS standards in a differential configuration. The same differential configuration is obtained when performing a direct comparison of two PJVS standards. By slightly detuning the microwave bias frequency of one PJVS circuit, the gain calibration of the nanovoltmeter can easily be measured. Other methods to generate low-amplitude DC voltages (and AC voltages with the same principle) involve reducing the pulse density with JAWS standards or developing a PJVS circuit with dual microwave bias signals with independently tunable frequencies.

In addition, other metrology applications rely on the accuracy of PJVS systems. The electronic kilogram experiments with Kibble balances and the Joule balance were the first metrology applications of 1 V PJVS systems. Kibble and Joule balances will become a practical way to realize the unit of mass after the proposed SI redefinition. Another example is the quantum metrology triangle, where electrical quantum-based measurements are expected to verify the consistency of three electrical quantum phenomena: the Josephson effect for voltage, the quantum Hall effect for resistance (QHR), and single electron tunneling for current. More recently, an elegant method to realize the unit ampere was proposed by coupling two electrical quantum standards (PJVS and QHR) with a cryogenic current comparator.

Efforts can extend the PJVS calibration range beyond core voltage reference applications including DC current measurements with a calibrated current shunt and the measurement of DC resistance ratios with a commercial calibrator to supply the current. This quantum calibrator approach involves an independent calibration of the current shunt or the reference resistances, and the overall accuracy of the measurement relies on the stability and performance of the commercial calibrator used as a current source.

Regarding PJVS stepwise approximated waveforms, an accurate way to exploit a stepwise-approximated PJVS waveform for AC metrology is to implement a measurement method that avoids the transients. Only those portions of the PJVS waveform where the voltage is fully settled can be used as a voltage reference for AC signals. With this constraint, a logical measurement approach is to use sampling methods. Two types of sampling methods have been implemented with PJVS waveforms: sampling plus switching (or multiplexing) and differential sampling.

Figure 20:
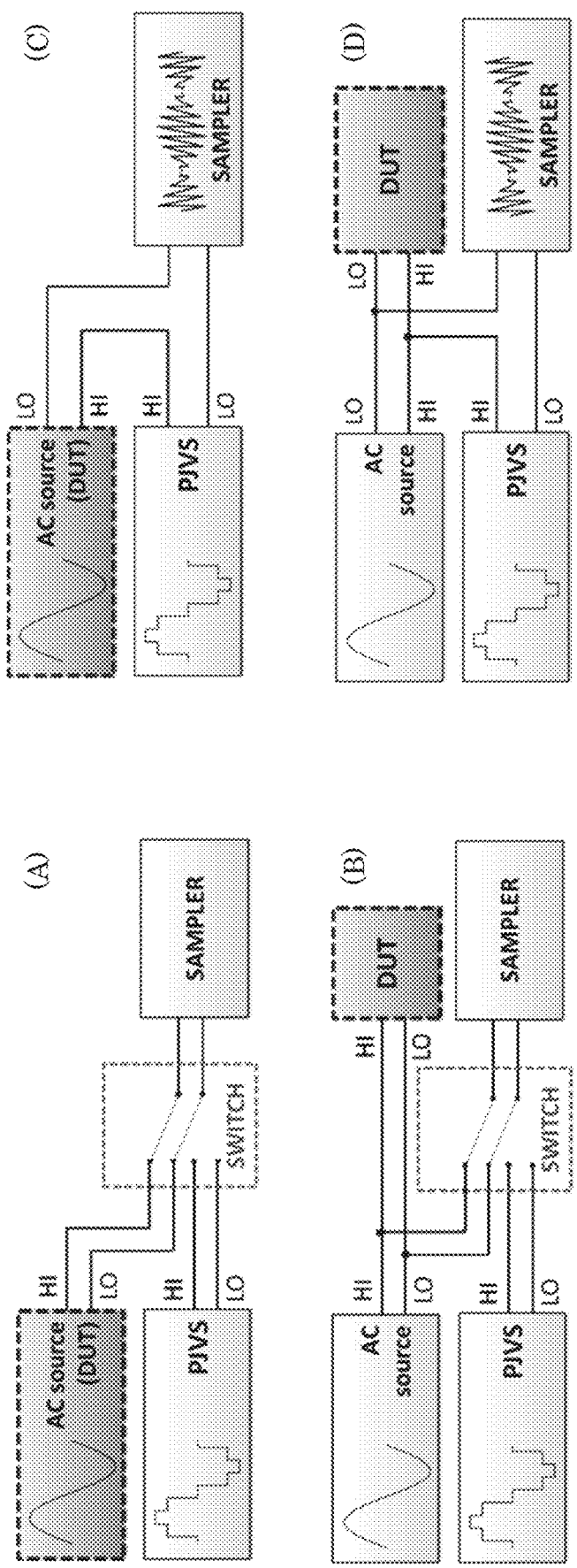
FIG. 20 shows various sampling methods: (a) and (b) sampling and switching and (c) and (d) differential sampling. The DUT can be an AC source, as shown in (a) and (c), or the source output can be connected to a DUT, as shown in (b) and (d). Synchronization signals to the various instruments are not shown.

In either case, the goal of sampling is to transfer the accuracy of the PJVS reference waveform to a custom or commercial AC source. The output of the AC source can then be connected directly to a detector (e.g. AC voltmeter, TTS, TVC) as long as the source can provide the necessary loading current to drive the detector. In this case, the sampler and the PJVS, which acts as a sense input, can be placed as close as possible to the detector reference plane (FIG. 20). Both sampling methods involve a stable AC source with high spectral purity. Undesired harmonics in the frequency bandwidth of the sampler could create aliasing effects on the fundamental of the waveform and potentially induce systematic error in the rms voltage reconstruction.

The sampling plus switching PJVS method was first demonstrated by PTB for the electric power standard. A slightly different version was implemented at METAS based on comparing the fundamental harmonic of AC source waveforms to the PJVS. Switching methods rely on the measurement capabilities of the sampler over the full waveform amplitude range (peak-to-peak). To minimize errors due to sampler non-linearity, the amplitude of the PJVS waveform is adjusted to match that of the AC source waveforms. Synchronization between the AC source, PJVS circuit, sampler and switching unit (multiplexer) is recommended to remove the transient contributions from the PJVS waveform and to facilitate rms amplitude reconstruction. However, the switching approach does not involve phase alignment between the two waveforms. One factor to consider in the measurement uncertainty is the resistive divider effect between the resistance of the leads connecting the PJVS array to the sampler input terminal and the input impedance of the sampler. The magnitude of this effect is typically less when the multiplexer is connected to the AC source (assuming an ideal output source impedance) due to a shorter cable and hence lower resistance on the AC source path.

PJVS differential sampling with an AC source was demonstrated at NIST. Expansion of the rms waveform amplitude up to 7 V and 10 V occurred. With the differential sampling method, the sampler is used in a null-detector configuration, thus reducing errors due to the gain, non-linearity and input impedance of the sampler. To minimize the differential voltage measured by the sampler, the PJVS waveform shape, amplitude and phase are adjusted to match the AC source waveform. This can be achieved if the three instruments (PJVS, AC source and sampler) are locked to a common frequency reference. Presence of phase jitter, produced by either the AC source or the sampler, will automatically translate to an apparent increase in voltage noise in the differential voltage measurement, an effect inherent to the differential sampling method. As a result, the rms output of the AC source is attributed with a larger type-A uncertainty and does not reflect the real amplitude stability of the source. The jitter effect can be observed with AC sources (ac voltage calibrators) phase-locked at the same frequency as the generated waveform. This inherent effect is only masked and hidden—not eliminated—by performing an average of the differential voltage signal over a large number of periods.

The results of the sampling method can be independent of the selected number of steps in the PJVS waveform. Adding more voltage steps per period (N) for the PJVS waveform has the benefit of reducing the differential voltage at the input of the sampler. This is an advantage if the amplitude of the AC source waveform is large and the input range of the sampler is limited. However, increasing N reduces the duration of the well-defined voltage for each step of the waveform. Generally, shorter sampling duration (or aperture duration) increases the noise in the voltage measurement. The same reduction effect of the sampling window arises if the frequency of the waveform increases for a given value of N, because the transient duration remains the same. Typically, differential sampling methods are limited to waveform frequencies below a few kilohertz. Subsampling methods have been proposed to extend the frequency of the AC source while keeping the reference PJVS waveform frequency f below 1 kHz.

Figure 21:
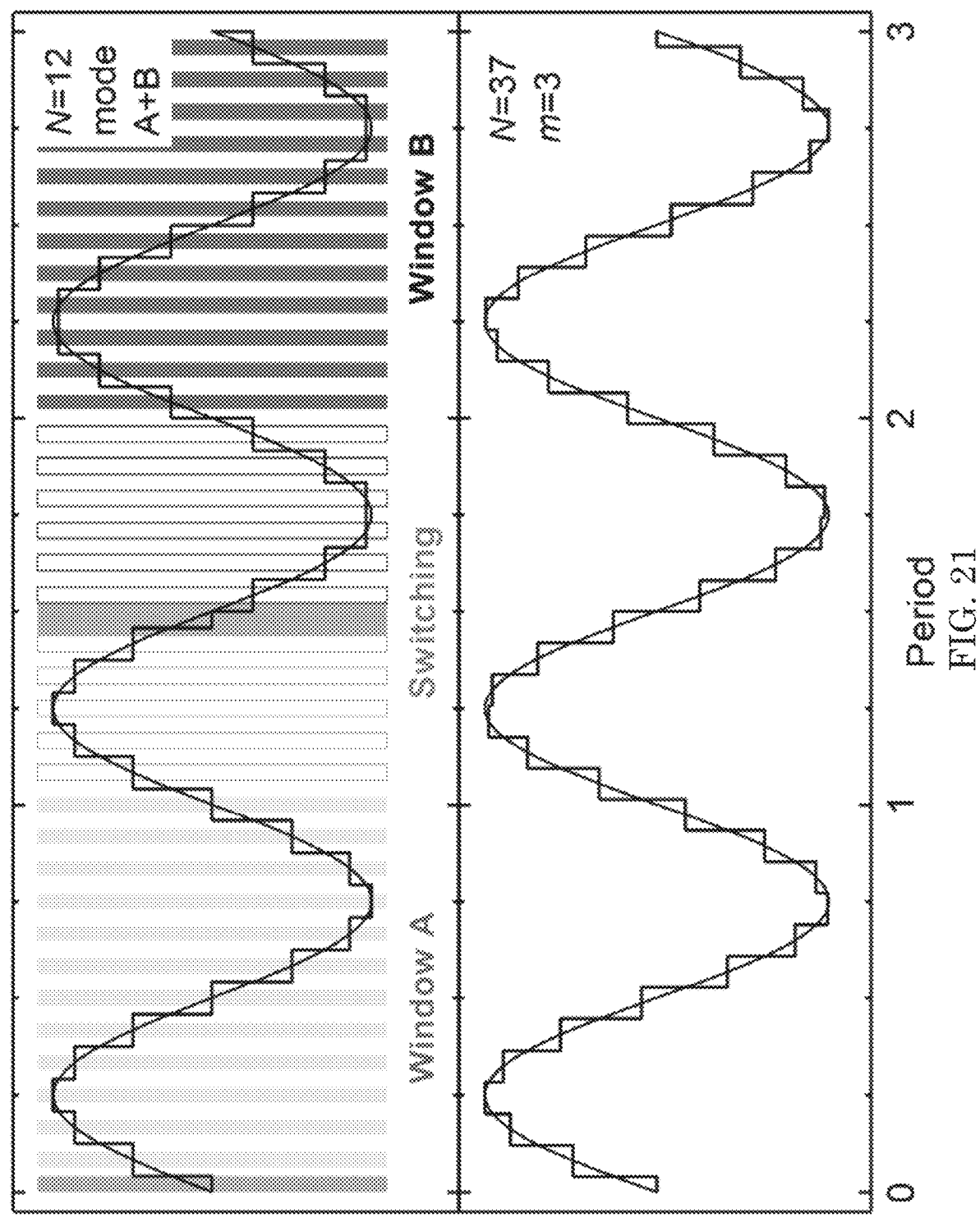
FIG. 21 shows types of PJVS reference waveforms to track AC source over multiple periods. (Top) alternating sampling windows (A) and (B) are shifted by T/2N to cover the full range of the AC source period in the same measurement. (Bottom) the PJVS reference is adjusted to match the AC source over m=3 periods.

Due to the presence of the transients, the sampling windows do not usually cover a full period T=1/f of the AC source signal. The rms amplitude calculation uses a sinusoidal model with an applied fit or fast Fourier transform, which may be inaccurate if the AC source has spurious harmonics. One method to recover the full rms content is to combine two distinct measurements with shifted sampling windows A and B. This principle can be applied to a single measurement by programming a PJVS reference that covers multiple periods of the waveform (FIG. 21, top). In this model, the sampling duration corresponds to 50% of the PJVS step duration, or T/2N. When the switching occurs between the PJVS reference A and PJVS reference B, no precision measurement can be performed (Gray zones containing PJVS transitions separated by T/2N instead of T/N standard duration). Programming a PJVS waveform with multiple periods for each reference A and B, interleaved with the switching period, may improve the overall efficiency of the method. Compared to the two distinct measurements, a single measurement may more accurately track the short time stability of the source and may reduce overall uncertainty.

Another approach is to generate a PJVS reference waveform that tracks the AC source over m multiple periods (FIG. 21, bottom). In this case, either N or m is often chosen to be an odd number. Over m periods of the AC source, the sampling windows will cover the entire AC source waveform. One limitation of this method is that the frequency $f=(m/N)\times f_{PJVS-Clk}$ of the AC source waveform may not always have a fixed decimal value. To facilitate the removal of transients, $f_{PJVS-Clk}$ can be an integer sub-multiple k of the sampler digitizing frequency f, (i.e. $f_{PJVS-Clk}=f_s/k$). This technique can also be used to match some AC source frequencies that cannot be commensurate with either $f_{PJVS-Clk}$ or $f_s$ over a single period (for instance, at f=60 Hz with m=3, N=100 and $f_s$=10 MHz). Ultimately, for both methods shown in FIG. 21, the memory size of the PJVS bias electronics limits the number of PJVS samples N and indirectly the number of periods that can be programmed.

Examples of applications in which PJVS sampling or differential sampling methods have been implemented include calibration of AC sources (called AC quantum voltmeter by PTB and Supracon), electric power standards, calibration of TTSs and TVCs up to ~1 kHz, and dynamic linearity measurement of ADCs.

JAWS systems can calibrate TTSs using single-frequency and DC waveforms. A desire to expand the calibration range has pushed the development of higher output voltages, to the point where it is now possible to directly calibrate the high-impedance ranges of typical TTSs. Progress has also been made on using dividers to calibrate standards higher voltage ranges. Further improvements in direct calibration will involve accommodating lower input impedances, perhaps by using buffer or transconductance amplifiers similar to the one developed for implementation with a PJVS. Reaching higher frequencies will involve improved methods for limiting the systematic errors from the output leads, as discussed earlier.

JAWS waveforms have been used to calibrate and characterize the non-linearity of electrical components using a variety of waveforms: DC offsets and single tones, two-tone waveforms in a general setting, and many tones as a key component in Johnson noise thermometry. Johnson noise thermometry extracts temperature by measuring the Johnson noise of a resistor and these systems have recently been used to measure the value of the Boltzmann constant. JAWS waveforms are used to calibrate the entire measurement chain with μV/V precision at frequencies up to 1 MHz, directly enabling pK/K temperature measurements. In this context, the JAWS source is often called a quantum voltage noise source (QVNS) because a pseudo-random JAWS waveform is used, that is, a comb in the frequency domain, with a magnitude approximately matched to the expected Johnson noise.

JAWS systems have also begun to be used as the dual voltage sources in both two-terminal and four-terminal automated impedance bridges. The advantage of JAWS sources is that they can generate AC voltages (with arbitrary relative magnitude and phase) on command so that a single bridge can compare any two impedances in an automated fashion. Typical high-precision bridges are manually operated and use transformers as dual sources which severely limits the type and value of the impedances that can be compared using any single transformer. This shift from transformers to JAWS systems has the potential for massively simplifying and automating AC impedance metrology.

Finally, as will be discussed in more detail in the next section, an important use of JAWS systems is for intercomparions with other JAWS and PJVS systems. While both JAWS and PJVS systems use JJ arrays, the bias circuitry is sufficiently different that such comparisons allow much to be learned about systematic errors. In particular, pure JAWS AC waveforms can enable precision measurements of systematic errors present in PJVS systems operated away from dc, and the effort taken to remove sources of error at DC in PJVS systems will help improve the performance of JAWS systems at dc.

Figure 22:
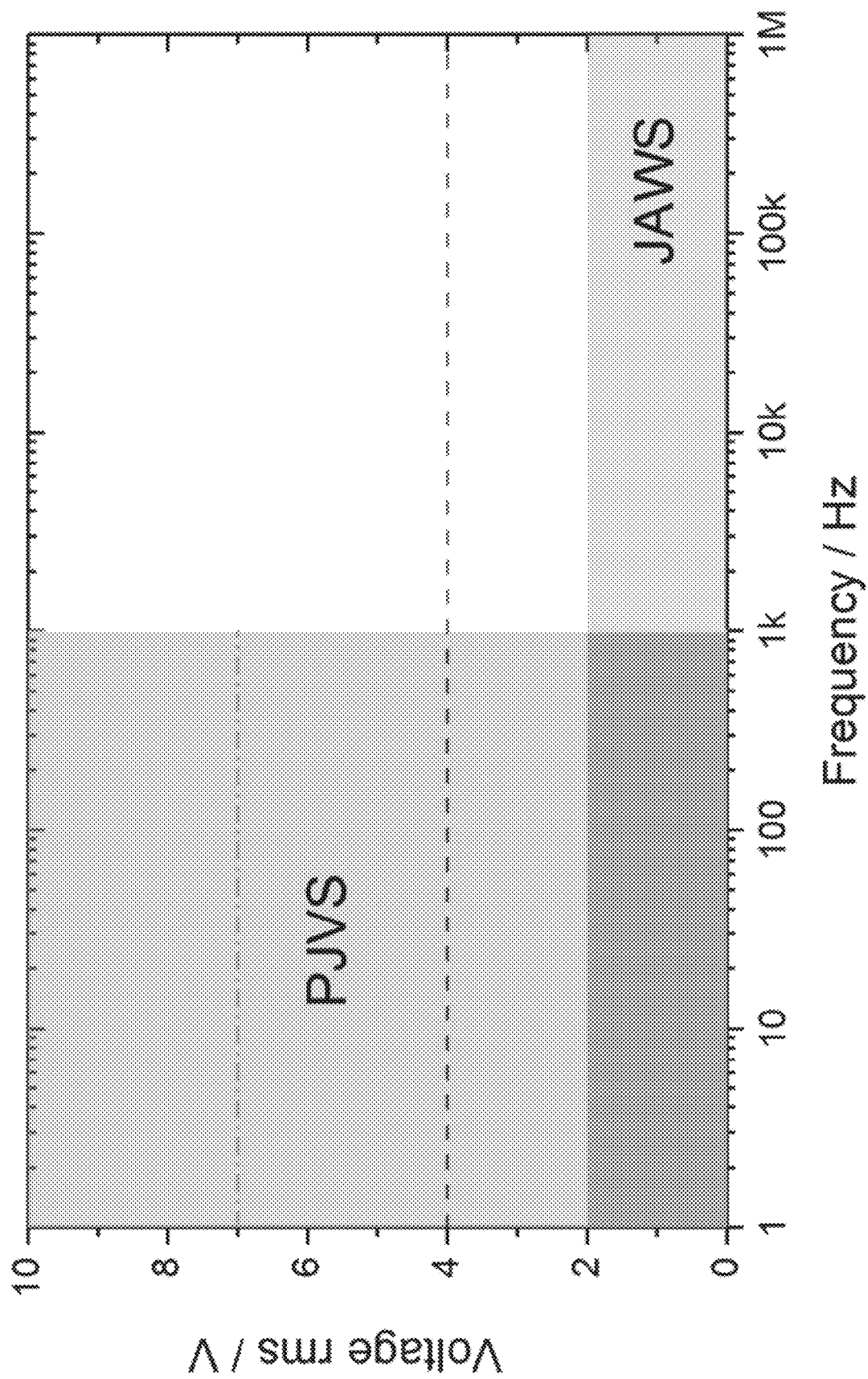
FIG. 22 shows a graph of voltage versus frequency diagram for an application range of sampling methods for PJVS and JAWS. The dashed line shows extension enabled by JAWS circuits with 4 V rms amplitude. The dash-dotted line represents rms amplitude limit of 10 V PJVS circuits.

With the forthcoming redefinition of the SI, both PJVS and JAWS systems will become key components for the direct realization of the unit volt. This has implications not only for DC voltage metrology but could also have a huge impact for the future dissemination of AC voltages. For more than three decades, DC voltage metrology has relied on quantum-accurate sources (CJVS and PJVS) to represent the unit volt ($K_{J-90}$) and to calibrate secondary voltage standards (Zener voltage references). Currently, AC voltage metrology is uniquely based on rms detectors (TVCs or TTSs) that typically involve long calibration durations to fingerprint each artifacts behavior as a function of both voltage and frequency. In principle, a switch from detector-based to source-based references can be applied to AC voltage metrology as well. Sampling or differential sampling methods are applicable to both PJVS waveforms and JAWS waveforms, overlapping most of the frequency and voltage domain currently covered by TVCs and TTSs (FIG. 22). The accuracy of JAWS and PJVS reference waveforms can be transferred to low-noise and stable AC sources capable of driving low-impedance loads. Such AC sources would fulfill the role of secondary AC voltage standards in the same way Zener standards are used to disseminate DC voltages. To significantly impact dissemination of AC voltage, the amplitude stability of the AC source can be of the order of 1 part in $10^7$, a value comparable to the performance of the best TVCs. Unfortunately, todays commercially available calibrators, with a short-term stability around 1 part in $10^6$, are not sufficient to perform this role. Additional involvements on the AC source include low harmonic distortion and the ability to synchronize to an external time base to enable sampling methods. From an instrument design point of view, achieving sub μV/V stability and excellent spectral purity are not easily engineered. To reach these higher performance levels, the thermal stability of the electronic components inside the instrument plays a significant role, as does the DAC architecture.

When an AC source is used in direct combination with JVS standards, its absolute accuracy is not important. In this case, the key consideration is the sources short-term stability, so that the AC voltage can be accurately transferred from the JVS to the DUT (see FIG. 20B and FIG. 20D). However, if the internal voltage reference of the AC source can be monitored and the AC transfer function calibrated at regular intervals with a JVS and a sampling method, such an AC source becomes a true standalone secondary AC voltage standard. The accuracy of the AC amplitude is inferred from the measured DC reference and the calibration factors based on the amplitude, frequency and phase of the waveform generated.

The successful dissemination and excellent performance of existing detector-based AC voltage metrology has not provided incentive for precision instrument manufacturers to develop AC sources with better accuracy and stability. Hopefully, the potential for improved AC metrology with readily-available, SI-realizable AC quantum standards will promote a paradigm shift in AC metrology and spur innovation in the instrument market, in term of both sources and samplers. This paradigm shift would take full advantage of the order of magnitude improvement in the stability and accuracy provided by the JVS standards.

An alternative approach to a new AC source is to develop methods for JAWS systems to directly drive low-impedance loads without compromising waveform accuracy. This approach would certainly not revolutionize the existing detector-based AC metrology but would offer a faster and intrinsic method to calibrate the ac–dc difference of TVCs. Because of the systematic errors due to transients, this approach cannot be successfully applied to PJVS waveforms (see section 3.2.1).

The redefinition of the SI also incentivizes reconsideration of the way traceability is implemented. The dissemination of the unit volt within a nation is often traceable to a unique Josephson (gold) standard. This legal approach is inconsistent with the universality of the Josephson effect and its ability to realize the volt anywhere.

Figure 23:
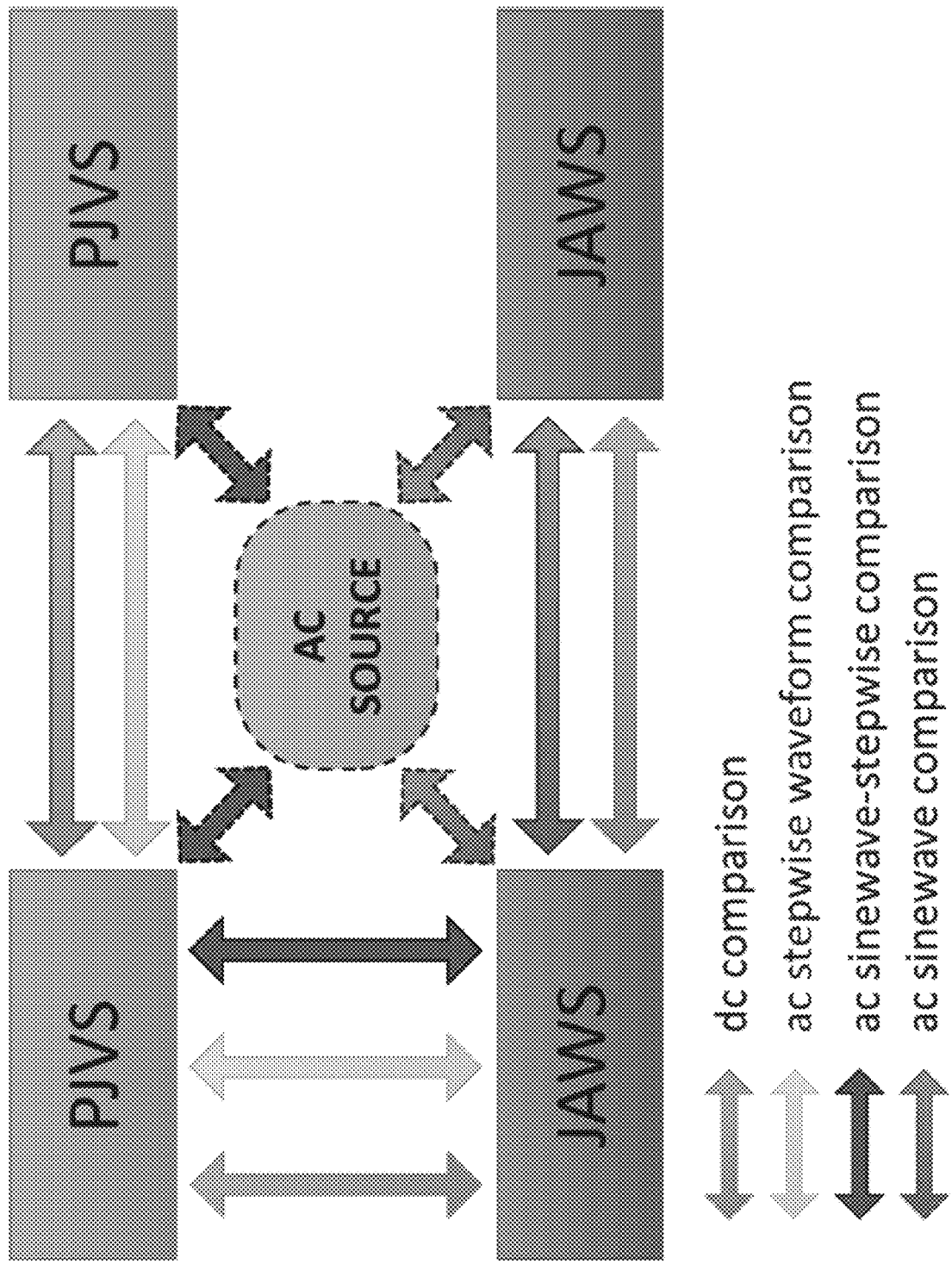
FIG. 23 shows direct and indirect comparison between two PJVS, two JAWS, or a JAWS and a PJVS voltage standards. Diagonal arrows with dashed outlines show indirect comparison links with an AC source as a transfer standard.

Even after the 2019 SI redefinition, when JVS systems will provide a direct realization of the SI unit volt and not merely a representation, this remains valid by replacing representation with realization. Determining the level of confidence in comparisons of JVS systems will become more relevant in presence of many disseminated nominally equivalent Josephson systems that are intrinsic standards. To verify the equivalence of two PJVS, two JAWS, or a JAWS and a PJVS, new comparison protocols can be implemented for both DC and AC voltages. As the schematic in FIG. 23 shows, some comparison possibilities use an AC source as the transfer standard (indirect comparison). The different types of comparison measurements can be grouped into categories such as: dc to DC comparison, ac stepwise to AC stepwise comparison, ac sinewave to AC stepwise comparison (direct and indirect), and ac sinewave to AC sinewave comparison (direct and indirect).

Presently, key comparisons of JVS systems for DC voltages follow an established BIPM protocol designed to be implemented with the BIPM (CJVS) traveling standard. Multiple direct comparisons between PJVS and CJVS systems, and between two PJVS systems have been performed at NMIs and calibration laboratories. But, the comparison of DC voltages can also include JAWS systems. The different microwave bias used by JAWS and PJVS systems means that performing a DC JAWS-to-PJVS comparison would provide an intrinsic verification of JAWS voltage accuracy without the influence of inductive errors that arise with AC waveforms. Such DC comparisons can also provide important information about the magnitude of the DC leakage current error within the measurement circuit and are an easy way to demonstrate the fundamental equivalence of JAWS and PJVS systems.

Direct comparisons between two stepwise approximated PJVS waveforms provide useful information regarding the accuracy of voltage steps and verify that the proper method to remove transients has been applied. If the two PJVS arrays to be compared have different designs or are biased at different microwave frequencies, then the residual voltage $\delta V_i$ for each step of the waveform will be in the range $-V_{LSB}/2 < \delta V_i < V_{LSB}/2$, with $V_{LSB}$ being the largest LSB voltage of the two PJVS arrays. Therefore, reaching a perfect cancellation between two waveforms is not guaranteed. A 10 nV V$^{-1}$ relative agreement between two stepwise waveforms was measured for frequencies <60 Hz. The accuracy of the comparison is ultimately limited by the stability, noise, non-linearity and gain error of the digitizer used to measure the differential voltage. Because JAWS systems can generate stepwise-approximated waveforms, this comparison method can also be applied to JAWS-PJVS comparisons. Even if this method does not exploit the lack of inherently non-quantized transients in JAWS, this type of comparison may provide a useful tool to test the measurement setup and the digitizer.

The measured agreement between two stepwise approximated waveforms remains an abstract concept. It is misleading to quote the result of this comparison measurement as a specification for a PJVS system, because the measurement is not applicable to any AC voltage metrology application. For example, the measurement does not account for any of the errors associated with rms values of an AC source, as discussed in previous sections.

Comparing JAWS sinewaves to PJVS stepwise-approximated waveforms is probably the most interesting and challenging method to verify the equivalence of these systems. The first direct JAWS-to-PJVS comparison was performed at 100 mV and 500 Hz with a sampling and multiplexing method and reported a relative agreement of $(-0.18 \pm 0.26)$ μV V$^{-1}$. A lower relative uncertainty of $(+3.5 \pm 11.7)$ nV V$^{-1}$ was achieved at 1 V and 250 Hz with a differential sampling method. This type of comparison is an ideal tool to test the limits of the differential sampling method and to quantify the magnitude of potential systematic errors associated with the JAWS or the PNS. Unfortunately, the overlap between the two types of NS systems (see FIG. 22) is limited by the JAWS output voltage (presently ≤2 V rms) and the range of the PJVS stepwise waveform frequency (≤1 kHz).

Direct comparison of two sinewaves can be achieved by connecting two JAWS arrays in series and applying a relative phase shift of 180° between the two waveforms. This type of comparison involves synchronization and fine adjustment of the relative phase between the two waveforms to null the differential voltage. Fine phase adjustment is achieved by rotating the pulse pattern of one waveform by one or multiple clock cycles of the pulse generator. The residual voltage can be either measured with a lock-in amplifier at the frequency of the sinewaves or with a digitizer. Like the AC sinewave to AC stepwise comparison, JAWS-to-JAWS comparisons provide the high resolution needed to perform QLR characterization of bias parameters. As an example, such QLR measurements would be useful to characterize systematic errors that scale with the frequency of JAWS sinewave and errors that are due to the AC leakage current.

Another way to link two JVS systems is through indirect comparison measurements. Such comparisons involve using an AC source with a good short-term amplitude stability as a transfer standard. The indirect comparisons that can be applied to JAWS and PJVS systems are represented by the four diagonal arrows in FIG. 23. At least two measurements performed in quick succession are involved to establish equivalence between two JVS systems. The main advantage of this method is its ability to verify that proper measurement and analysis methods have been applied to transfer the accuracy of the JVS to the AC source. The measured uncertainty will not be as small as with a direct JVS comparison, because the transferring AC source is not an intrinsic standard. However, if the amplitude of the AC source can be predicted with a long-term uncertainty of 1 µV $V^{-1}$ or less, then it can be implemented as a traveling standard and can be used in round-robin interlaboratory comparisons (ILC). Establishing verification of AC voltage measurement capability through a transfer-standard ILC would simplify logistics compared to performing on-site JVS comparisons. DC voltage ILCs with a Zener traveling reference are periodically conducted in North America.

The redefinition of the SI impacts voltage metrology beyond simple change in terminology from representation to realization and a shift in the numerical values of the fundamental constants e and h. After redefinition, traceability will be replaced with verification because every JVS system will realize the unit volt and not just a handful of gold standard JVS systems at NMIs. The role of the NMIs will shift from providing a traceable JVS reference to verifying that the disseminated JVS systems are functioning correctly. An impact of the SI redefinition may be on AC voltage metrology. JAWS and PJVS waveforms, with a direct link to the SI, provide a strong motivation to switch from detector-based to source-based AC voltage metrology. The success of this paradigm shift depends on development of new commercial AC sources that can perform as secondary references. Additional research on direct comparison of JAWS and PJVS waveforms is needed to characterize all potential sources of error, followed by establishing the measurement protocol for AC voltage comparisons.

Example 2

Automated Direct Comparison pf Two Cryocooled 10 Volt Programmable Josephson Voltage Standards We have performed direct DC comparisons between two cryocooled 10 V programmable Josephson voltage standards. Utilizing an automated synchronization scheme for the voltage reversals enables use of a high-sensitivity analog null detector on its 10 µV range. No switches or manual operations are necessary to protect the null detector from overload signals. The agreement measured between the two voltage standards at 10 V is 9 parts in $10^{12}$ with a relative combined uncertainty of 29 pV V (k=2 coverage factor). Since both systems can be operated floating from ground, various grounding configurations of the measurement circuit were investigated to evaluate possible leakage current paths to ground. Comparing the two systems under various grounding conditions enables minimization of leakage-current errors, optimization of system performance by revealing leakage-limiting components, and verification of key elements in the uncertainty budget for the measurement method.

National Institute of Standards and Technology (NIST) has implemented a programmable Josephson voltage standard (PJVS) with an output voltage of 10 V on a cryocooler. Turnkey cryocooled PJVS systems have begun to replace conventional Josephson voltage standards (CJVS) not only in national metrology institutes (NMIs) but also in primary calibration laboratories (PCLs). Combining intrinsic stability and greater immunity to external noise, PJVS systems are suitable for a wide range of applications beyond the calibration of secondary voltage standards, including accurate voltage references in electronic kilogram experiments (Kibble balances and Joule balances) and low-frequency, stepwise-approximated waveforms for electric power standards. With the redefinition of the Système International dUnités, PJVS systems will become a direct realization of the unit volt. Consequently, direct PNS-to-PJVS comparisons are becoming prevalent, not only to support NMI calibration and measurement capabilities for key comparisons within the Consultative Committee for Electricity and Magnetism of the Bureau International des Poids et Mesures, but also to qualify the performance of PJVS systems disseminated to PCLs. In direct voltage standard comparisons, the lowest Type-A uncertainty is generally achieved with the use of an analog null detector. However, this typically demands fastidious manual operation to prevent overloading during PJVS polarity reversals, which are involved to eliminate the contributions of thermal electromotive forces. In our experience with an analog nanovoltmeter, the input stage typically takes several minutes to completely recover from an overload event.

Results of the first fully-automated direct comparison of two cryocooled 10 V PJVS systems are provided in this example. We developed a synchronization method to simultaneously switch the polarity of both Josephson arrays without overloading the input stage of the analog null detector. The main advantage of this method is its ability to automatically acquire large data sets, thus improving the statistical uncertainty of the comparison and eliminating the risk of incorrect manual operation that causes accidental overloads. To ensure the quantum locking range of the quantized voltages, comparison measurements were performed with a dithering of the bias current applied to all subarrays of the two PJVS systems. Results when grounding one node of the measurement circuit versus leaving both arrays floating are presented and analyzed. Various grounding configurations of the measurement circuit were investigated and found to influence the leakage current path. Finally, since the leakage current is often the largest source of voltage error in direct PJVS comparisons, we present best practices for grounding Josephson arrays to minimize leakage-current errors.

Two nominally identical, cryocooled PJVS systems were used for this direct comparison. The systems were identified as PJVS(1) and PJVS(2). Each PJVS was equipped with the same instrumentation for biasing and cooling the Josephson junction (JJ) arrays including DC current sources, microwave sources, temperature controllers, cryostats, and Gifford-McMahon cryocoolers. Details about the 24-channel DC current bias sources can be found in. The cooling power available with each system at 4 K was approximately 200 mW. Unlike PJVS systems cooled with liquid helium that involve manual cool-down and warm-up of the arrays and manual connection and disconnection of the bias leads, the cryocooled PJVS is a true turnkey system that includes self-checks of the bias current operating margins for all 23 subarrays, self-diagnostics, and automated optimization of the microwave bias and operating temperature. Each PJVS array contains more than a quarter million Nb/NbxSi$_1$ x/Ni JJs. The device packaging for the 10 V arrays was designed to provide back-side cooling when mounted on the cryocooler but is also compatible with the 2.57 cm diameter clearance of our standard liquid helium dip-probe shield can. The device packaging is fitted with a 30-pin cryogenic-compatible connector to provide the bias current to the selected 23 subarrays. This feature enables testing of the device in liquid helium before mounting the package on the cold head of a cryocooler.

The DC bias current distribution within the array, the coldhead temperature T, and the selected microwave bias frequency $f_{CW}$ and bias power differ for each system and array, because the system automatically optimizes all bias parameters and operating temperature for each chip operated in the PJVS system. The following conditions can also be noted:

The PJVS(1) array, operated at T=4.25 K and $f_{CW}$=20 GHz, has a quantum locking range (formerly called the flat spot) of 0.94 mA when all subarrays except #12 are biased in series and with opposite sign to obtain zero net DC output voltage.

The PJVS(2) array, operated at T=4.1 K and $f_{CW}$=18.38 GHz, has a quantum locking range of 1.45 mA when all subarrays are biased in series and with opposite sign to obtain zero net DC output voltage. See FIG. 24 for configuration of a 10 V junction and bias configuration for the two PJVS arrays. The number of Josephson junctions (JJs) are distributed as shown for the two PJVS circuits operating at the microwave bias frequencies $f_{CW}$ indicated. The two circuits produce 10 V using the different bias current polarities indicated in the Bias columns. Note that although there are different voltages at the various subarray nodes, both circuits have 0 V potential at the low side of their circuits. Least significant bit (LSB) subarrays are shown in italics.

Each PJVS uses a different total number of junctions, bias frequency, and DC bias configuration to produce comparable output voltages. The microwave frequency of each PJVS is precisely tuned to the same 10 V output voltage to within 0.1 nV by adjusting the microwave frequency of each system using the 12 digits of resolution provided by the microwave synthesizer. The frequencies were set to $f_{CW}^{PJVS(1)}$=19.999 913 151 365 GHz and $f_{CW}^{PJVS(2)}$=18.379 925 659 035 GHz. The current bias polarities distributed to the subarrays of PJVS(1) and PJVS(2) are shown in columns three and six of FIG. 24, respectively.

Prior to performing comparison measurements, the leakage currents of both systems were individually evaluated. The leakage currents to ground (LCG) reported in FIG. 25 were obtained by measuring the voltage drop across a 2 kΩ resistor connected between the PJVS array and ground while the PJVS array produced a voltage of 10 V. The LCG values differed significantly depending on whether the resistor was connected to the low or high side of the PJVS arrays (DAC 0 or 23, respectively). However, the LCG values measured for both PJVS systems were similar. The determination of LCG is highly sensitive to external perturbations (e.g. electrostatic fields, microphonic noise); the relative accuracy of the value reported is of the order of 5%. The last column of FIG. 25 reports the equivalent leakage resistance RL calculated from the leakage current measurements at 10 V.

Figure 26:
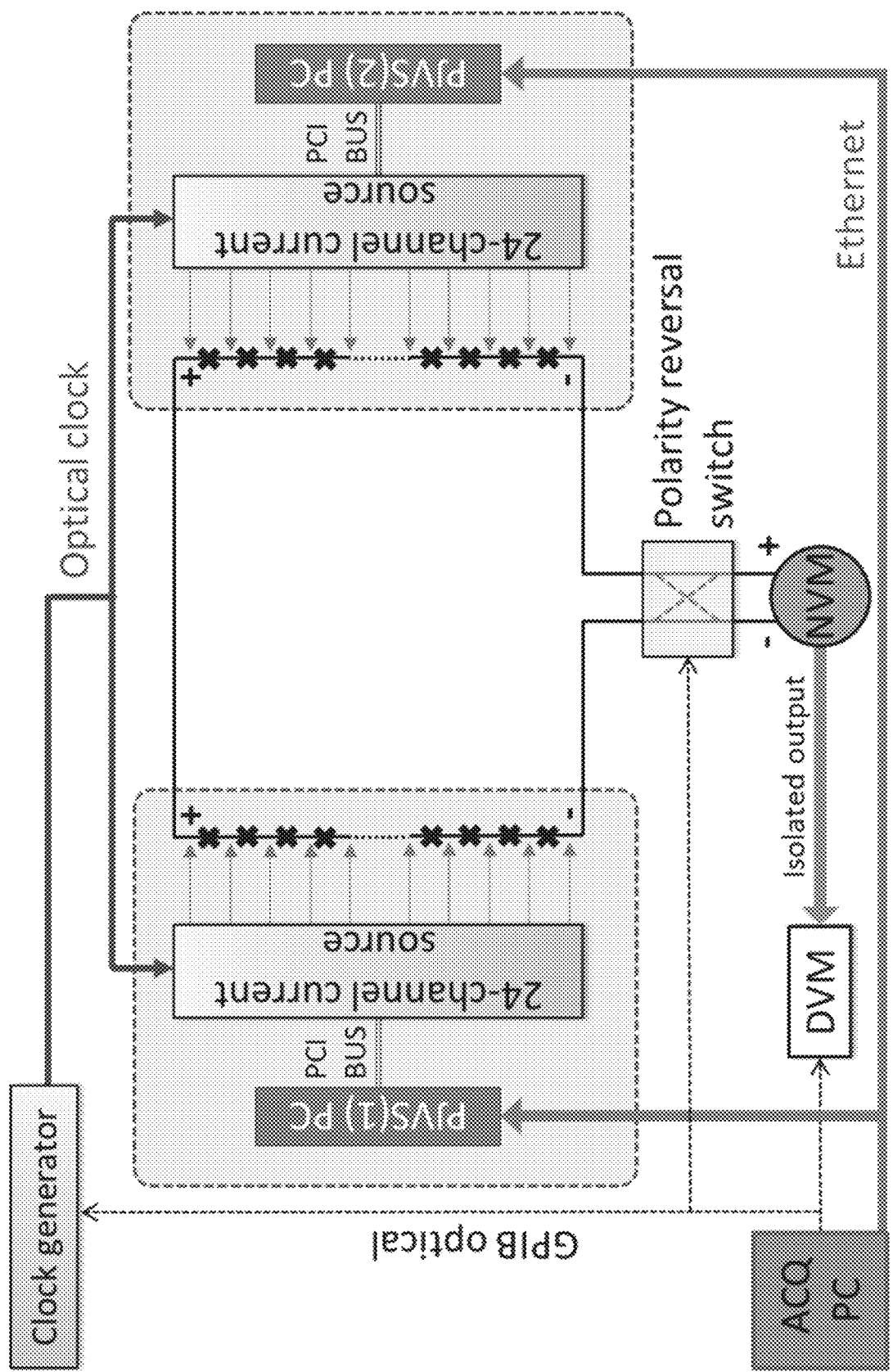
FIG. 26 shows an automated comparison measurement between two PJVS systems using an analog nanovoltmeter.

FIG. 26 shows a schematic of the comparison measurement setup. A battery-operated analog nanovoltmeter (NVM), EM N11, was used as a null detector to measure the voltage difference between the two cryocooled voltage standards, PJVS(1) and PJVS(2). Analog NVMs can provide a factor of two improvement in measurement noise over that of the best digital null detectors. Analog null detectors are routinely used by BIPM in option A of the protocol of BIPM.EM-K10 key comparison framework. Another type of NVM has also been developed for such application but was not evaluated in this study. If the input stage of the NVM is overloaded, then the recovery time is related to the magnitude of the overload voltage and duration. To avoid overloads, all previously reported NVM voltage standard comparisons were performed manually, and a protection circuit was involved at the input to the NVM that was engaged at each PJVS polarity reversal.

Figure 28:
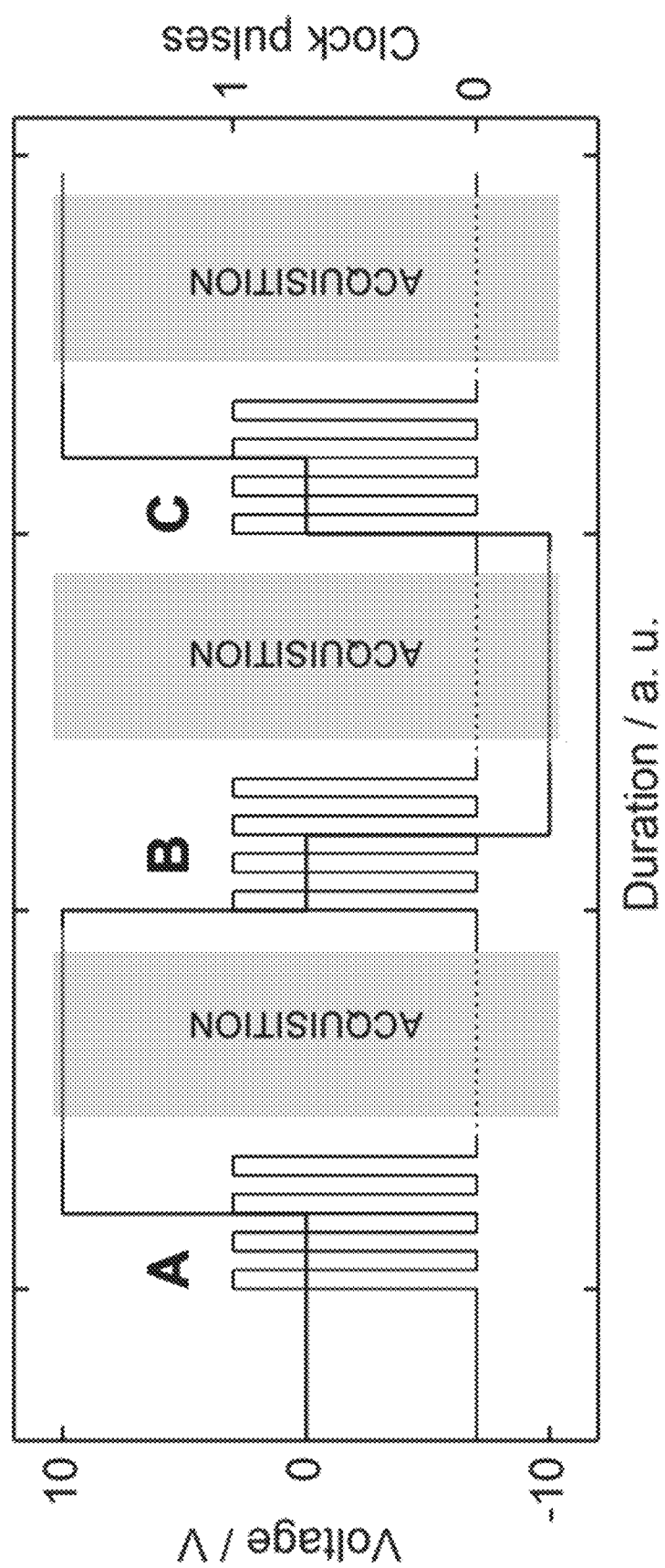
FIG. 28 shows a waveform for synchronous switching between voltages (A: start 0 V to +10 V, B: from +10 V to −10 V, and C: from −10 V to +10 V). The four clock pulses are shown. The data acquisition occurs once both PJVS output voltages are fully settled.

Overloads were prevented with an approach that simultaneously reverses the polarity of both PJVS arrays such that the magnitude of the voltage at the NVM input remains within the selected 10 μV range. Our NVM measurements are fully automated without any manual intervention, allowing acquisition of large data sets and removal of potential errors in manual operation. Each synchronous change of voltage uses a four-step waveform (FIG. 27) triggered by four successive clock pulses at 5 kHz, as shown in FIG. 28. A two-step waveform would be adequate, but since the 24-channel current source implemented with our PJVS involves at least four steps in memory to run a waveform, the waveform is repeated (i.e. step #1=step #2 and step #3=step #1). The waveform is loaded into the memory of both current sources and programmed to run for a single cycle. Once the first cycle is completed, the PJVS voltage remains at the last voltage of the waveform. The microwave frequency of both PJVS circuits is adjusted prior to the start of the waveform (i.e. when the arrays are at 0 V).

This waveform synchronization method can be modified to generate a more gradual voltage ramp. However, since the two arrays (FIG. 24) have different values for $f_{CW}$, in this case one cannot guarantee that the differential voltage at every incremental step of the ramp will remain within the range of the NVM. Such a ramp may also be difficult to implement when comparing two PJVS systems having a different type of JJ array. The waveform shown in FIG. 28 has only two voltages and can be generalized for comparison measurements on different types of PJVS arrays.

We tested the overload recovery of our NVM by deliberately delaying the clock pulse sent to PJVS(2) relative to the one sent to PTVS(1). Even with use of current sources for the two PJVS systems with different settling durations, there were no noticeable systematic errors in our voltage measurements provided that the beginning of each transition was synchronized, and the overload duration was less than 50 μs. With use of two identical bias current sources for PJVS(1) and PJVS(2), the timing of the onset of the voltage output transition was matched within 5 ns.

The isolated output of the NVM was connected to a digital voltmeter (DVM) for readout. The NVMs external power supply connector was modified by BIPM to receive an external nickel-cadmium battery pack to extend duration of the NVM operation, allowing continuous measurement for periods up to 48 h. The chassis of the NVM was connected to the shield of the twisted-pair cables from the two PJVS systems and left floating from ground potential. We used a BIPM low-thermal-electromotive-force-automated switch to change the polarity of the NVM from N (normal) (i.e. PJVS(1)–PJVS(2)) to R (reverse) polarity (i.e. PJVS(2)–PJVS(1)). The automated switch was activated by a stepper motor and controlled through the GPIB bus.

The acquisition computer (ACQ PC) controlled the amplitude of both PJVS systems through an ethernet connection. The two 24-channel current sources for each PJVS were isolated from ground, and the two microwave generators (not shown) were locked to the same 10 MHz frequency reference (derived from the NIST atomic clock). An arbitrary waveform generator provided two optical clock signals for synchronization, one for each PJVS current-bias source. The two PJVS systems have comparable cable lengths (optical fiber for the clock input, current bias leads, and voltage output leads).

Values reported for the voltage difference between the two systems $\Delta V = PJVS(1) - PJVS(2)$ were calculated from a linear fit to the four polarity reversal sets +−+− in order to remove the contributions of the thermal electromotive force (emf). A polarity set consists of 15 DVM readings at 10 power line cycles each, No overloads occurred during the polarity reversals with the NVM set to the 10 μV range and the filter set to position 1 (maximum bandwidth), which confirms that the synchronization method was successful. The acquisition of each set started 40 s after the start of the previous data set. The programmed 40 s repetition rate included (a) the programming and execution of the polarity reversal of both arrays (duration of ~3 s), (b) the waiting duration for settling dielectric absorption transients (duration of at least 30 s), and (c) the measurement duration (~3 s). If the measurement sequence included an NVM polarity reversal, the array polarity reversal duration was ~7 s and consisted of (a) setting both arrays synchronously to 0 V, (b) mechanically reversing the polarity of the NVM, and (c) setting both arrays synchronously to the new polarity voltage. We performed measurements that varied the repetition rate duration from 20 s to 60 s and did not observe any systematic effect on the measured voltage.

The comparison measurements were implemented with the dither current technique to verify that both PJVS systems maintained a sufficient quantum locking range when connected in series to the NVM throughout the measurement duration. The value selected for the applied dither current was di=±0.2 mA, corresponding to 43% of the smallest quantum locking range measured on the PJVS(1) system. The dither current sequence used with the comparison measurement is given in FIG. 29.

The comparison measurements at 10 V were performed with automated switching of the NVM polarity after acquisition of each ΔV data set. In the N polarity, the low side of the NVM is connected to the low side of the PJVS(1) array (FIG. 26). In this configuration, the NVM measures $\Delta V = PJVS(1) - PJVS(2)$. With the reverse polarity R, the NVM measures $-\Delta V = PJVS(2) - PJVS(1)$.

Figure 30:
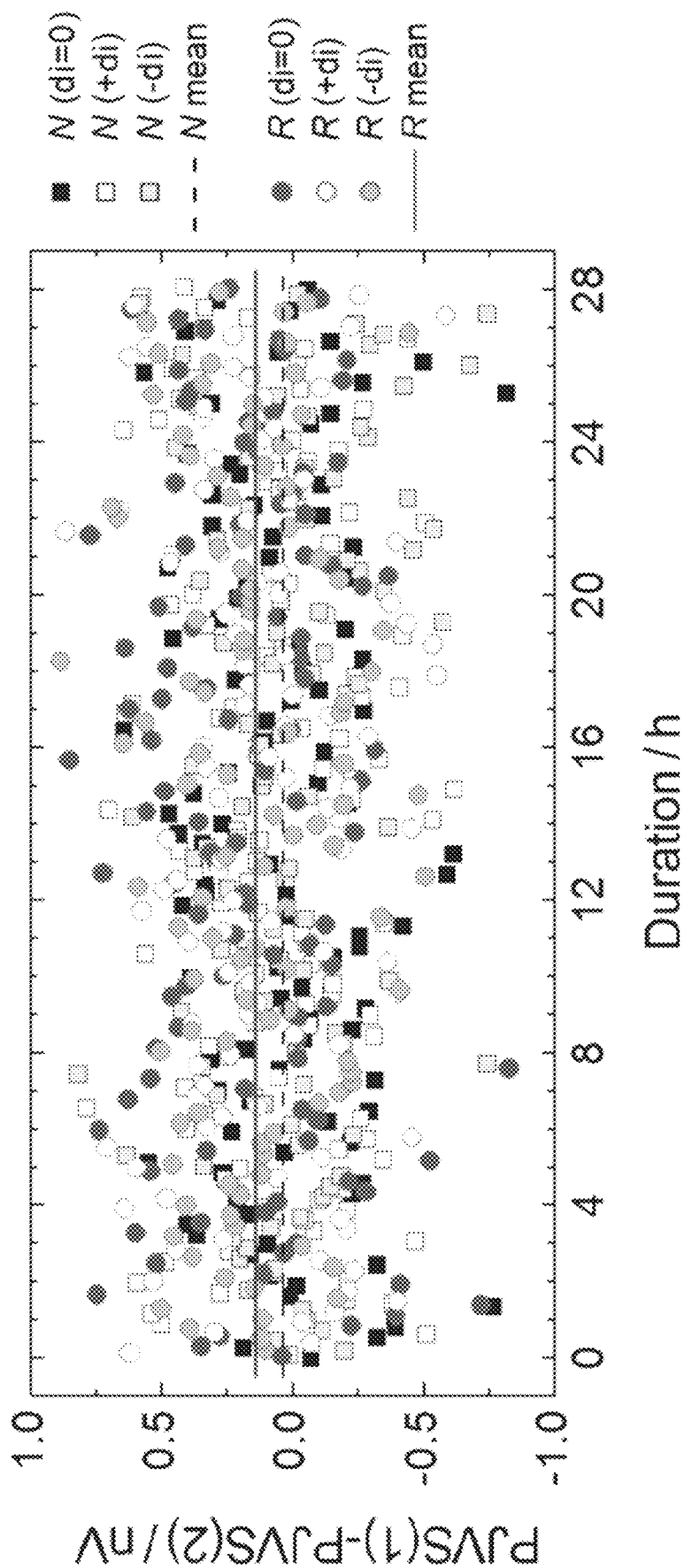
FIG. 30 shows voltage differences ΔV measured at 10 V alternately for the two input polarities of the NVM (N=normal, R=reverse). The dither current di=0.2 mA does not affect the measurement, confirming proper quantization of the voltages provided by both systems over the 28 h of the measurement sequence.

FIG. 30 shows the results for 315 measurements of $\Delta V = PJVS(1) - PJVS(2)$ recorded for each polarity of the NVM. The uninterrupted measurement sequence involved 629 NVM polarity reversals and 2518 voltage polarity reversals of both PJVS arrays. The two PJVS systems and the NVM were all floating from earth ground potential. The mean measured value for the NVM at normal polarity (N mean) is ΔV=0.04 nV, while the mean value for the NVM with reverse polarity (R mean) is ΔV=0.14 nV. No outliers appeared during the period of comparison (28 h), and all individually measured ΔV values were within ±1 nV with a standard deviation of 0.3 nV (k=1)—an extremely low-noise result. No deviations in ΔV were correlated with the three-applied dither current values (di=0 mA, +0.2 mA and −0.2 mA), verifying that both PJVS systems were quantized within ΔV during the measurement period. Nevertheless, the small difference in ΔV between N and R polarities is discussed below.

Figure 31:
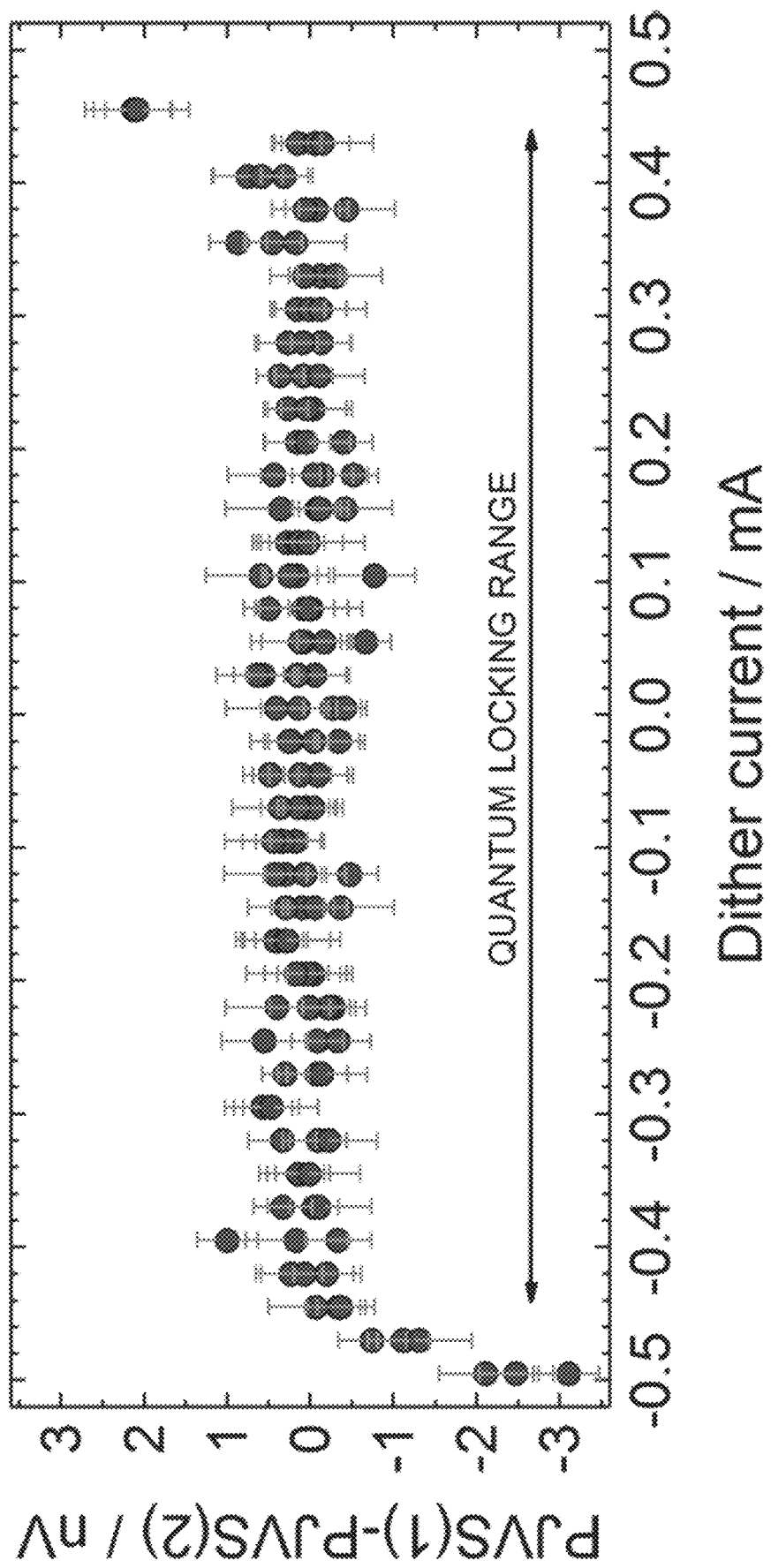
FIG. 31 shows results for automated comparison measurement at 10 V as a function of dither current applied to both PJVS arrays (N polarity only with NVM polarity reversal switch removed). The step width (0.9 mA) is comparable to the smallest quantum locking range measured independently for the two PJVS systems.

FIG. 31 presents the dither-current quantum locking range measured with both PJVS systems at 10 V. The dither current is sent to both PJVS systems with the opposite sign, as described in FIG. 29. The data reported were measured with the NVM at N polarity. The measurement for each dither current setting was repeated four times to test its reproducibility. The voltage of the arrays at 10 V, when measured with a resolution better than 1 nV over a current range of 0.9 mA, is consistent with the smallest current range of the two systems measured independently, PJVS(l) with a current bias range of 0.94 mA. This result confirms that the quantum locking range is not reduced when both systems are connected in series-opposition with the NVM.

Figure 32:
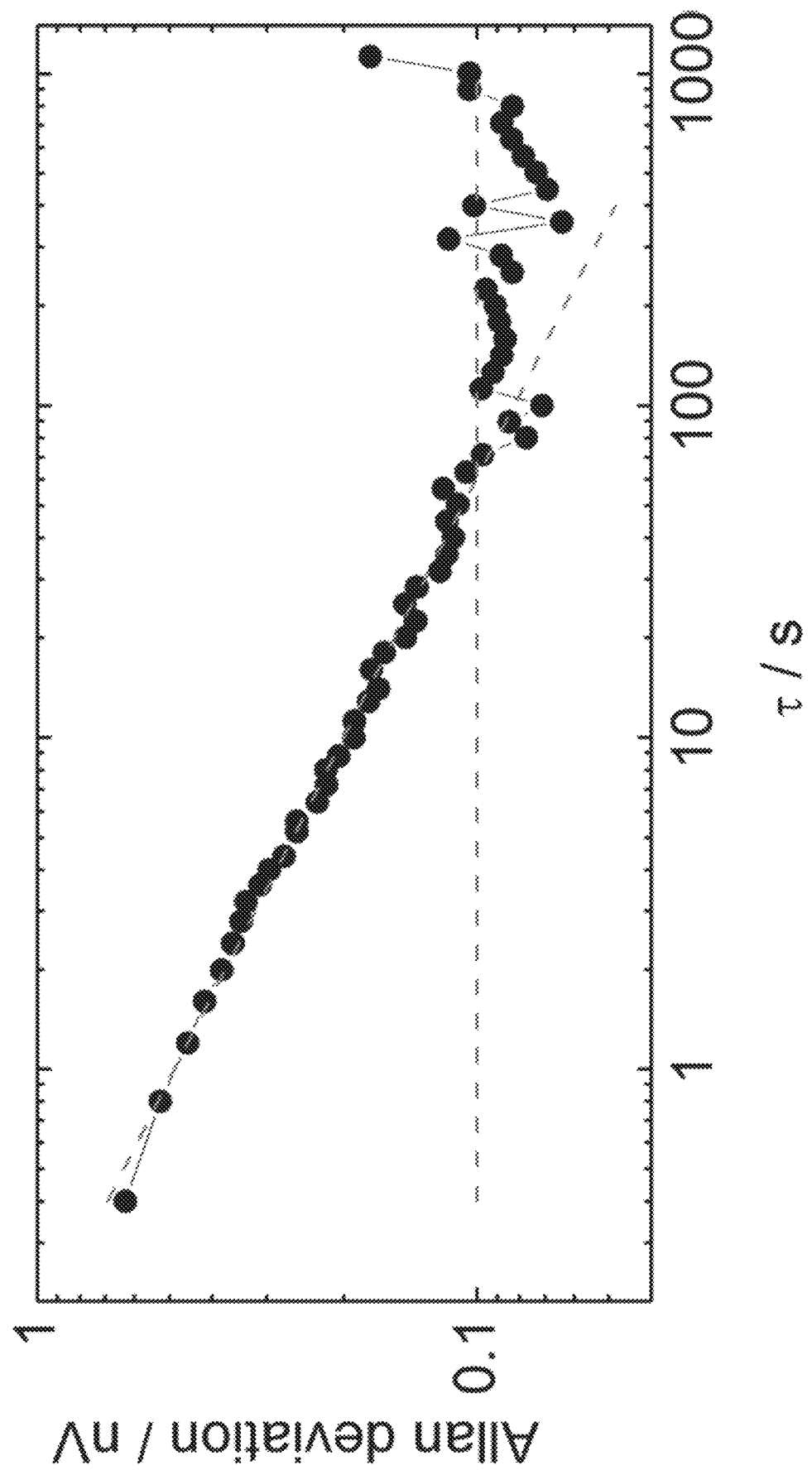
FIG. 32 shows Allan deviation extracted from 8192 readings with a short on the NVM input (NVM range: 10 μV, DVM range: 1 V range with 10 PLC). The 1/f noise floor (0.1 nV) is reached after 1 min.

For multi-hour-long datasets, the Type-A uncertainty extracted from the standard deviation of the mean is often largely underestimated. To evaluate the 1/f noise floor of the NVM, we performed an Allan deviation on a dataset of 8192 readings acquired with the NVM input shorted (FIG. 32). The same settings used with the PJVS comparison measurements were applied to the NVM and DVM. The 1/f noise floor of the NVM was reached after 60 s with a value of 0.1 nV. As previously reported, additional noise inherent in the comparison measurement circuit may also increase slightly the Type-A uncertainty. We attempted to extract the Allan variance from the datasets shown in FIG. 30. Since the measurement time stamps were not uniformly spaced in time (variation between two datasets up to 45 ms peak to peak), we applied a method for unequally spaced time data. Unfortunately, the 1/f noise floor could not be readily extracted from the Allan variance computed in this condition.

Figure 33:
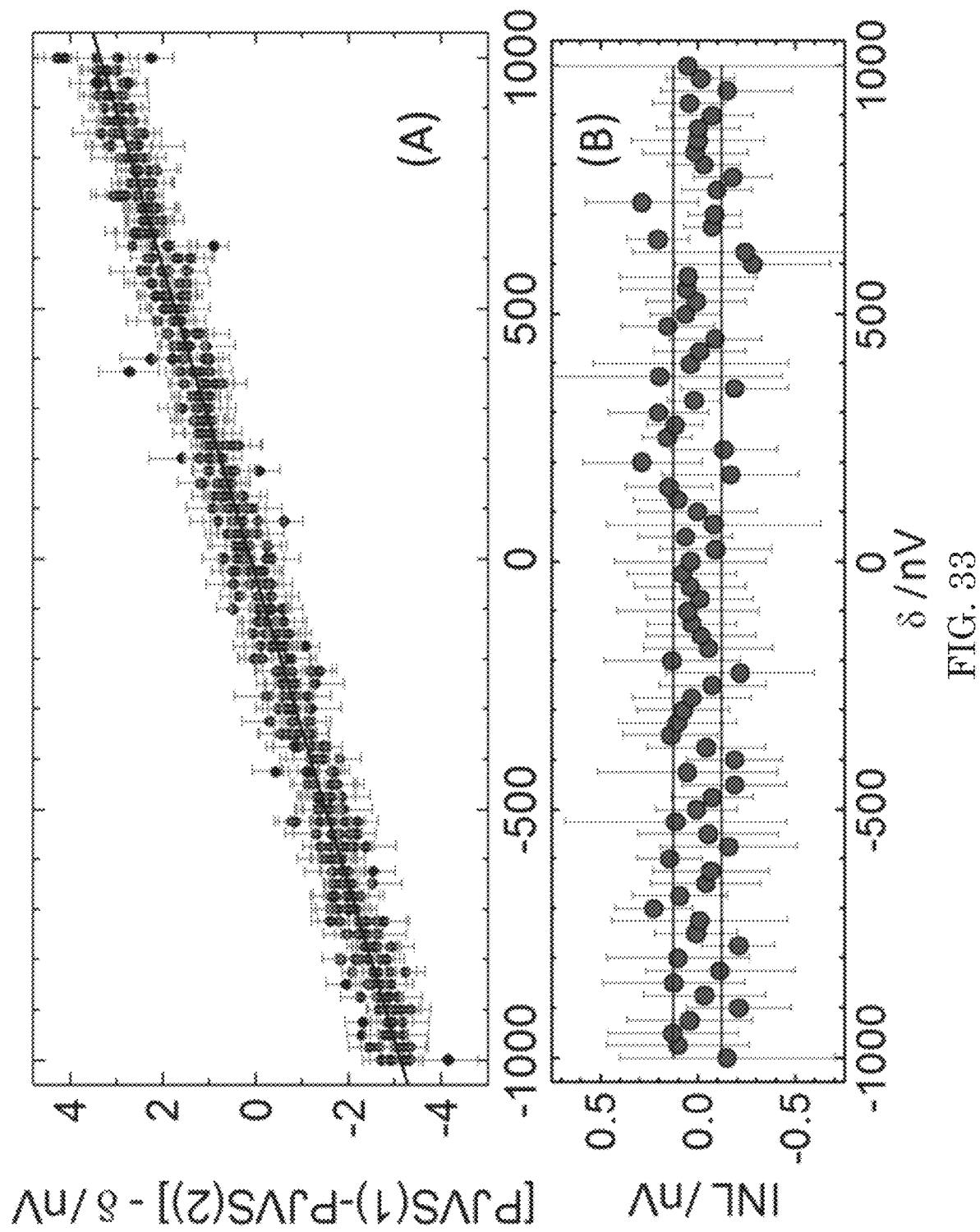
FIG. 33 shows a gain calibration and nonlinearity (INL) of the NVM. (A) Deviation of the measured difference PJVS(1)−PJVS(2) from the calculated voltage difference δ. The output voltage of PJVS(1) is adjusted to 10 V +δ by slightly detuning the microwave frequency, while the output voltage of PJVS(2) is kept at 10 V. Measurements were repeated six times for each δ. The gain error (slope) of the NVM is $3\times10^{-3}$ V V$^{-1}$. (B) Deviation from the fit (INL) in (A). The value and error reported for the INL are the mean value and standard deviation of the six readings displayed in (A), respectively. The two horizontal lines indicate the k=1 interval of confidence (standard deviation) calculated from all the INL data measured (±0.12 nV)

When two PJVS systems are compared, the NVM reading always remains very close to 0 V. This stand in contrast to most comparison measurements between CJVS and PJVS systems, where the voltage measured by the NVM could be several multiples of 150 μV depending on the stability of the CJVS. The mean offset value (thermal emf) measured by the NVM for the data in FIG. 30 is 156 nV and −145 nV for the N and R polarity, respectively. Even in the presence of this sub-microvolt voltage offset, the gain error and nonlinearity characteristics of the NVM and DVM in tandem (i.e. the DVM connected to the amplified isolated output of the NVM) can be evaluated. Since the PJVS voltage is quantized in 230 μV increments, a single PJVS system cannot by itself calibrate the gain of the 10 μV range of the NVM. A few measurements reported in the literature have accomplished this low-range calibration with PJVS systems. However, with the two-PJVS-system setup described in FIG. 26, the gain and nonlinearity of the NVM are easily calibrated by keeping both PJVS systems nominally at 10 V and then slightly detuning the microwave frequency of one PJVS. FIG. 33 shows the measured gain and nonlinearity of the NVM over a range of ±1 μV measured in the N polarity state. The quantity δ is the calculated PJVS voltage difference, which is directly proportional to the varied microwave frequency of PJVS(1). The gain error of the NVM determined from FIG. 33A is 3.2 nV at δ=1 µV. As seen in FIG. 33B, the linearity of the NVM is flat within ±0.12 nV over the range δ=±1 µV and is comparable to the noise floor calculated from the Allan variance (FIG. 32). This measurement confirms that the Type-A uncertainty is dominated by the noise floor of the NVM.

Comparing two cryocooled PJVS systems has the advantage that the thermal emf is very stable over the duration of the comparison. In contrast, liquid-helium-cooled PJVS systems are inherently affected by pressure and temperature fluctuations due to helium gas escaping from the Dewar and near the measurement leads. These variations are nonexistent with cryocooled systems. If a supercritical helium buffer is implemented between the cold head and the cryo-package, the PJVS device is isolated (i.e., thermally buffered) from temperature fluctuations induced by the mechanical cooling stage. There was no correlation between the voltage measured by the NVM and the 1.2 Hz repetition rate of the cryocooler during the PJVS comparisons.

To generate a voltage, the multiple channels of the PJVS bias electronics are physically connected to the various nodes of the PJVS array. Each node of the array and the electronics has its own isolation resistance to earth ground potential and contributes to a small fraction of the total leakage current to ground. Due to the multiple connections, the resistance to ground of each node cannot be easily evaluated. For comparison, a CJVS can be operated for short periods of time with its bias circuit disconnected. In this state, the only leakage current paths are those within the cryoprobe (i.e. bias leads and low-pass filter). Low-pass filters are not involved with the PJVS systems used in this work, since such voltage standards are intrinsically stable and have current margins (>0.94 mA) typically ten times larger than that of CJVS systems. Leakage from filters is generally the main contributor to the CJVS leakage current.

Comparisons of Josephson voltage standards are usually performed with one point of the circuit connected to ground potential. The grounding point is generally fixed by the equipment since, by design, some bias electronics can be reliably operated only with the low side of the Josephson array connected to ground. With the two fully floating PJVS systems used in this work, the grounding point can be arbitrarily chosen. By grounding the circuit at different nodes, the distribution of the leakage current paths can be modified and, thus, the contributions to voltage errors. To evaluate these effects, we measured the voltage difference $\Delta V = PJVS(1) - PJVS(2)$ with the N polarity of the detector for four PJVS voltages (10 V, 6 V, 3 V, and 0 V) and four grounding configurations: ground potential connected to the low side of the PJVS(1) Josephson array; ground potential connected to the low side of the NVM input; ground potential connected to the high side of the NVM input; and ground potential connected to the low side of the PJVS(2) Josephson array.

Figure 34:
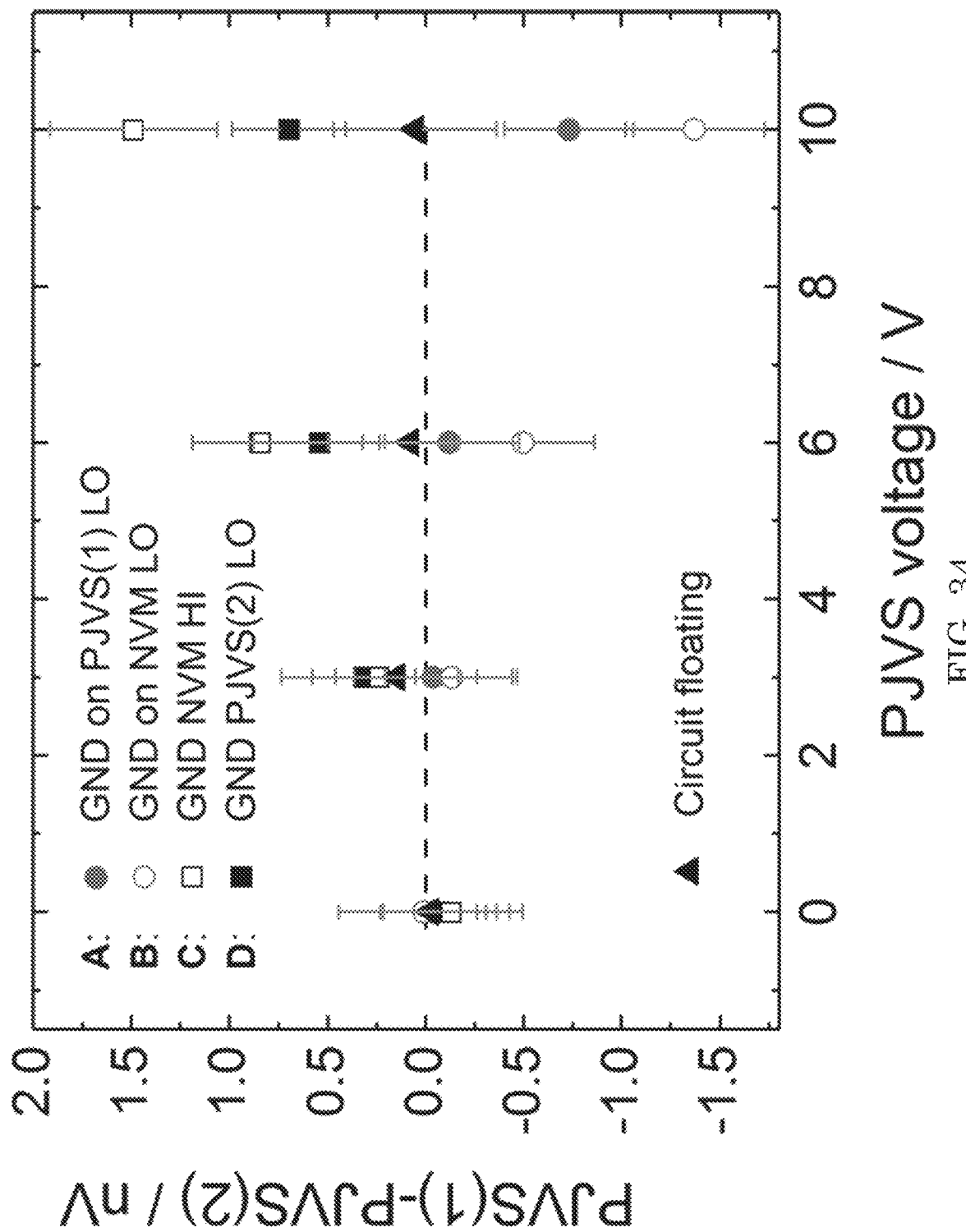
FIG. 34 shows a measured voltage difference PJVS(1)−PJVS(2) for different grounding locations. The error bars represent the standard deviation (k=1) obtained with a minimum of 30 individual readings for each voltage and grounding configuration.

The results are shown in FIG. 34. At 10 V, $\Delta V$ varies between −1.3 nV and +1.5 nV when the low or high input of the NVM, respectively, is connected to ground. As expected, the control measurement at 0 V is independent of the grounding configuration. The results obtained with both systems floating are shown for comparison and will be discussed in the next section.

Figure 35:
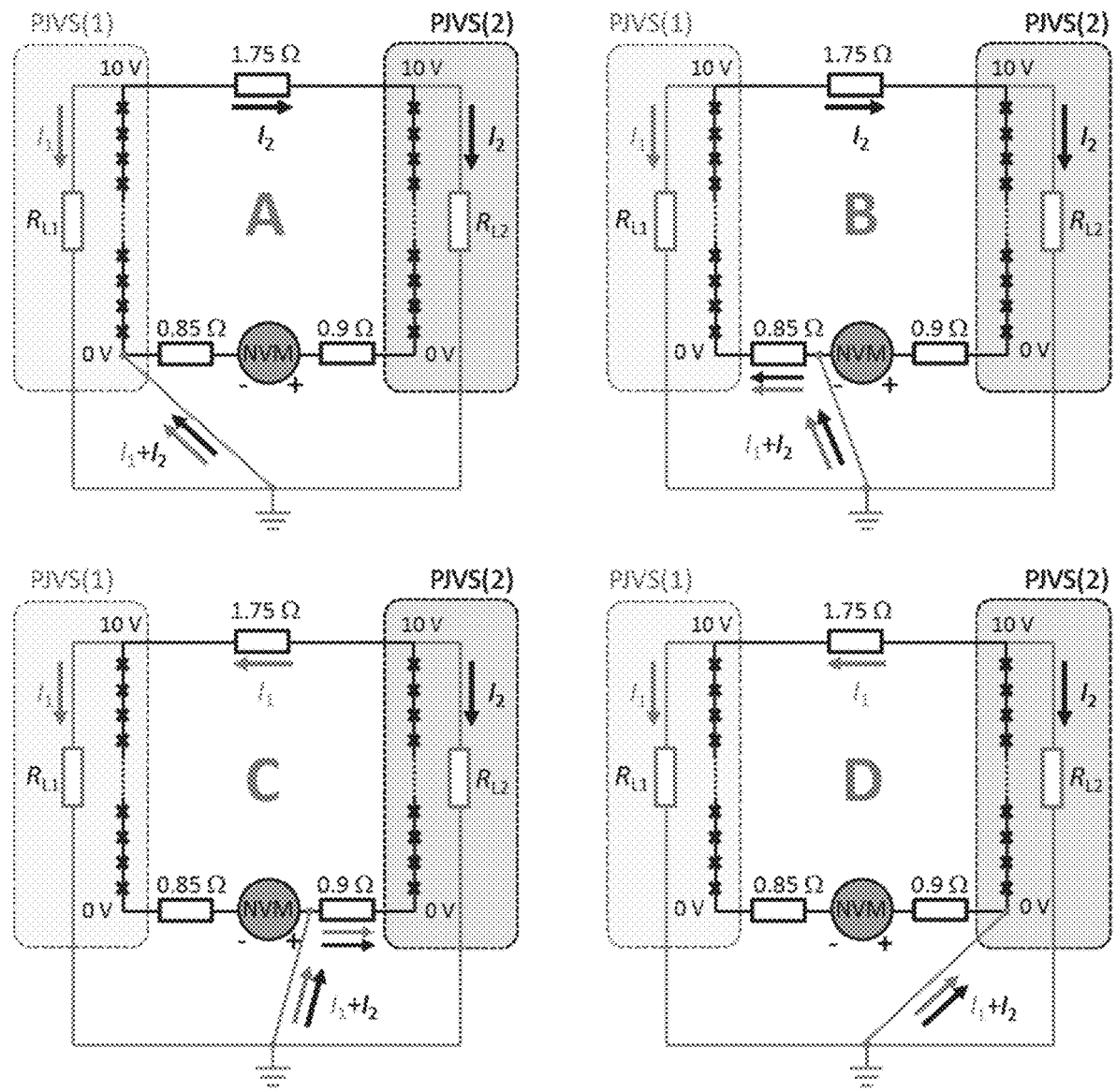
FIG. 35 shows a leakage current path $I_1$ and $I_2$ through the equivalent leakage resistances to ground $R_{L1}$ and $R_{L2}$ associated with PJVS(1) and PJVS(2), respectively. The leakage paths to ground of each system are much more complex than the simplified $R_{L1}$ and $R_{L2}$ representations shown here. In this model, the current distribution is shown for four different ground positions: (A) connected to the low side of the PJVS(1) array, (B) connected to the low input terminal of the NVM, (C) connected to the high input terminal of the NVM, and (D) connected to the low side of the PJVS(2) array.

A model of the leakage current path assuming a total LCG of $I_1$ for PJVS(1) and $I_2$ for PJVS(2) is presented in FIG. 35. In this schematic, $I_1$ and $I_2$ are defined as the LCG through the equivalent leakage resistance $R_{1,1}$ and $R_{1,2}$ to ground for each system. The equivalent leakage resistance is a simplified circuit model for visualizing some of the multiple paths and isolation resistances connected in parallel and at various voltages (FIG. 24). Although predicting $I_1$ and $I_2$ from a model is rather difficult, the LCG of each system and for a given PJVS voltage can easily be measured. The values $I_1$=350 pA and $I_2$=370 pA were independently measured at 10 V (FIG. 25).

If the low side of the PJVS array is connected to ground as shown in FIG. 35A, only the LCG $I_2$ flowing in the voltage lead that connects the high sides of the two PJVS systems contributes to a voltage error. In this case, the LCG $I_1$ is self-contained within the PJVS(1) system and does not contribute to a voltage error in the measurement circuit. The presence of an LCG flowing through the PJVS array does not introduce a measurable error, since this current is several orders of magnitude less than the current bias quantum locking range. The grounding configurations A and D involve direct connections to the low sides of their respective array circuits independent of the voltage lead. This is the case if the bias electronics are designed to refer to ground potential. If we estimate the voltage difference due only to the LCG flowing in the wire, then $\Delta V = -I_2 \times 1.75\ \Omega = -0.65$ nV, in good agreement with the measured value $\Delta V = -0.73$ nV (FIG. 34).

If the low side of the NVM is connected to ground (FIG. 35B), then both $I_1$ and $I_2$ contribute to the voltage error. In addition to the error mentioned above, the voltage drop across the wiring resistance between the low of the array and the NVM input, driven by both $I_1$ and $I_2$, contributes to the voltage error, and $\Delta V = -I_2 \times (1.75\ \Omega + 0.85) - I_1 \times 0.85\ \Omega = -1.26$ nV. The difference measured is $\Delta V = -1.37$ nV, again in good agreement with the estimate.

Finally, in the presence of leakage current flowing in the measurement circuit, the voltage difference between the two systems is expected to differ from 0 V. Depending on the magnitude of the leakage current, producing a precise null voltage of 0 V may hide an unaccounted-for systematic error.

Based on these observations and measurements performed with various grounding configurations, we recommend the following best practices to minimize voltage errors induced by LCG: minimize the wiring resistance of the voltage leads for both PJVS systems; connect ground to the low side of the PJVS systems with an extra grounding wire or one of the current bias leads; avoid connecting ground to the input of the NVM; or connect ground to the PJVS system with the largest LCG.

For quantifying the effect of the LCG on the comparison results, two possible cases can be considered. If the magnitude of LCG voltage error is >1 nV, then correct the comparison voltage result for the leakage error based on the measured LCG and add an uncertainty on the applied voltage correction in the uncertainty budget. Otherwise, report the leakage error directly as a Type-B uncertainty component in the uncertainty budget (no correction applied to the comparison result).

Both cases involve an independent measurement of the LCG and the value of the output voltage lead resistances for both PJVS systems. Based on the LCG path (FIG. 35), the leakage error on the comparison voltage can be estimated. Note that it is critical to determine the leakage current at the exact PJVS voltage value used during the comparison measurement, since the LCG of a PJVS is not linear with its programmed voltage. The LCG may also change over time and can vary due to aging of a component (cable, electronics, and the like) or changes in environment. For these reasons, it is recommended that the LCG be measured shortly before and after each PJVS comparison.

The LCG amplitudes in FIG. 25 can be considered large for a Josephson standard. Unavoidably, given the bias architecture of PJVS systems, the LCG is the combined contribution of multiple isolation resistances in parallel, with each in principle carefully chosen to be >200 GΩ. Following the study of LCG on the PJVS comparison results (FIG. 34), leakage contributions in the NIST PJVS system were investigated in greater depth. Replacing bias cables with ones of isolation resistance >2 TΩ each reduced the LCG by a factor of five. With this improvement, which does not involve modification of the bias electronics, the leakage error in grounding configurations A or D becomes ~0.1 nV for a PJVS system biased at 10 V. A resolution voltage of 0.1 nV in Josephson voltage standard comparison measurements can presently be obtained only with the use of an analog NVM.

With both systems floating from ground potential, the leakage currents $I_1$ and $I_2$ are mostly contained within their respective systems. Assuming the ideal case of two identical PJVS arrays and symmetrical leakage resistances for every node of each system, then no current flows in the wire between the two high sides of the PJVS systems. This condition is not completely met with the two PJVS systems described in FIG. 24 and FIG. 25, and the differential leakage current flowing in the 1.75Ω resistance between the two PJVS systems causes a voltage error in the comparison measurement. However, this differential leakage current is only a small fraction of $I_1$ and $I_2$. The differential current is a consequence of the balance of the potential relative to ground of the two arrays. Leaving both arrays floating means the NVM input is at a potential between 0 V and −5 V with respect to ground when both arrays are biased at 10 V. Therefore, the influence of the common mode rejection ratio (CMRR) of the NVM and the contribution of its leakage resistance to ground can be taken into consideration. In this study, the analog NVM was operated on batteries, and its chassis was left floating from ground potential (i.e. connected only to the shield of the voltage leads cable). The leakage resistance effect may have therefore not contributed significantly to an error in the comparison results.

Figure 36:
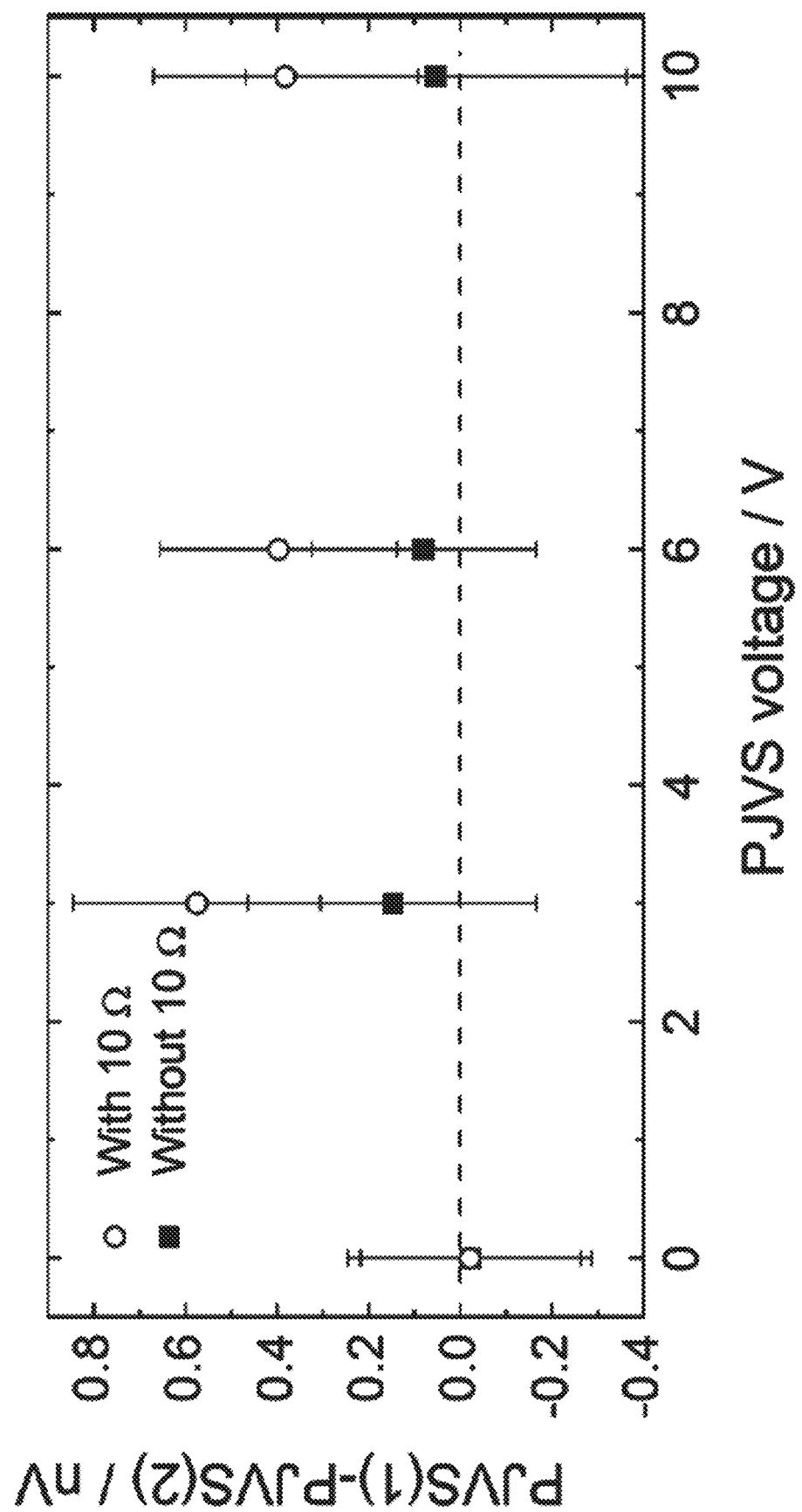
FIG. 36 shows measured voltage differences for the N polarity of the detector with and without a 10Ω resistance inserted between the two high sides of the PJVS systems.

One method of measuring the magnitude of the differential leakage current $I_{LD}$ is to insert an additional resistance in the wire connecting the two high sides of the PJVS arrays. FIG. 36 shows the effect of an additional 10Ω resistance in the measurement circuit with the detector in the N polarity state. At 10 V, the differential leakage current determined from the voltage difference (0.33 nV) between the two measurements is $I_{LD}$=33 pA. With the two PJVS systems tested, leaving the measurement circuit floating from ground reduces the leakage error in the voltage difference by at least a factor of 10.

Note that the magnitude of $I_{LD}$ is not linearly proportional to the PJVS voltage. For instance, at 3 V the measured $I_{LD}$=43 pA is larger than the value measured at 10 V. The non-linear dependence of voltage difference as a function of PJVS voltage is clearly visible in FIG. 37, emphasizing the need to measure the differential leakage current at the PJVS voltage used for the comparison. Due to the asymmetry of the voltage and leakage resistance at every node, it is particularly important to measure the differential leakage current when comparing PJVS arrays of different types or when different types of current bias electronics are used.

Keeping the measurement circuit floating from ground reduces the influence of the leakage current induced by the bias current electronics and minimizes the error on the voltage difference measurement (Type-B contribution in the uncertainty budget). In addition, leaving the measurement circuit floating from ground slightly reduces the noise measured by the NVM in our measurement setup. For these reasons, the floating measurement circuit configuration was chosen for generating the results. However, if the NVM implemented in the measurement circuit cannot be operated on battery, an option is to choose a grounding point and avoid complications of a floating measurement circuit.

Another leakage error to consider is that from current flowing between the isolation resistance of the output voltage leads of each PJVS system. This error can be identified by measuring the isolation resistance from one bias lead to the other for each system independently. This measurement is performed with the PJVS array disconnected and can be done with a commercial high-resistance meter or with the method described in. We measured a typical isolation resistance of the output leads $R_{LW}$≥500 GΩ. No low-pass filters were implemented in our PJVS cryostat. The upper bound of the voltage error $U_{LW}$ due to the leakage between the output leads at $V_{PJVS}$=10 V and a lead resistance of 1.8Ω is given by $U_{LW}$=$(V_{PJVS} \times 1.8\Omega)/R_{LW}$=0.036 nV.

FIG. 30 shows the individual measurements collected over a period of 28 h for the measurement circuit floating from ground. The average voltage difference measured with both polarities of the NVM is $\Delta V$=PJVS(1)−PJVS(2)= (0.09±0.29) nV. The calculated standard deviation of the mean is eight times smaller than the 1/f noise floor of the NVM determined from the Allan deviation measurement (FIG. 32). Therefore, the measured 1/f noise floor of the NVM is taken into consideration for the statistical uncertainty reported in FIG. 38. Type-B uncertainty contributions include the frequency accuracy, the leakage current effects, the gain error of the NVM, and the voltage difference measured with the polarity reversal of the NVM. With all uncertainty components combined, the expanded relative uncertainty obtained with this measurement (k=2 coverage factor) is 2.9 parts in $10^{11}$.

With regard to a relative frequency accuracy between the two microwave synthesizers implemented in the PJVS(1) and PJVS(2) systems, frequency uncertainty was 4.5 parts in $10^{12}$ that was derived from a measurement of the relative frequency accuracy of two identical models of microwave synthesizer locked to a common frequency of 10 MHz. For the PJVS arrays biased at 10 V, the corresponding voltage uncertainty is $u_f$=0.045 nV.

From the measurement results at 10 V with an additional 10Ω resistor, a differential leakage current of $I_{LD}$=33 pA was measured flowing in the wire connecting the two high terminals of the PJVS arrays (FIG. 36). This current induces a voltage drop $U_{LD}$ in the 1.75Ω resistance of the voltage output lead wire. The voltage error ULD=0.058 nV is considered a Type-B component in the uncertainty budget with a rectangular distribution.

Leakage currents flowing from one voltage lead to another contribute to voltage errors in the comparison measurement. If the magnitude of the leakage current is comparable for both systems, the effect on the voltage error may be canceled. The voltage error $U_{LW}$ is the upper bound for a single PJVS system and represents the worst-case scenario. The value $u_{LW}$=$U_{LW}/\sqrt{3}$, where $U_{LW}$ is the largest contribution from the two systems, is reported in the uncertainty budget.

The gain error of the NVM is 3.2×$10^3$ V V$^{-1}$ for its 10 μV range, determined with δ=±1 μV dynamic range. Assuming a rectangular distribution around the maximum voltage difference measured in FIG. 30 (±1 nV), the uncertainty associated with the NVM gain is very small: $u_{gain}=(2\times3.2\times10^3)/\sqrt{3}$ nV=0.004 nV.

Figure 37:
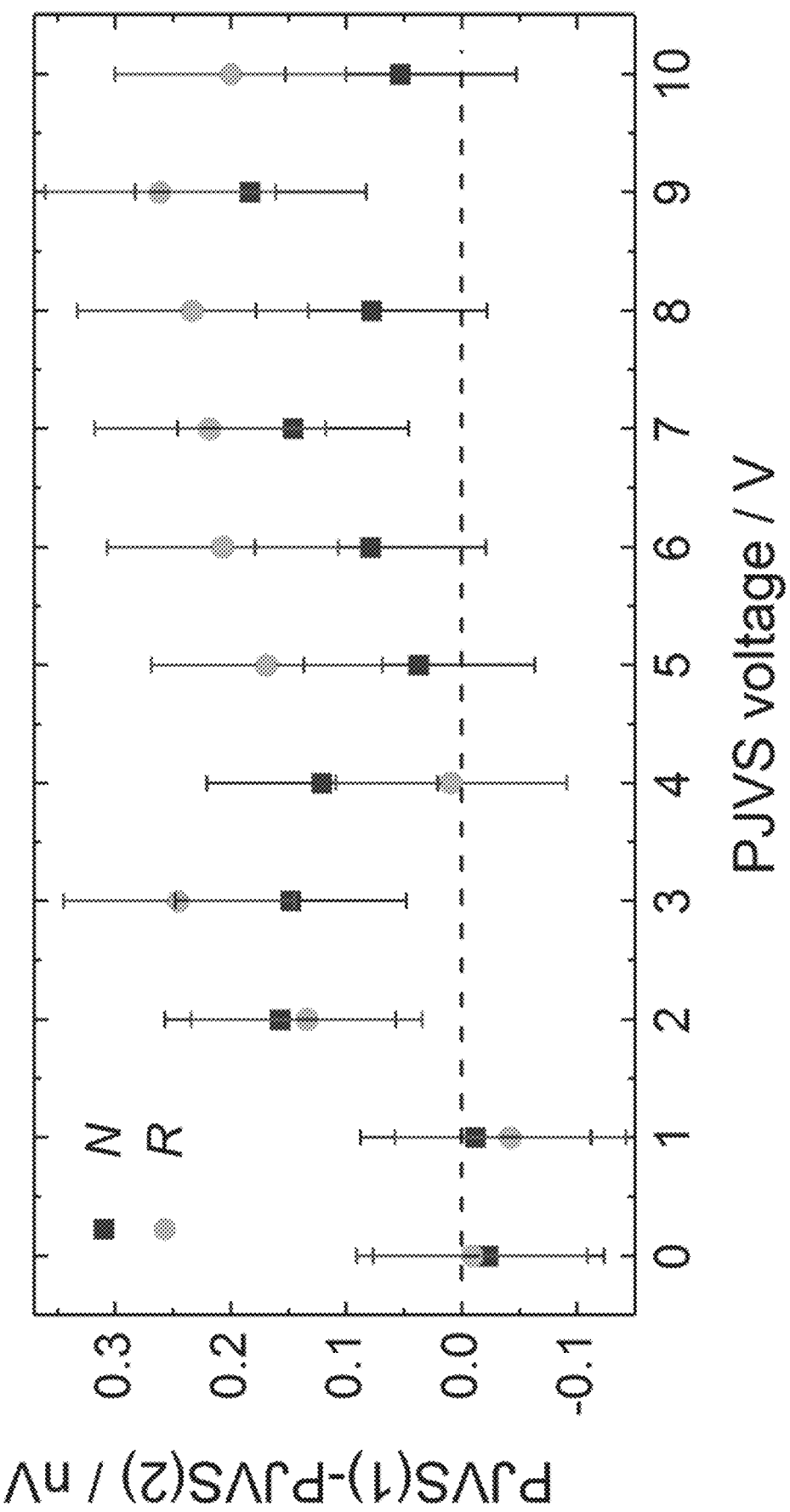
FIG. 37 shows a measured voltage difference for both N and R polarities of the detector as a function of the PJVS voltage when the circuit is floating from ground potential.

The voltage differences obtained for the N and R polarities of the detector at 10 V differ by 0.1 nV (FIG. 30). A similar effect occurs across various PJVS voltages, especially for values from 5 V to 10 V (FIG. 37). This voltage difference may be due to an unaccounted combination of a leakage current through the NVM inputs and common mode effect (arrays floating). An uncertainty component based on the largest difference measured between the two NVM polarities (0.15 nV, determined from FIG. 37) is added to the uncertainty budget with a rectangular distribution.

Two cryocooled voltage standards were compared at 10 V and found to agree within (0.09±0.29) nV (k=2). Reaching this small uncertainty involved a number of improvements to the measurement system. First, we implemented an analog nanovoltmeter in the measurement circuit and a corresponding synchronization method. Together, these enabled a long series of data to be automatically acquired, yielding a low-noise measurement that resulted in a small statistical uncertainty. Second, by floating the measurement from ground and running the NVM on batteries, systematic errors due to the leakage current (differential leakage between the two systems, leakage current through the NVM, and potential CMRR) were minimized. As good measurement practice, the perfect quantization of the two JJ arrays was verified during the comparison by systematically applying a dither current with opposite signs to both arrays.

Reaching a low noise floor is involved to verify comparison measurement with meaningful statistical uncertainty and to quantify the systematic errors associated with the two systems and the measurement circuit. One example is the ability to measure the leakage currents and their effects on the voltage difference between the two PJVS systems as a function of the grounding configuration. This measurement would have been much harder to achieve without the use of an analog nanovoltmeter and the appropriate waveform synchronization necessary for automated measurements.

The synchronization method demonstrated here is not limited to the comparison of nominally identical PJVS systems. The triggered four-step waveform can, in principle, be implemented for the comparison of two PJVS systems with a different array technology or bias electronics, as long as the two square waveforms are synchronized within a few microseconds to avoid overloading the analog NVM input stage.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Optional or optionally means that the subsequently described event or circumstance can or cannot occur, and that the description includes instances where the event occurs and instances where it does not. As used herein, combination is inclusive of blends, mixtures, alloys, reaction products, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms a and an and the and similar referents in the context of describing the invention (especially in the context of the following claims) are to be construed to cover both the singular and the plural, unless otherwise indicated herein or clearly contradicted by context. Or means and/or. It can further be noted that the terms first, second, primary, secondary, and the like herein do not denote any order, quantity, or importance, but rather are used to distinguish one element from another. The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A Josephson voltage standard comprising:
   a first electrical conductor that receives a first bias current;
   a second electrical conductor that receives a second bias current;
   a third electrical conductor that receives a third bias current;
   a fourth electrical conductor that receives a first radiofrequency bias;
   a fifth electrical conductor that receives a second radiofrequency bias;
   a first Josephson junction array that:
     comprises a first Josephson junction;
     receives, from the first electrical conductor, the first bias current;
     receives, from the third electrical conductor, the third bias current;
     receives, from the fourth electrical conductor, the first radiofrequency bias; and
     produces a first voltage reference from the first bias current and the third bias current;
   a second Josephson junction array in electrical communication with the first Josephson junction array and that:
     comprises a second Josephson junction;
     receives, from the second electrical conductor, the second bias current;
     receives, from the third electrical conductor, the third bias current;
     receives, from the fifth electrical conductor, the second radiofrequency bias; and
     produces a second voltage reference from the second bias current and the third bias current;
   a first voltage reference output tap in electrical communication with the first Josephson junction array and that receives the first voltage reference from the first Josephson junction array, from a sixth electrical conductor, such that the first voltage reference is electrically available at the first voltage reference output tap; and
   a second voltage reference output tap in electrical communication with the second Josephson junction array and that receives the second voltage reference from the second Josephson junction array, from a seventh electrical conductor, such that the second voltage reference is electrically available at the second voltage reference output tap.

2. The Josephson voltage standard of claim 1, further comprising a third voltage reference output tap in electrical communication with the second Josephson junction array and that:
receives, from an eight electrical conductor, a third voltage reference from the second Josephson junction array such that the third voltage reference is electrically available at the third voltage reference output tap.

3. The Josephson voltage standard of claim 2, wherein the first Josephson junction array, the second Josephson junction array, and the third voltage reference output tap are in electrical series with respect to each other.

4. The Josephson voltage standard of claim 2, wherein the third voltage reference output tap is in electrical communication with the first Josephson junction array,
such that the first Josephson junction array and the second Josephson junction array are connected in parallel with respect to the third voltage reference output tap and in electrical series with respect to each other.

5. The Josephson voltage standard of claim 2, further comprising a first relay electrically interposed between the first voltage reference output tap and each of the third voltage reference output tap and second voltage reference output tap and that:
selectively switches between electrically connecting the first voltage reference output tap to the third voltage reference output tap and the second voltage reference output tap and electrically disconnecting the first voltage reference output tap from the third voltage reference output tap and the second voltage reference output tap.

6. The Josephson voltage standard of claim 5, further comprising a third current source in electrical communication with the first Josephson junction array and the second Josephson junction array and that:
produces the third bias current; and
communicates the third bias current to the first Josephson junction array and the second Josephson junction array.

7. The Josephson voltage standard of claim 6, further comprising a second current source in electrical communication with the second Josephson junction array and that:
produces the second bias current; and
communicates the second bias current to the second Josephson junction array.

8. The Josephson voltage standard of claim 2, further comprising a second relay electrically interposed between the second voltage reference output tap and each of the first voltage reference output tap and the third voltage reference output tap and that:
selectively switches between electrically connecting the second voltage reference output tap to the third voltage reference output tap and electrically disconnecting the second voltage reference output tap from the first voltage reference output tap and the second voltage reference output tap.

9. The Josephson voltage standard of claim 2, further comprising a voltmeter in electrical communication with the first voltage reference output tap and the second voltage reference output tap and that:
receives the first voltage reference;
receives the second voltage reference; and
determines a voltage difference between the first voltage reference and the second voltage reference.

10. A Josephson divider determiner for determining a resistance ratio of a voltage divider with the Josephson voltage standard of claim 2, the Josephson divider determiner comprising:
the Josephson voltage standard;
a voltage divider in electrical communication with the Josephson voltage standard and that:
comprises a first resistor in electrical communication with the first voltage reference output tap and that receives the first voltage reference from the first voltage reference output tap; and
comprises a second resistor in electrical communication with the first resistor and the second voltage reference output tap and that receives the second voltage reference from the second voltage reference output tap; and
a relay in electrical communication with the first voltage reference output tap.

11. The Josephson voltage standard of claim 10, wherein the relay is in electrical communication with the third voltage reference output tap; and
comprises a voltmeter in electrical communication with the relay such that the relay selectively switches between:
electrically connecting the voltmeter to the first voltage reference output tap, electrically disconnecting the voltmeter from the third voltage reference output tap, and electrically disconnecting the third voltage reference output tap from the voltage divider;
electrically connecting the voltmeter to the third voltage reference output tap, electrically disconnecting the voltmeter from the first voltage reference output tap, and electrically connecting the third voltage reference output tap to the voltage divider so that the first resistor and the second resistor receive the third voltage reference from the third voltage reference output tap; and
a buffer amplifier referenced to the Josephson voltage standard and that provides the bias current to voltage divider.

12. The Josephson voltage standard of claim 10, wherein the relay is in electrical communication with the second voltage reference output tap, and
comprises:
a voltmeter in electrical communication with the second voltage reference output tap and a ground terminal of voltage divider; and
a Zener voltage standard in electrical communication with the polarity switch,
such that the polarity switch selectively swaps electrical connectivity of the Zener voltage standard between the first voltage reference output tap and the second voltage reference output tap.

13. A process for producing a voltage reference with the Josephson voltage standard of claim 2, the process comprising:
receiving, by the first Josephson junction array, the first bias current, the third bias current, and the first radiofrequency bias;
producing, by the first Josephson junction array, the first voltage reference in response to receiving the first bias current, the third bias current, and the first radiofrequency bias;

receiving, by the second Josephson junction array, the second bias current, the third bias current, and the second radiofrequency bias;

producing, by the second Josephson junction array, the second voltage reference in response to receiving the second bias current, the third bias current, and the second radiofrequency bias;

communicating the first voltage reference from the first Josephson junction array to the first voltage reference output tap;

communicating the second voltage reference from the second Josephson junction array to the second voltage reference output tap;

receiving the first voltage reference at the first voltage reference output tap; and receiving the second voltage reference at the second voltage reference output tap.

14. The process of claim 13, further comprising:

producing, by the first Josephson junction array and the second Josephson junction array, the third voltage reference in response to:

receiving, by the first Josephson junction array, the first bias current, the third bias current, and the first radiofrequency bias;

receiving, by the second Josephson junction array, the second bias current, the third bias current, and the second radiofrequency bias;

communicating the third voltage reference to the third voltage reference output tap; and receiving the third voltage reference at the third voltage reference output tap.

15. The process of claim 13, further comprising:

producing, by the second Josephson junction array, the third voltage reference in response to:

receiving, by the second Josephson junction array, the second bias current, the third bias current, and the second radiofrequency bias;

communicating the third voltage reference to the third voltage reference output tap; and receiving the third voltage reference at the third voltage reference output tap.

16. The Josephson voltage standard of claim 1, further comprising a first current source in electrical communication with the first Josephson junction array and that:

produces the first bias current; and communicates the first bias current to the first Josephson junction array.

17. The Josephson voltage standard of claim 16, further comprising a first relay electrically interposed between the first current source and each of the first Josephson junction array and the first voltage reference output tap and that:

receives, from the first current source, the first bias current; and selectively switches between communicating the first bias current to the first Josephson junction array and not communicating the first bias current to the first Josephson junction array.

18. The Josephson voltage standard of claim 1, further comprising a first inductor electrically interposed between the first Josephson junction array and the first voltage reference output tap and that:

receives, from the first Josephson junction array, the first voltage reference; and isolates the first voltage reference output tap from the first Josephson junction array.

* * * * *